(12) United States Patent (10) Patent No.: US 12,017,392 B2
Trudeau et al. (45) Date of Patent: Jun. 25, 2024

(54) OVERMOULDED PRINTED ELECTRONIC PARTS AND METHODS FOR THE MANUFACTURE THEREOF

(71) Applicant: National Research Council of Canada, Ottawa (CA)

(72) Inventors: Paul Arthur Trudeau, Gatineau (CA); Arnold Jason Kell, Orleans (CA); Xiangyang Liu, Nepean (CA); Olga Mozenson, Nepean (CA)

(73) Assignees: NATIONAL RESEARCH COUNCIL OF CANADA, Ottawa (CA); E2IP TECHNOLOGIES INC., Ottawa (CA)

( * ) Notice: Subject to any disclaimer, the term of this patent is extended or adjusted under 35 U.S.C. 154(b) by 428 days.

(21) Appl. No.: 17/265,347

(22) PCT Filed: Aug. 7, 2019

(86) PCT No.: PCT/IB2019/056731
§ 371 (c)(1),
(2) Date: Feb. 2, 2021

(87) PCT Pub. No.: WO2020/031114
PCT Pub. Date: Feb. 13, 2020

(65) Prior Publication Data
US 2021/0316485 A1 Oct. 14, 2021

Related U.S. Application Data

(60) Provisional application No. 62/715,609, filed on Aug. 7, 2018.

(51) Int. Cl.
*B32B 3/00* (2006.01)
*B29B 11/06* (2006.01)
(Continued)

(52) U.S. Cl.
CPC .............. *B29C 45/14* (2013.01); *B29B 11/06* (2013.01); *B29C 44/12* (2013.01); *B29C 44/42* (2013.01);
(Continued)

(58) Field of Classification Search
CPC ......... B28C 45/14; B28C 44/12; B28C 44/42; H05K 1/0313; H05K 3/0014; H05K 3/105; H05K 3/287
See application file for complete search history.

(56) References Cited

U.S. PATENT DOCUMENTS 8,735,220 B2 5/2014 Val
9,528,667 B1 12/2016 Pereyra
(Continued)

FOREIGN PATENT DOCUMENTS

CA 2931244 6/2015
CN 102300415 A 12/2011
(Continued)

OTHER PUBLICATIONS

Examination Search Reported dated Apr. 4, 2022.
(Continued)

*Primary Examiner* — Elizabeth E Mulvaney
(74) *Attorney, Agent, or Firm* — BERESKIN & PARR LLP/S.E.N.C.R.L., s.r.l.; Michael Fenwick

(57) ABSTRACT

The present application relates to overmoulded printed electronic parts as well as to methods for preparing overmoulded printed electronic parts using conductive trace inks such as molecular inks, thermoset resins, and reinforcing materials such as glass microspheres and glass fabric.

23 Claims, 17 Drawing Sheets

(51) Int. Cl.

| | |
|---|---|
| *B29C 44/12* | (2006.01) |
| *B29C 44/42* | (2006.01) |
| *B29C 45/14* | (2006.01) |
| *H05K 1/03* | (2006.01) |
| *H05K 3/00* | (2006.01) |
| *H05K 3/10* | (2006.01) |
| *H05K 3/28* | (2006.01) |
| *B29K 105/16* | (2006.01) |
| *B29K 309/08* | (2006.01) |
| *B29K 509/08* | (2006.01) |
| *B29L 31/34* | (2006.01) |

(52) U.S. Cl.
CPC ......... *H05K 1/0313* (2013.01); *H05K 3/0014* (2013.01); *H05K 3/105* (2013.01); *H05K 3/287* (2013.01); *B29C 2795/002* (2013.01); *B29K 2105/165* (2013.01); *B29K 2309/08* (2013.01); *B29K 2509/08* (2013.01); *B29L 2031/3425* (2013.01); *H05K 2203/1105* (2013.01); *H05K 2203/1453* (2013.01)

(56) References Cited

U.S. PATENT DOCUMENTS

| | | |
|---|---|---|
| 2007/0022602 A1 | 2/2007 | Kingsford et al. |
| 2010/0119730 A1 | 5/2010 | Nelson et al. |
| 2014/0344497 A1 | 11/2014 | Keranen et al. |
| 2015/0098205 A1 | 4/2015 | Keranen et al. |
| 2015/0174803 A1 | 6/2015 | Newman et al. |
| 2015/0257278 A1 | 9/2015 | Paavo et al. |
| 2015/0308639 A1 | 10/2015 | Keranen et al. |
| 2015/0366073 A1 | 12/2015 | Shlomo et al. |
| 2016/0084490 A1 | 3/2016 | Davis et al. |
| 2016/0192474 A1 | 6/2016 | Niskala et al. |
| 2016/0290878 A1 | 10/2016 | Severinkangas et al. |
| 2016/0295702 A1 | 10/2016 | Heikkinen et al. |
| 2016/0345437 A1 | 11/2016 | Heikkinen et al. |
| 2017/0094776 A1 | 3/2017 | Heikkinen et al. |
| 2017/0094800 A1 | 3/2017 | Keranen et al. |
| 2017/0135198 A1 | 5/2017 | Akeranen et al. |
| 2017/0298242 A1 | 10/2017 | Mostowy-Gallagher et al. |
| 2020/0017697 A1* | 1/2020 | Liu .................... H05K 1/0283 |

FOREIGN PATENT DOCUMENTS

| | | |
|---|---|---|
| CN | 104761957 A | 7/2015 |
| EP | 2048918 | 4/2009 |
| EP | 2506301 | 10/2012 |
| EP | 2927018 | 10/2015 |
| FI | 20086009 | 10/2008 |
| GB | 2500037 | 11/2013 |
| GB | 2505170 | 2/2014 |
| GB | 2505878 | 3/2014 |
| JP | 2012-169373 | 9/2012 |
| JP | 2012-216808 | 11/2012 |
| JP | 2017502856 a | 1/2017 |
| JP | 2017-538247 | 12/2017 |
| KR | 101056483 B1 * | 7/2008 |
| KR | 1020170067768 | 6/2017 |
| TW | 201801885 | 1/2018 |
| WO | WO2009/019031 | 2/2009 |
| WO | WO2009019031 | 2/2009 |
| WO | WO2010046539 A1 | 4/2010 |
| WO | WO2014172411 A1 | 10/2014 |
| WO | WO2015/044523 | 4/2015 |
| WO | WO2015192248 | 12/2015 |
| WO | WO2016/060838 | 4/2016 |
| WO | WO2016060838 A1 | 4/2016 |
| WO | WO2016071569 | 5/2016 |
| WO | WO2016/156670 A1 | 10/2016 |
| WO | WO2016197234 A1 | 12/2016 |
| WO | WO2017065725 A1 | 4/2017 |
| WO | WO2017178701 A1 | 10/2017 |
| WO | WO2017178702 A1 | 10/2017 |
| WO | WO2017178703 A1 | 10/2017 |
| WO | WO2018018136 A1 | 2/2018 |
| WO | WO2018/076110 | 3/2018 |
| WO | WO2018076110 A1 | 5/2018 |
| WO | WO2018146616 A2 | 8/2018 |
| WO | WO2020026207 A1 | 2/2020 |

OTHER PUBLICATIONS

Japanese Office Action dated Apr. 18, 2023.

Office Action dated Jul. 17, 2023 for Taiwan Patent Application No. 108127933.

\* cited by examiner

OVERMOULDED PRINTED ELECTRONIC PARTS AND METHODS FOR THE MANUFACTURE THEREOF

RELATED APPLICATIONS

This Application is a national phase entry of PCT/IB2019/056731 filed Aug. 7, 2019, which claims priority to U.S. Provisional Patent Application No. 62/715,609 filed Aug. 7, 2018, the contents of which are incorporated herein by reference in their entirety.

FIELD

The present application relates to overmoulded printed electronic parts as well as to methods for preparing overmoulded printed electronic parts.

BACKGROUND

Overmoulding has been used to manufacture three-dimensional structural electronics by incorporating printed inks on thermoplastic films followed by overmoulding with thermoplastic resins.

For example, current metal flake inks used in printed electronics may, for example, have limited potential for formability (elongation), high resistivity and/or require substantial deposition thicknesses to achieve adequate conductivity. These metal flake inks may also be susceptible to heat and/or forces exerted on the conductive traces when the standard types of molten resin are injected in the cavity of the injection mould. Visual defects such as ghosting or circuit printing may also be present, and connectors and/or light emitting diodes (LEDs) may also leave visual marks on the cosmetic side of an overmoulded part.

Structural printed electronic parts prepared by known means, even if thinner than conventional may have a greater than desirable weight. The final thickness of a part is a function of both the substrate film layer(s) and the resin. The overall thickness of the part makes it possible to submerge electrical features such as, LEDs, organic light emitting diodes (OLEDs) and/or connectors. Designers have used ribs and increased part thickness to increase rigidity and to create enough space for the stand-off of the LEDs, OLEDs and connectors. The resulting thicknesses of typical structural electronic parts are about 3 mm or greater. As a result, such parts may be heavy and use significant quantities of thermoplastic resin. The resulting thermal performance has been poor. As a result, these technologies are primarily being considered for interior non-structural applications.

SUMMARY

There is thus a need for providing an alternative to the existing methods for manufacturing an overmoulded printed electronic part.

Accordingly, the present application includes a method for manufacturing an overmoulded printed electronic part, the method comprising:
  depositing a molecular ink on a substrate to form a non-conductive trace of the ink on a first surface of the substrate;
  sintering the non-conductive trace of the ink on the substrate to form a conductive silver trace on the first surface of the substrate;
  injecting an overmoulding resin or a precursor thereto over the conductive silver trace on the first surface of the substrate; and
  hardening the overmoulding resin or curing the precursor thereto to obtain the overmoulded printed electronic part.

In one embodiment the molecular ink is a low temperature molecular ink. In another embodiment the molecular ink is a high temperature molecular ink. In a further embodiment the method further comprises depositing a nanoparticle ink for use in combination with a molecular ink.

The present application also includes a method for manufacturing an overmoulded printed electronic part, the method comprising:
  injecting a precursor to a thermoset overmoulding resin over a conductive trace on a first surface of a substrate; and
  curing the precursor to the thermoset overmoulding resin to obtain the overmoulded printed electronic part.

In one embodiment, the conductive trace on the first surface of the substrate is obtained by a method comprising:
  Depositing a conductive trace ink on a substrate to form a non-conductive trace of the ink on a first surface of the substrate; and
  curing the non-conductive trace of the ink on the substrate to form the conductive trace on the first surface of the substrate.

In one embodiment, the conductive trace ink is a molecular ink or a nanoparticle ink. In still another embodiment the conductive trace ink is a molecular ink and the curing comprises sintering. In still a further embodiment, the curing of the conductive trace comprises one or more stages. In related embodiments a first stage comprises drying the non-conductive trace and a second stage comprises sintering. In still another related embodiment, the second stage of curing is preceded by one or more materials or substances are deposited over the non-conductive trace. In yet another related embodiment, the first stage of curing precedes thermoforming the substrate and the second stage of curing.

The present application also includes a method for manufacturing an overmoulded printed electronic part, the method comprising:
  injecting a composition comprising:
    an overmoulding resin or a precursor thereto; and
    glass microspheres, over a conductive trace on a first surface of a substrate; and
  hardening the overmoulding resin or curing the precursor thereto to obtain the overmoulded printed electronic part.

The present application also includes a method for manufacturing an overmoulded printed electronic part, the method comprising:
  injecting an overmoulding resin or a precursor thereto over a conductive trace on a first surface of a substrate under conditions to obtain a foamed overmoulded resin or foamed precursor thereto; and
  hardening the foamed overmoulding resin or curing the foamed precursor thereto to obtain the overmoulded printed electronic part.

The present application also includes a method for manufacturing an overmoulded printed electronic part, the method comprising:
  depositing a conductive trace ink on a substrate to form a non-conductive trace of the ink on a first surface of the substrate;

curing the non-conductive trace of the ink on the substrate to form a conductive trace on the first surface of the substrate;

introducing a fibreglass reinforcing layer over the first surface of the substrate;

injecting an overmoulding resin or a precursor thereto over the fibreglass reinforcing layer; and hardening the overmoulding resin or curing the precursor thereto to obtain the overmoulded printed electronic part.

The present application also includes an overmoulded printed electronic part comprising:

a conductive silver trace coupled to a first surface of a substrate, the conductive silver trace manufactured from a low temperature molecular ink as defined in the embodiments of the present application; and a resin overmoulded over the conductive silver trace coupled to the first surface of the substrate.

The present application also includes an overmoulded printed electronic part comprising:

a conductive trace coupled to a first surface of a substrate; and a thermoset resin overmoulded over the conductive trace coupled to the first surface of the substrate.

The present application also includes an overmoulded printed electronic part comprising:

a conductive trace coupled to a first surface of a substrate; and a resin comprising a plurality of glass microspheres embedded therein overmoulded over the conductive trace coupled to the first surface of the substrate.

The present application also includes an overmoulded printed electronic part comprising:

a conductive trace coupled to a first surface of a substrate; and a foamed resin overmoulded over the conductive trace coupled to the first surface of the substrate.

The present application also includes an overmoulded printed electronic part comprising:

a conductive trace coupled to a first surface of a substrate;

a fibreglass reinforcing layer over the conductive trace coupled to the first surface of the substrate; and a resin overmoulded over the fibreglass reinforcing layer.

In some embodiments, the overmoulded printed electronic parts of the present application are manufactured according to a method of manufacturing overmoulded printed electronic parts of the present application.

Other features and advantages of the present application will become apparent from the following detailed description. It should be understood, however, that the detailed description and the specific examples while indicating embodiments of the application are given by way of illustration only, since various changes and modifications within the spirit and scope of the application will become apparent to those skilled in the art from this detailed description.

BRIEF DESCRIPTION OF THE DRAWINGS

The present application will now be described in greater detail with reference to the drawings in which.

DETAILED DESCRIPTION

I. Definitions

Figure 1:
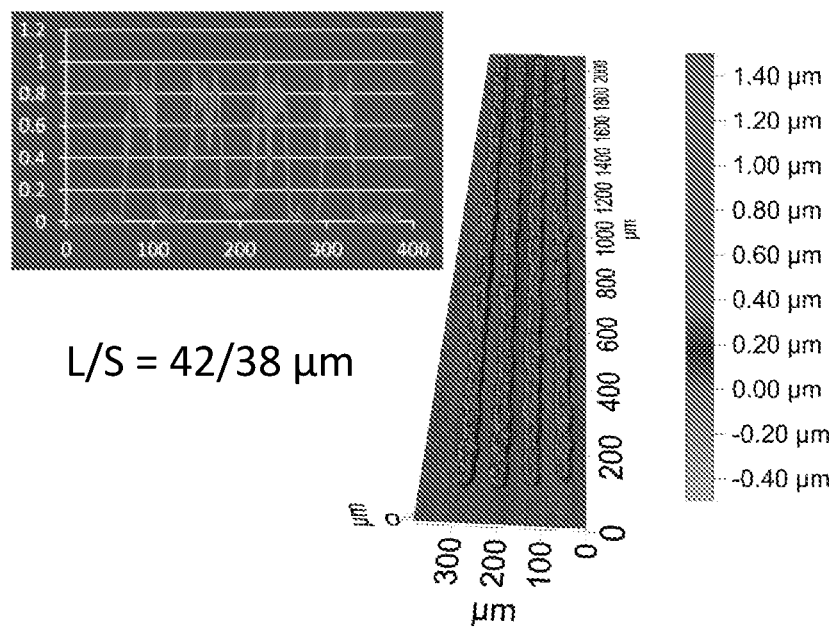
FIG. 1 depicts a three dimensional profilometer image of printed and sintered traces produced from a low temperature molecular ink of the present application (NRC-848A3a), and a resulting cross section that highlights linewidth and line spacing (L/S) that can be achieved with the ink.

Unless otherwise indicated, the definitions and embodiments described in this and other sections are intended to be applicable to all embodiments and aspects of the present application herein described for which they are suitable as would be understood by a person skilled in the art.

In understanding the scope of the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. The term "consisting" and its derivatives, as used herein, are intended to be closed terms that specify the presence of the stated features, elements, components, groups, integers, and/or steps, but exclude the presence of other unstated features, elements, components, groups, integers and/or steps. The term "consisting essentially of", as used herein, is intended to specify the presence of the stated features, elements, components, groups, integers, and/or steps as well as those that do not materially affect the basic and novel characteristic(s) of features, elements, components, groups, integers, and/or steps.

Terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The term "and/or" as used herein means that the listed items are present, or used, individually or in combination. In effect, this term means that "at least one of" or "one or more" of the listed items is used or present.

As used in this application, the singular forms "a", "an" and "the" include plural references unless the content clearly dictates otherwise. For example, an embodiment including "a conductive silver trace" should be understood to present certain aspects with one conductive silver trace or two or more additional conductive silver traces.

In embodiments comprising an "additional" or "second" component, such as an additional or second conductive silver trace, the second component as used herein is different from the other components or first component. A "third" component is different from the other, first, and second components, and further enumerated or "additional" components are similarly different.

The term "suitable" as used herein means that the selection of specific reagents or conditions will depend on the reaction or method step being performed and the desired results, but none-the-less, can generally be made by a person skilled in the art once all relevant information is known.

The term "conductive trace ink" as used herein refers to an ink that once deposited (e.g. printed) on a substrate is conductive or may be processed further to become conductive using suitable methods known in the art, such as curing (including sintering). Exemplary conductive trace inks include molecular inks and nanoparticle inks.

The term "curing" as used herein with reference to the processing of conductive trace inks on a substrate refers to means for ultimately rendering the ink conductive. Curing may be done in one or more stages which may or may not be performed sequentially. For example, in a thermoforming process to make a shaped electronic part or component, a conductive trace ink deposited onto a substrate may be dried in a first stage and sintered in a second stage. Following the first stage of curing, there may be other steps in the thermoforming process taken to coat, overmould, shape, etc. the substrate with the deposited conductive trace ink prior to carrying out the second stage (i.e. sintering). When the term "curing" is used in with reference to a thermoset overmoulding resin, it is similarly a reference to the processing of the precursor of the resin to set the resin to obtain the overmoulded part.

The terms "coupled" and "deposited" as used herein refer to the layering or adhesion of materials and components in or on an overmoulded part. A conductive trace coupled to a substrate or conductive trace ink deposited onto a first surface of a substrate both refer to the association of that material or component to a substrate, whether or not there are other inks and materials also coupled or deposited to the substrate. Changes in the ordering of different ink layers, resins, and other materials or components to achieve different design objectives for an overmoulded part does not change the fact of a particular material or component being coupled or deposited to a substrate. For example, a conductive trace is still coupled to a substrate even if a decorative ink or dielectric layer are intervening between the trace and the surface of the substrate. In the case of a double-sided overmoulded part, a material or component is coupled to a substrate based on which substrate it is adhered to, again whether directly or indirectly to the surface of the substrate.

The term "molecular ink" as used herein refers to an ink comprising a metal cation that is reducible to the 0 oxidation state on sintering.

The term "high temperature molecular ink" as used herein refers to a molecular ink that is sinterable at a temperature range of about 125-250° C., for example about 150-230° C. such as the molecular inks described in in PCT Application Publication No. WO 2015/192248. For example, such high temperature molecular inks comprising silver cations may be sintered at a temperature in a range of about 200-230° C. For example, such high temperature molecular inks comprising copper cations may be sintered at a temperature in a range of about 125-175° C.

The term "low temperature molecular ink" as used herein refers to a molecular ink that is sinterable at a lower temperature range than a high temperature molecular ink comprising the same cation. Low temperature molecular inks comprising copper cations are described in PCT Application publication Nos. WO 2016/197234 and WO 2018/018136. Low temperature molecular inks comprising silver cations are described in the embodiments of the present application that are sinterable at a temperature range of about 80° C. to about 140° C. For example, about 85° C. to about 140° C., or about 90° C. to about 130° C. Other exemplary inks comprising silver cations are described in WO 2018/146616. Low temperature inks may also be provided comprising a thermal protecting agent to render the ink both printable and sinterable with broad spectrum ultraviolet (UV) light into electrically conductive traces on a low temperature/thermoformable substrate (see PCT/IB2019/056612).

The term "nanoparticle ink" as used herein refers to an ink comprising metal nanoparticles that are in the 0 oxidation state, which fuse on curing. The nanoparticles can be flakes or other shapes.

The term "silver flake ink" as used herein refers to an ink comprising silver nanoparticle flakes that are in the 0 oxidation state, which fuse on curing.

II. Methods

In multi-step manufacturing processes designed to make overmoulded electronic parts there a number of process design considerations that must be taken into account to effectively leverage the different properties of compositions and components used to make such parts, which generally involves layering substances and integrating electrical components into the overmoulded electronic part. The resolution of challenges posed by the different and often incompatible properties of materials/substances and components, and the need to realize processing efficiencies dictates the selection of materials or substances, processing methods and sequence of processing steps taken to produce an overmoulded electronic part. In one embodiment the method of manufacturing an overmoulded printed electronic part comprises one or more application steps (e.g. deposition, printing, injection shots, etc.) of materials or substances to a substrate, such as inks, dielectrics, adhesives, other coatings and reinforcing materials. In another embodiment, the method of manufacturing an overmoulded printed electronic part comprises one or more processing steps (e.g. drying, heating, UV curing, sintering, etc.)

For example, the selection of suitable conductive trace inks will be dictated by the need to effectively deposit the inks on a substrate and expose them to thermal processing and mechanical stresses during a thermoforming process, to obtain suitably conductive traces in the resulting electronic part. Providing alternative material options provides process and part design flexibilities necessary to improve manufacturing and the diversity of electronic parts that can be made for application in different industries Methods for overmoulding electronic parts comprising printing with molecular inks using known injection moulding techniques can manufacture parts with increased complexity over flake inks or for use in combination with flake inks. For example, due to increased elongation capability of the traces prepared from the molecular inks, use of a molecular ink may be preferred on areas of a substrate subjected to more shaping during a thermoforming process. In other words, increasing the maximum elongation of the conductive trace can open the space used to manufacture more complex 3D structures. By contrast the use of a nanoparticle ink may be preferred on areas of a substrate which are subjected to a lesser degree of shaping, but which will require the layering of substances and/or maintenance of electrical connections between electronic components during manufacturing. In this case, the ability to adapt the application of sintering processes to such areas of a substrate can be an advantage to using one or more different kinds of conductive trace inks. Accordingly, a molecular ink can be used in combination with a nanoparticle ink to form circuit connection points and other electrical features. There will be areas where nanoparticle inks can be used sparingly, where lower resistances are sought and substrate elongations (and therefore mechanical stresses) are small, such as, where there are connector pads, LED terminal pads and crossovers. The use of different inks and need to layer different materials/substances and components when making electronic parts may also require the use of dielectrics to insulate (in whole or in part) deposited conductive trace inks and electrical cross-over or connection points from other circuitry features. This can create challenges with regard to the efficiencies of sintering deposited traces (post thermoforming) through multiple layers so as to obtain good conductivity while also minimizing damage to features in an electronic part. Opaque dielectrics can be very effective insulators in areas where the curing of deposited conductive trace ink does not require sintering following deposition of the dielectric.

When using molecular inks that require sintering, it may be necessary to first sinter the deposited conductive trace ink prior to applying the dielectric. Alternatively, clear dielectrics may be more suitable for use in areas where the curing of a deposited conductive trace ink requires sintering through layers of materials post thermoforming, for manufacturing efficiencies. The design choice to sinter prior to or after applying a dielectric will depend on whether a given area of a substrate, where the conductive trace ink is deposited, is anticipated to undergo significant shaping during thermoforming. The sintering of deposited conductive trace inks prior to thermoforming can be done if the resulting conductive traces will not be unduly mechanically stressed during shaping (e.g. the conductive traces will undergo minimal to no stretching, bending twisting, etc.), to avoid cracking and loss of adhesion to the substrate).

By way of example, Sun Chemical DST 4826C is a clear dielectric, but offers less protection than an opaque dielectric, such as Dupont ME778, a solid white material. While the white dielectric offers superior electrical separation, it can only be used where non-optical or see through features are present because tests undertaken suggest that it is not possible to photo sinter traces below this layer of material. By contract, the clear material is advantageous for allowing light through it, the simplification of the screening process and where it is desirable to put the dielectric as an entire surface layer (where post thermoforming sintering is preferred).

Other considerations in the manufacture of overmoulded electronic parts (beyond assuring the integrity of their electrical function) is ensuring a resulting electronic part is lightweight, yet also resilient and resistant to damage during manufacturing and during normal usage for its intended purpose. The use of thermoset resins (such as aliphatic polyurethane resins) instead of the traditional thermoplastic resins in overmoulding can facilitate the use of lower cost moulds, lower cost injection systems, and/or parts with improved surface quality, scratch resistance and/or mechanical properties. This is due to their harder or tougher properties once cured.

UV cured hard coats may also be applied on the opposite side (second surface) of a substrate from where conductive trace inks are deposited to make the resulting electronic part harder. In one embodiment, the hard coat is integrated as part of the substrate (e.g. the polycarbonate substrate available as Lexan). The coating is flexible and maintains its integrity during thermoforming and can UV cured to harden post thermoforming. In another embodiment, the finished thermoformed part is dipped into, or sprayed with a coating which is then UV cured.

Overmoulded printed electronic parts comprising foamed overmoulded resins (either thermoplastic or thermoset resins) and/or comprising glass microspheres embedded in the overmoulded resins (either thermoplastic or thermoset resins) can be significantly lighter than similar overmoulded printed electronic parts in which the resins are not foamed and do not contain glass microspheres. Foamed thermoplastic and thermoset polymers may also reduce damage to electrical traces due to a soft fill effect, resulting in the ability to increase circuit complexity and available surface in part.

Overmoulded printed electronic parts comprising structural reinforcement layers such as glass fabric layers and the like between a substrate and the overmoulded resin (either thermoplastic or thermoset resins) can significantly change the properties of the final part, for example, thermal and/or mechanical properties, in comparison to a similar part without structural reinforcement, making the parts structural in nature or thinner and/or lighter.

Another process or method design consideration is whether or not a particular overmoulded electronic part will include light or optical features, e.g. when making back lit parts using LEDs. In this case, the selection of suitable dielectrics and the application of fibreglass reinforcing materials and glass microspheres can be adapted to accommodate the integration of lighting features. The use of fibreglass can be manipulated so as to leave openings that allow for the passage of light by the absence of intervening materials which can absorb light. Similarly, glass microspheres would not be used in areas where lighting features are contemplated.

Accordingly, the present application includes a method for manufacturing an overmoulded printed electronic part, the method comprising:
  depositing a low temperature molecular ink on a substrate to form a non-conductive trace of the ink on a first surface of the substrate;
  sintering the non-conductive trace of the ink on the substrate to form a conductive silver trace on the first surface of the substrate;
  injecting an overmoulding resin or a precursor thereto over the conductive silver trace on the first surface of the substrate; and
  hardening the overmoulding resin or curing the precursor thereto to obtain the overmoulded printed electronic part.

The low temperature molecular ink is deposited on the substrate by any suitable method to form a non-conductive trace of the ink on the first surface of the substrate. In an embodiment, the low temperature molecular ink is printed on the substrate. In another embodiment, the printing comprises screen printing, inkjet printing, flexography printing, gravure printing, off-set printing, airbrushing, aerosol printing, typesetting or stamping. In another embodiment of the present application, the low temperature molecular ink is deposited by screen printing.

The non-conductive trace is sintered to form the conductive silver trace by any suitable method which may depend, for example on the type of substrate on which the traces are deposited and/or the type of silver salt in the ink. Sintering decomposes the silver salt to form conductive particles (for example nanoparticles) of the silver. In an embodiment, the sintering comprises heating and/or photonic sintering with intense pulsed ultra-violet (UV) light. In a further embodiment, the sintering comprises the application of broad band UV light.

In an embodiment, sintering comprises heating. In another embodiment, heating the substrate dries and sinters the trace to form the conductive trace. It is an advantage of the low temperature molecular inks that heating may be performed at a relatively low temperature range, for example, for silver cation-containing low temperature molecular inks of about 80° C. to about 140° C., about 85° C. to about 140° C., or about 90° C. to about 130° C., While the ability to sinter at lower temperature is an advantage of these inks, heating may be alternatively performed at higher temperatures, if desired, for example at temperatures of about 150° C. or higher or up to a temperature of about 250° C.

In an embodiment, heating is performed for a time of about 1 hour or less. In another embodiment, heating is performed for a time of about 30 minutes or less, for example a time in a range of about 1 to about 30 minutes, or about 2 to about 20 minutes. In a further embodiment, heating is performed for a time of about 5 to about 20 minutes. Heating is performed at a sufficient balance between temperature and time to sinter the trace on the substrate to form a conductive trace. For example, narrow, highly conductive traces may be formed by sintering at 120° C. for as little as 5 minutes or at 90° C. for 20 to 40 minutes. The type of heating apparatus also factors into the temperature and time required for sintering. In an embodiment, sintering is performed with the substrate under an oxidizing atmosphere (e.g. air). In another embodiment, sintering is performed under an inert atmosphere (e.g. nitrogen and/or argon gas).

In another embodiment, sintering comprises photonic sintering. In an embodiment, the photonic sintering comprises a photonic sintering system having a high intensity lamp (e.g. a pulsed xenon lamp) that delivers a broadband spectrum of light. In an embodiment, the lamp delivers about 5 to about 20 J/cm$^2$ in energy to the traces. In another embodiment, the pulse width is in a range of about 0.58 to about 1.5 ms. In an embodiment, photonic sintering is performed under ambient conditions (e.g. in air). Photonic sintering is especially suited for polyethylene terephthalate, polycarbonate and polyimide substrates.

In a further embodiment of the present application, sintering is performed using microwave or near infrared (NIR) methods, the selection of which can be made by the person skilled in the art.

A conductive silver trace formed by drying and sintering the low temperature molecular ink on the substrate is of any suitable thickness and width. It is an advantage that the low temperature molecular ink may be dried and sintered to form a conductive trace that is relatively thin and/or narrow, while maintaining relatively high conductivity (i.e. relatively low resistivity). In some embodiments, the conductive trace has an average thickness of about 4 microns or less, or about 1.5 microns or less, or about 1 micron or less, for example about 0.3-1.5 microns or about 0.4-1 micron. In some embodiments, the conductive trace has a nominal line width of about 30 mil or lower, or about 20 mil or lower, for example about 2-20 mil. In some embodiments, sheet resistivity values are less than about 30 mΩ/□/mil, or about 20 mΩ/□/mil or less, for example about 5-20 mΩ/□/mil. Additionally, the ink can provide conductive traces on a substrate with relatively low linewidth-over-spacing (L/S) values, which advantageously lends itself to miniaturization of electronic circuitry. For example, the L/S value may be less than about 100/70 μm, even as low as about 42/38 μm.

In some embodiments, subsequent to depositing the low temperature molecular ink and prior to sintering the non-conductive trace, the method further comprises forming the substrate to obtain a shaped substrate. In some embodiments, subsequent to sintering the non-conductive trace and prior to injecting the overmoulding resin or precursor thereto, the method further comprises forming the substrate to obtain a shaped substrate. Forming the substrate to obtain the shaped substrate can comprise any suitable means, the selection of which can be chosen by a person skilled in the art. In an embodiment, the substrate is formed into the shaped substrate by a method comprising thermoforming, cold forming, extrusion or blow moulding. In another embodiment, the substrate is formed into the shaped substrate by a method comprising thermoforming. Accordingly, in some embodiments, subsequent to depositing the low temperature molecular ink and prior to sintering the non-conductive trace, the method further comprises thermoforming the substrate to obtain a shaped substrate. Accordingly, in some embodiments, subsequent to sintering the non-conductive trace and prior to injecting the overmoulding resin or precursor thereto, the method further comprises thermoforming the substrate to obtain a shaped substrate.

In some embodiments, prior to forming (e.g. thermoforming) the substrate, the method further comprises coupling one or more electronic components to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In an embodiment, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In some embodiments of the present application, subsequent to forming (e.g. thermoforming) the substrate and prior to injecting the overmoulding resin or the precursor thereto, the method further comprises introducing a fibreglass reinforcing layer over the first surface of the substrate. The fibreglass reinforcing layer is any suitable fibreglass reinforcing layer. For example, it would be appreciated by the person skilled in the art that the reinforcing layer advantageously has a reflective index about the same as the overmoulding resin. In an embodiment, the fibreglass reinforcing layer is introduced via a pre-impregnated tape or a co-mingled woven fabric. In embodiments wherein the overmoulding resin is a thermoset resin, the fibreglass reinforcing layer may additionally be introduced via a dry fabric, which is saturated during injecting. In an embodiment, the fibreglass reinforcing layer is introduced by a method comprising applying a splatter coat of an ultra-violet curable adhesive between the fibreglass reinforcing layer and the substrate, vacuum bag forming the fibreglass reinforcing layer on the substrate, and ultra-violet curing of the adhesive. It will be appreciated by the person skilled in the art that such a method can keep the fibreglass reinforcing layer in the correct position during injection of the overmoulding resin or the precursor thereto, minimizing movement inside the part. In an embodiment, the ultra-violet adhesive is cured through the fibreglass reinforcing layer and vacuum bag using a high energy ultra-violet system. Any suitable adhesive and system may be used. For example, Fusion UV V Bulbs may be used to achieve a suitable cure through the two materials.

In some embodiments, prior to depositing the low temperature molecular ink, the method further comprises depositing one or more decorative inks on the first surface of the substrate. The one or more decorative inks are any suitable decorative ink and are deposited on the substrate by any suitable means, the selection of which can be made by the person skilled in the art. For example, it would be appreciated by the skilled person that in embodiments of the methods of the present application which comprise thermoforming, the decorative ink is cured prior to thermoforming to drive off solvents.

In some embodiments, prior to depositing the low temperature molecular ink or subsequent to depositing the low temperature molecular ink and prior to sintering the non-conductive trace or optionally forming (e.g. thermoforming) the substrate, the method further comprises depositing a dielectric ink on the first surface of the substrate. The dielectric ink is any suitable dielectric ink and is deposited on the substrate by any suitable means, the selection of which can be made by the person skilled in the art. For example, it would be appreciated by the skilled person that in embodiments of the methods of the present application which comprise thermoforming, the dielectric ink is cured prior to thermoforming.

In some embodiments of the present application, the method comprises repeating the deposition of the low temperature molecular ink on the substrate to obtain multiple layers of conductive silver traces.

In some embodiments, subsequent to forming (e.g. thermoforming) the substrate, the method further comprises applying an ultra-violet curable hard coat to a second surface of the substrate. The ultra-violet curable hard coat is any suitable ultra-violet curable hard coat and is applied using any suitable means, the selection of which can be made by the person skilled in the art.

In some embodiments, the overmoulding resin is a thermoplastic resin. It will be appreciated by a person skilled in the art that a thermoplastic resin softens when heated and hardens when cooled. Accordingly, in embodiments of the methods for manufacturing an overmoulded printed electronic part which comprise the use of thermoplastic resins, subsequent to injection the thermoplastic resin is cooled under conditions suitable to obtain the overmoulded printed electronic part. The thermoplastic resin is any suitable thermoplastic resin.

In some embodiments, the precursor to the overmoulding resin is a precursor to a thermoset resin. The term "precursor" as used herein in reference to a thermoset resin refers to a component or combination of components which, upon curing produce the thermoset resin by means of crosslinking or chain extension. Accordingly, in embodiments of the methods for manufacturing an overmoulded printed electronic part which comprise the use of precursors to thermoset resins, subsequent to injection the thermoset resin precursors are cured under conditions suitable to obtain the overmoulded printed electronic part. The precursor to the thermoset resin is any suitable precursor to a thermoset resin. In an embodiment, the precursor to the thermoset resin is a precursor to any suitable polyurethane thermoset resin. In another embodiment, the polyurethane resin is a clear aliphatic polyurethane thermoset resin. In a further embodiment, the precursor comprises an isocyanate, a polyol and a catalyst.

In some embodiments, the overmoulding resin or the precursor thereto is injected in combination with glass microspheres. The glass microspheres are any suitable glass microspheres. In an embodiment, the glass microspheres comprise, consist essentially of or consist of soda limeborosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

In some embodiments, the overmoulding resin or the precursor thereto is injected under conditions to obtain a foam. The selection of suitable conditions to obtain a foam can be readily made by the person skilled in the art. In some embodiments, the conditions to obtain a foam comprise introducing a blowing agent into the overmoulding resin or the precursor thereto which will produce a microcellular morphology in the hardened or cured overmoulded resin. The blowing agent is any suitable blowing agent. In some embodiments, the blowing agent is azodicarbonamide (ADCA) or sodium bicarbonate.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the method is for manufacturing an overmoulded printed electronic part for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the method is for manufacturing an overmoulded printed electronic part for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate comprises polycarbonate.

In embodiments of the methods for manufacturing an overmoulded printed electronic part of the present application which comprise forming (e.g. thermoforming) the substrate, it will be appreciated by a person skilled in the art that the substrate is a shapeable substrate and therefore comprises a material that can be formed (e.g. thermoformed). Because the low temperature molecular inks can be dried and sintered at temperatures under 100° C. to form conductive traces, the low temperature molecular ink is compatible with the range of shapeable substrates currently commercially available. Shapeable substrates may be flexible (e.g. bendable, stretchable, twistable etc.) under particular forming conditions. In some instances, the shapeable substrate may retain the shaped form after forming, while in other instances, external force may be required to retain the shaped substrate in the shaped form.

In some embodiments, the overmoulded printed electronic part is single-sided. In some embodiments, the overmoulded printed electronic part is double-sided. The person skilled in the art could readily adapt the methods for manufacturing an overmoulded printed electronic part having a single side or a double side with reference to the disclosure of the present application.

The present application also includes a method for manufacturing an overmoulded printed electronic part, the method comprising:
  injecting a precursor to a thermoset overmoulding resin over a conductive trace on a first surface of a substrate; and
  curing the precursor to the thermoset overmoulding resin to obtain the overmoulded printed electronic part.

In an embodiment, the conductive trace on the first surface of the substrate is obtained by a method comprising:
  depositing a conductive trace ink on a substrate to form a non-conductive trace of the ink on a first surface of the substrate; and
  curing the non-conductive trace of the ink on the substrate to form the conductive trace on the first surface of the substrate.

The conductive trace ink is deposited on the substrate by any suitable method to form a non-conductive trace of the ink on the first surface of the substrate. In an embodiment, the conductive trace ink is printed on the substrate. In another embodiment, the printing comprises screen printing, inkjet printing, flexography printing, gravure printing, offset printing, airbrushing, aerosol printing, typesetting or stamping. In another embodiment of the present application, the conductive trace ink is deposited by screen printing.

The conductive trace ink is any suitable ink that upon curing forms a conductive trace on the first surface of the substrate. In an embodiment, the conductive trace ink is a molecular ink or a nanoparticle ink (e.g. a silver flake ink). In an embodiment, the conductive trace ink is a molecular ink. In another embodiment, the molecular ink is a low temperature molecular ink or a high temperature molecular ink. The conditions for curing the non-conductive trace of the ink on the substrate to form the conductive trace will depend on the selection of the conductive trace ink. In an embodiment, the conductive trace ink is a low temperature molecular ink and the curing comprises sintering. The conditions for sintering are any suitable conditions and are selected from any suitable embodiments for sintering a low temperature molecular ink described herein. In another embodiment, sintering of the low temperature molecular ink comprises photonic sintering.

In an embodiment, the conductive trace ink is a high temperature molecular ink and the curing comprises sintering. The conditions for sintering are any suitable conditions and are selected, for example, from any suitable conditions for sintering a high temperature molecular ink described in PCT Application Publication No. WO 2015/192248. In another embodiment, sintering of the high temperature molecular ink comprises photonic sintering.

In related embodiments, the high temperature molecular ink comprises a metal precursor molecule, specifically a metal carboxylate, more specifically a $C_8$-$C_{12}$ silver carboxylate or bis(2-ethyl-1-hexylamine) copper (II) formate, bis(octylamine) copper (II) formate or tris(octylamine) copper (II) formate. Because the ink does not contain flakes, conductive traces formed from the ink comprise interconnected metal nanoparticles, which permit the formation of very thin and narrow conductive traces.

The molecular ink comprises a composition comprising about 30-60 wt % of a $C_8$-$C_{12}$ silver carboxylate or about 5-75 wt % of bis(2-ethyl-1-hexylamine) copper (II) formate, bis(octylamine) copper (II) formate or tris(octylamine) copper (II) formate, weights based on total weight of the composition. Preferably, the composition comprises about 45-55 wt %, for example about 50 wt %, of the silver carboxylate, or about 65-75 wt %, for example about 72 wt %, of the bis(2-ethyl-1-hexylamine) copper (II) formate, bis(octylamine) copper (II) formate or tris(octylamine) copper (II) formate.

In one embodiment, the silver carboxylate is a silver salt of a 08-$C_{12}$ alkanoic acid. The alkanoic acid is preferably a decanoic acid, more preferably neodecanoic acid. The silver carboxylate is most preferably silver neodecanoate. In a related embodiment, the ink comprises a flake-less printable composition of 30-60 wt % of a $C_8$-$C_{12}$ silver carboxylate, 0.1-10 wt % of a polymeric binder and balance of at least one organic solvent, all weights based on total weight of the composition. In still another related embodiment, the ink comprises: 45-55 wt % of silver neodecanoate; 2.5-5 wt % of a mixture of a first ethyl cellulose having a weight average molecular weight in a range of from 60,000-70,000 g/mol and a second ethyl cellulose having a weight average molecular weight in a range of from 90,000-100,000 g/mol; and, balance of an organic solvent comprising a mixture of at least one aromatic solvent and terpineol, all weights based on total weight of the composition.

In another embodiment, the high temperature ink comprises 78 wt % silver neodeconoate, 7.7 wt % octanol, 12.8 wt % ethyl-2 oxazolin and 1.5% Rokrapol.

In another embodiment, the metal carboxylate is a copper complex of formic acid and 2-ethyl-1-hexylamine or octylamine. The copper carboxylate is most preferably bis(2-ethyl-1-hexylamine) copper (II) formate. In a related embodiment the ink comprises a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition The composition in the molecular ink also comprises about 0.1-10 wt %, preferably about 0.25-10 wt % of a polymeric binder, based on total weight of the composition. For screen printable silver inks, the composition preferably comprises about 2.5-5 wt % of the binder, for example about 5 wt %. For copper inks, the composition preferably comprises about 0.5-2 wt % of the binder, more preferably about 0.5-1.5 wt %, for example about 1 wt %.

The amount of polymeric binder may also be expressed in terms of the mass of the metal in the metal precursor molecule. Preferably, the polymeric binder may be present in the composition in a range of about 2.5-52 wt % based on weight of the metal in the metal precursor. Weight of the metal in the metal precursor is the total weight of the metal without the other elements that comprise the precursor. More preferably, the polymeric binder is in a range of about 6.5-36 wt % based on weight of the metal in the metal precursor.

The polymeric binder preferably comprises ethyl cellulose, polypyrrolidone, epoxies, phenolic resins, acrylics, urethanes, silicones, styrene allyl alcohols, polyalkylene carbonates, polyvinyl acetals, polyesters, polyurethanes, polyolefins, fluoroplastics, fluoroelastomers, thermoplastic elastomers or any mixture thereof. The polymeric binder preferably comprises ethyl cellulose or polyurethane, especially ethyl cellulose.

The molecular weight of the binder, especially ethyl cellulose, may play a role in optimizing the properties of the conductive traces formed from the molecular ink. Preferably, the binder has an average weight average molecular weight (Mw) in a range of about 35,000-100,000 g/mol, more preferably about 60,000-95,000 g/mol. The average weight average molecular weight of the binder may be adjusted to a desired value by using a mixture of binders having different molecular weights. The mixture of binders preferably comprises a first binder having a weight average molecular weight in a range of about 60,000-70,000 g/mol, for example about 65,000 g/mol, and a second binder having a weight average molecular weight in a range of about 90,000-100,000 g/mol, for example about 96,000 g/mol. The proportion of first to second binder in the mixture is preferably about 10:1 to 1:10, or 10:1 to 1:1, or about 7:1 to 5:3. The molecular weight distribution of binder may be unimodal or multimodal, for example bimodal. In some embodiments, the binder may comprise a mixture of different types of polymers.

The composition in the molecular ink also comprises a solvent. The solvent generally makes up the balance of the composition. The balance may be, in some instances, about 15-94.75 wt %. For silver inks, the balance is preferably 40-52.5 wt % solvent, for example about 45 wt %. For copper inks, the balance is preferably 25-30 wt % solvent, for example about 27 wt %.

The solvent may comprise at least one aromatic organic solvent, at least one non-aromatic organic solvent or any mixture thereof.

In some embodiments, the solvent preferably comprises at least one aromatic organic solvent. The at least one aromatic organic solvent preferably comprises benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene or any mixture thereof. The at least one aromatic organic solvent more preferably comprises toluene, xylene, anisole, diethylbenzene or any mixture thereof. For the silver-based inks, the solvent more preferably comprises xylene, diethylbenzene, toluene or any mixture thereof. For copper-based inks, the solvent preferably comprises anisole.

In some embodiments, the solvent preferably comprises at least one non-aromatic organic solvent. The at least one non-aromatic organic solvent preferably comprises a terpene-based solvent, an alcohol or any mixture thereof. Some examples of non-aromatic organic solvent include terpineol, alpha-terpinene, gamma-terpinene, terpinolene, limonene, pinene, carene, methylcyclohexanols, octanols, heptanols or any mixture thereof. Of particular note are terpineol, α-terpinene, 2-methylcyclohexanol, 1-octanol and mixtures thereof, especially 2-methylcyclohexanol. In some embodiments, the solvent preferably comprises a mixture of at least one aromatic organic solvent and at least one non-aromatic organic solvent. The non-aromatic organic solvent is preferably present in the solvent mixture in an amount of about 75 wt % or less based on the weight of the solvent, for example about 50 wt % or less. In one embodiment for silver-based inks, the solvent may comprise a mixture of xylene and terpineol or diethylbenzene and 1-octanol.

In another embodiment, the conductive trace ink is a nanoparticle ink (e.g. a silver flake ink) and the curing comprises sintering. The conditions for sintering the nanoparticle ink (e.g. the silver flake ink) are any suitable conditions and can be readily selected by the person skilled in the art from known methods. In another embodiment, the nanoparticle ink (e.g. the silver flake ink) is sintered by a method comprising heating. Sintering is needed to optimize conductivity in light of other non-conductive materials that may be included in a nanoparticle ink formulation such as polymers and solvents.

In some embodiments, subsequent to depositing the conductive trace ink and prior to curing the non-conductive trace, the method further comprises forming the substrate to obtain a shaped substrate. In some embodiments, subsequent to curing the non-conductive trace and prior to injecting the precursor to the thermoset overmoulding resin, the method further comprises forming the substrate to obtain a shaped substrate. Forming the substrate to obtain the shaped substrate can comprise any suitable means, the selection of which can be chosen by a person skilled in the art. In an embodiment, the substrate is formed into the shaped substrate by a method comprising thermoforming, cold forming, extrusion or blow fibreing. In another embodiment, the substrate is formed into the shaped substrate by a method comprising thermoforming. Accordingly, in some embodiments, subsequent to depositing the conductive trace ink and prior to curing the non-conductive trace, the method further comprises thermoforming the substrate to obtain a shaped substrate. Accordingly, in some embodiments, subsequent to curing the non-conductive trace and prior to injecting the precursor to the thermoset overmoulding resin, the method further comprises thermoforming the substrate to obtain a shaped substrate.

In some embodiments, prior to forming (e.g. thermoforming) the substrate, the method further comprises coupling one or more electronic components to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In an embodiment, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In some embodiments of the present application, subsequent to forming (e.g. thermoforming) the substrate and prior to injecting the precursor to the thermoset overmoulding resin, the method further comprises introducing a fibreglass reinforcing layer over the first surface of the substrate. The fibreglass reinforcing layer is any suitable fiberglass reinforcing layer. For example, it would be appreciated by the person skilled in the art that the reinforcing layer advantageously has a reflective index about the same as the overmoulding resin. In an embodiment, the fibreglass reinforcing layer is introduced via a pre-impregnated tape, a co-mingled woven fabric or a dry fabric, which is saturated during injecting. In an embodiment, the fibreglass reinforcing layer is introduced by a method comprising applying a splatter coat of an ultra-violet curable adhesive between the fibreglass reinforcing layer and the substrate, vacuum bag forming the fibreglass reinforcing layer on the substrate, and ultra-violet curing of the adhesive. It will be appreciated by the person skilled in the art that such a method can keep the fibreglass reinforcing layer in the correct position during injection of the precursor to the thermoset overmoulding resin, minimizing movement inside the part. In an embodiment, the ultra-violet adhesive is cured through the fibreglass reinforcing layer and vacuum bag using a high energy ultra-violet system. Any suitable adhesive and system may be used. For example, Fusion UV V Bulbs may be used to achieve a suitable cure through the two materials.

In some embodiments, prior to depositing the conductive trace ink, the method further comprises depositing one or more decorative inks on the first surface of the substrate. The one or more decorative inks are any suitable decorative ink and are deposited on the substrate by any suitable means, the selection of which can be made by the person skilled in the art. For example, it would be appreciated by the skilled person that in embodiments of the methods of the present application which comprise thermoforming, the decorative ink is cured prior to thermoforming to drive off solvents.

In some embodiments, prior to depositing the conductive trace ink or subsequent to depositing the conductive trace ink and prior to curing the non-conductive trace or optionally forming (e.g. thermoforming) the substrate, the method further comprises depositing a dielectric ink on the first surface of the substrate. The dielectric ink is any suitable dielectric ink and is deposited on the substrate by any suitable means, the selection of which can be made by the person skilled in the art. For example, it would be appreciated by the skilled person that in embodiments of the methods of the present application which comprise thermoforming, the dielectric ink is cured prior to thermoforming.

In some embodiments of the present application, the method comprises repeating the deposition of the conductive trace ink on the substrate to obtain multiple layers of conductive traces.

In some embodiments, subsequent to forming (e.g. thermoforming) the substrate, the method further comprises applying an ultra-violet curable hard coat to a second surface of the substrate. The ultra-violet curable hard coat is any suitable ultra-violet curable hard coat and is applied using any suitable means, the selection of which can be made by the person skilled in the art.

The precursor to the thermoset resin is any suitable precursor to a thermoset resin. In an embodiment, the precursor to the thermoset resin is a precursor to a polyurethane resin. In another embodiment, the polyurethane resin is a clear aliphatic polyurethane thermoset resin. In a further embodiment, the precursor comprises an isocyanate, a polyol and a catalyst.

In some embodiments, the precursor to the thermoset resin is injected in combination with glass microspheres. The glass microspheres are any suitable glass microspheres.

In an embodiment, the glass microspheres comprise, consist essentially of or consist of soda lime-borosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

In some embodiments, the precursor to the thermoset resin is injected under conditions to obtain a foam. The selection of suitable conditions to obtain a foam can be readily made by the person skilled in the art. In some embodiments, the conditions to obtain a foam comprise introducing a blowing agent into the precursor to the thermoset resin which will produce a microcellular morphology in the cured overmoulded resin. The blowing agent is any suitable blowing agent. In some embodiments, the blowing agent is azodicarbonamide (ADCA) or sodium bicarbonate.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the method is for manufacturing an overmoulded printed electronic part for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the method is for manufacturing an overmoulded printed electronic part for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate comprises polycarbonate.

In some embodiments, the overmoulded printed electronic part is single-sided. In some embodiments, the overmoulded printed electronic part is double-sided. The person skilled in the art could readily adapt the methods for manufacturing an overmoulded printed electronic part having a single side or a double side with reference to the disclosure of the present application.

The present application also includes a method for manufacturing an overmoulded printed electronic part, the method comprising:
 injecting a composition comprising:
  an overmoulding resin or a precursor thereto; and
  glass microspheres,
 over a conductive trace on a first surface of a substrate; and hardening the overmoulding resin or curing the precursor thereto to obtain the overmoulded printed electronic part.

In an embodiment, the conductive trace on the first surface of the substrate is obtained by a method comprising:
 depositing a conductive trace ink on a substrate to form a non-conductive trace of the ink on a first surface of the substrate; and
 curing the non-conductive trace of the ink on the substrate to form the conductive trace on the first surface of the substrate.

The conductive trace ink is deposited on the substrate by any suitable method to form a non-conductive trace of the ink on the first surface of the substrate. In an embodiment, the conductive trace ink is printed on the substrate. In another embodiment, the printing comprises screen printing, inkjet printing, flexography printing, gravure printing, offset printing, airbrushing, aerosol printing, typesetting or stamping. In another embodiment of the present application, the conductive trace ink is deposited by screen printing.

The conductive trace ink is any suitable ink that upon curing forms a conductive trace on the first surface of the substrate. In an embodiment, the conductive trace ink is a molecular ink or a nanoparticle ink (e.g. a silver flake ink). In an embodiment, the conductive trace ink is a molecular ink. In an embodiment, the molecular ink is a low temperature molecular ink or a high temperature molecular ink. The conditions for curing the non-conductive trace of the ink on the substrate to form the conductive trace will depend on the selection of the conductive trace ink. In an embodiment, the conductive trace ink is a low temperature molecular ink and the curing comprises sintering. The conditions for sintering are any suitable conditions and are selected from any suitable embodiments for sintering a low temperature molecular ink described herein. In another embodiment, sintering of the low temperature molecular ink comprises photonic sintering, or broad band UV sintering. In an embodiment, the conductive trace ink is a high temperature molecular ink and the curing comprises sintering. The conditions for sintering are any suitable conditions and are selected, for example, from any suitable conditions for sintering a high temperature molecular ink described in PCT Application Publication No. WO 2015/192248. In another embodiment, sintering of the high temperature molecular ink comprises photonic sintering. In an embodiment, the conductive trace ink is a nanoparticle ink (e.g. a silver flake ink) and the curing comprises sintering. The conditions for sintering the nanoparticle ink (e.g. the silver flake ink) are any suitable conditions and can be readily selected by the person skilled in the art from known methods. In another embodiment, the nanoparticle ink (e.g. the silver flake ink) is sintered by a method comprising heating.

In some embodiments, subsequent to depositing the conductive trace ink and prior to curing the non-conductive trace, the method further comprises forming the substrate to obtain a shaped substrate. In some embodiments, subsequent to curing the non-conductive trace and prior to injecting the composition, the method further comprises forming the substrate to obtain a shaped substrate. Forming the substrate to obtain the shaped substrate can comprise any suitable means, the selection of which can be chosen by a person skilled in the art. In an embodiment, the substrate is formed into the shaped substrate by a method comprising thermoforming, cold forming, extrusion or blow moulding. In another embodiment, the substrate is formed into the shaped substrate by a method comprising thermoforming. Accordingly, in some embodiments, subsequent to depositing the conductive trace ink and prior to curing the non-conductive trace, the method further comprises thermoforming the substrate to obtain a shaped substrate. Accordingly, in some embodiments, subsequent to curing the non-conductive trace and prior to injecting the composition, the method further comprises thermoforming the substrate to obtain a shaped substrate.

In some embodiments, prior to forming (e.g. thermoforming) the substrate, the method further comprises coupling one or more electronic components to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In an embodiment, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In some embodiments of the present application, subsequent to forming (e.g. thermoforming) the substrate and prior to injecting the composition, the method further comprises introducing a fibreglass reinforcing layer over the first surface of the substrate. The fibreglass reinforcing layer is any suitable fibreglass reinforcing layer. For example, it would be appreciated by the person skilled in the art that the reinforcing layer advantageously has a reflective index about the same as the overmoulding resin. In an embodiment, the fibreglass reinforcing layer is introduced via a pre-impregnated tape or a co-mingled woven fabric. In embodiments wherein the overmoulding resin is a thermoset resin, the fibreglass reinforcing layer may additionally be introduced via a dry fabric, which is saturated during injecting. In an embodiment, the fibreglass reinforcing layer is introduced by a method comprising applying a splatter coat of an ultra-violet curable adhesive between the fibreglass reinforcing layer and the substrate, vacuum bag forming the fibreglass reinforcing layer on the substrate, and ultra-violet curing of the adhesive. It will be appreciated by the person skilled in the art that such a method can keep the fibreglass reinforcing layer in the correct position during injection of the composition, minimizing movement inside the part. In an embodiment, the ultra-violet adhesive is cured through the fibreglass reinforcing layer and vacuum bag using a high energy ultra-violet system. Any suitable adhesive and system may be used. For example, Fusion UV V Bulbs may be used to achieve a suitable cure through the two materials.

In some embodiments, prior to depositing the conductive trace ink, the method further comprises depositing one or more decorative inks on the first surface of the substrate. The one or more decorative inks are any suitable decorative ink and are deposited on the substrate by any suitable means, the selection of which can be made by the person skilled in the art. For example, it would be appreciated by the skilled person that in embodiments of the methods of the present application which comprise thermoforming, the decorative ink is cured prior to thermoforming to drive off solvents.

In some embodiments, prior to depositing the conductive trace ink or subsequent to depositing the conductive trace ink and prior to curing the non-conductive trace or optionally forming (e.g. thermoforming) the substrate, the method further comprises depositing a dielectric ink on the first surface of the substrate. The dielectric ink is any suitable dielectric ink and is deposited on the substrate by any suitable means, the selection of which can be made by the person skilled in the art. For example, it would be appreciated by the skilled person that in embodiments of the methods of the present application which comprise thermoforming, the dielectric ink is cured prior to thermoforming.

In some embodiments of the present application, the method comprises repeating the deposition of the conductive trace ink on the substrate to obtain multiple layers of conductive traces.

In some embodiments, subsequent to forming (e.g. thermoforming) the substrate, the method further comprises applying an ultra-violet curable hard coat to a second surface of the substrate. The ultra-violet curable hard coat is any suitable ultra-violet curable hard coat and is applied using any suitable means, the selection of which can be made by the person skilled in the art.

In some embodiments, the overmoulding resin is a thermoplastic resin. It will be appreciated by a person skilled in the art that a thermoplastic resin softens when heated and hardens when cooled. Accordingly, in embodiments of the methods for manufacturing an overmoulded printed electronic part which comprise the use of thermoplastic resins, subsequent to injection the thermoplastic resin is cooled under conditions suitable to obtain the overmoulded printed electronic part. The thermoplastic resin is any suitable thermoplastic resin.

In some embodiments, the precursor to the overmoulding resin is a precursor to a thermoset resin. In embodiments of the methods for manufacturing an overmoulded printed electronic part which comprise the use of precursors to thermoset resins, subsequent to injection the thermoset resin precursors are cured under conditions suitable to obtain the overmoulded printed electronic part. The precursor to the thermoset resin is any suitable precursor to a thermoset resin. In an embodiment, the precursor to the thermoset resin is a precursor to any suitable polyurethane thermoset resin. In another embodiment, the polyurethane resin is a clear aliphatic polyurethane thermoset resin. In a further embodiment, the precursor comprises an isocyanate, a polyol and a catalyst.

The glass microspheres are any suitable glass microspheres. In an embodiment, the glass microspheres comprise, consist essentially of or consist of soda lime-borosilicate glass. In another embodiment, the glass microspheres have an average diameter of 18 microns. In a further embodiment, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the method is for manufacturing an overmoulded printed electronic part for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the method is for manufacturing an overmoulded printed electronic part for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate comprises polycarbonate.

In some embodiments, the overmoulded printed electronic part is single-sided. In some embodiments, the overmoulded printed electronic part is double-sided. The person skilled in the art could readily adapt the methods for manufacturing an overmoulded printed electronic part having a single side or a double side with reference to the disclosure of the present application.

The present application also includes a method for manufacturing an overmoulded printed electronic part, the method comprising:
    injecting an overmoulding resin or a precursor thereto over a conductive trace on a first surface of a substrate under conditions to obtain a foamed overmoulded resin or foamed precursor thereto; and
    hardening the foamed overmoulding resin or curing the foamed precursor thereto to obtain the overmoulded printed electronic part.

In an embodiment, the conductive trace on the first surface of the substrate is obtained by a method comprising:
    depositing a conductive trace ink on a substrate to form a non-conductive trace of the ink on a first surface of the substrate; and
    curing the non-conductive trace of the ink on the substrate to form the conductive trace on the first surface of the substrate.

The conductive trace ink is deposited on the substrate by any suitable method to form a non-conductive trace of the ink on the first surface of the substrate. In an embodiment, the conductive trace ink is printed on the substrate. In another embodiment, the printing comprises screen printing, inkjet printing, flexography printing, gravure printing, offset printing, airbrushing, aerosol printing, typesetting or stamping. In another embodiment of the present application, the conductive trace ink is deposited by screen printing.

The conductive trace ink is any suitable ink that upon curing forms a conductive trace on the first surface of the substrate. In an embodiment, the conductive trace ink is a molecular ink or a nanoparticle ink (e.g. a silver flake ink). In an embodiment, the conductive trace ink is a molecular ink. In an embodiment, the molecular ink is a low temperature molecular ink or a high temperature molecular ink. The conditions for curing the non-conductive trace of the ink on the substrate to form the conductive trace will depend on the selection of the conductive trace ink. In an embodiment, the conductive trace ink is a low temperature molecular ink and the curing comprises sintering. The conditions for sintering are any suitable conditions and are selected from any suitable embodiments for sintering a low temperature molecular ink described herein. In another embodiment, sintering of the low temperature molecular ink comprises photonic sintering. In an embodiment, the conductive trace ink is a high temperature molecular ink and the curing comprises sintering. The conditions for sintering are any suitable conditions and are selected, for example, from any suitable conditions for sintering a high temperature molecular ink described in PCT Application Publication No. WO 2015/192248. In another embodiment, sintering of the high temperature molecular ink comprises photonic sintering. In an embodiment, the conductive trace ink is a nanoparticle ink (e.g. a silver flake ink) and the curing comprises sintering. The conditions for sintering the nanoparticle ink (e.g. the silver flake ink) are any suitable conditions and can be readily selected by the person skilled in the art from known methods. In another embodiment, the nanoparticle ink (e.g. the silver flake ink) is sintered by a method comprising heating.

In some embodiments, subsequent to depositing the conductive trace ink and prior to curing the non-conductive trace, the method further comprises forming the substrate to obtain a shaped substrate. In some embodiments, subsequent to curing the non-conductive trace and prior to injecting the overmoulding resin or precursor thereto, the method further comprises forming the substrate to obtain a shaped substrate. Forming the substrate to obtain the shaped substrate can comprise any suitable means, the selection of which can be chosen by a person skilled in the art. In an embodiment, the substrate is formed into the shaped substrate by a method comprising thermoforming, cold forming, extrusion or blow moulding. In another embodiment, the substrate is formed into the shaped substrate by a method comprising thermoforming. Accordingly, in some embodiments, subsequent to depositing the conductive trace ink and prior to curing the non-conductive trace, the method further comprises thermoforming the substrate to obtain a shaped substrate. Accordingly, in some embodiments, subsequent to curing the non-conductive trace and prior to injecting the overmoulding resin or precursor thereto, the method further comprises thermoforming the substrate to obtain a shaped substrate.

In some embodiments, prior to forming (e.g. thermoforming) the substrate, the method further comprises coupling one or more electronic components to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In an embodiment, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In some embodiments of the present application, subsequent to forming (e.g. thermoforming) the substrate and prior to injecting the overmoulding resin or the precursor thereto, the method further comprises introducing a fibreglass reinforcing layer over the first surface of the substrate. The fibreglass reinforcing layer is any suitable fibreglass reinforcing layer. For example, it would be appreciated by the person skilled in the art that the reinforcing layer advantageously has a reflective index about the same as the overmoulding resin. In an embodiment, the fibreglass reinforcing layer is introduced via a pre-impregnated tape or a co-mingled woven fabric. In embodiments wherein the overmoulding resin is a thermoset resin, the fibreglass reinforcing layer may additionally be introduced via a dry fabric, which is saturated during injecting. In an embodiment, the fibreglass reinforcing layer is introduced by a method comprising applying a splatter coat of an ultra-violet curable adhesive between the fibreglass reinforcing layer and the substrate, vacuum bag forming the fibreglass reinforcing layer on the substrate, and ultra-violet curing of the adhesive. It will be appreciated by the person skilled in the art that such a method can keep the fibreglass reinforcing layer in the correct position during injection of the overmoulding resin or the precursor thereto, minimizing movement inside the part. In an embodiment, the ultra-violet adhesive is cured through the fibreglass reinforcing layer and vacuum bag using a high energy ultra-violet system. Any suitable adhesive and system may be used. For example, Fusion UV V Bulbs may be used to achieve a suitable cure through the two materials.

In some embodiments, prior to depositing the conductive trace ink, the method further comprises depositing one or more decorative inks on the first surface of the substrate. The one or more decorative inks are any suitable decorative ink and are deposited on the substrate by any suitable means, the selection of which can be made by the person skilled in the art. For example, it would be appreciated by the skilled person that in embodiments of the methods of the present application which comprise thermoforming, the decorative ink is cured prior to thermoforming to drive off solvents.

In some embodiments, prior to depositing the conductive trace ink or subsequent to depositing the conductive trace ink and prior to curing the non-conductive trace or optionally forming (e.g. thermoforming) the substrate, the method further comprises depositing a dielectric ink on the first surface of the substrate. The dielectric ink is any suitable dielectric ink and is deposited on the substrate by any suitable means, the selection of which can be made by the person skilled in the art. For example, it would be appreciated by the skilled person that in embodiments of the methods of the present application which comprise thermoforming, the dielectric ink is cured prior to thermoforming.

In some embodiments of the present application, the method comprises repeating the deposition of the conductive trace ink on the substrate to obtain multiple layers of conductive traces.

In some embodiments, subsequent to forming (e.g. thermoforming) the substrate, the method further comprises applying an ultra-violet curable hard coat to a second surface of the substrate. The ultra-violet curable hard coat is any suitable ultra-violet curable hard coat and is applied using any suitable means, the selection of which can be made by the person skilled in the art.

In some embodiments, the overmoulding resin is a thermoplastic resin. It will be appreciated by a person skilled in the art that a thermoplastic resin softens when heated and hardens when cooled. Accordingly, in embodiments of the methods for manufacturing an overmoulded printed electronic part which comprise the use of thermoplastic resin foams, subsequent to injection the thermoplastic resin foam is cooled under conditions suitable to obtain the overmoulded printed electronic part. The thermoplastic resin is any suitable thermoplastic resin.

In some embodiments, the precursor to the overmoulding resin is a precursor to a thermoset resin. In embodiments of the methods for manufacturing an overmoulded printed electronic part which comprise the use of precursors to thermoset resin foams, subsequent to injection the thermoset resin precursor foams are cured under conditions suitable to obtain the overmoulded printed electronic part. The precursor to the thermoset resin is any suitable precursor to a thermoset resin. In an embodiment, the precursor to the thermoset resin is a precursor to any suitable polyurethane thermoset resin. In another embodiment, the polyurethane resin is a clear aliphatic polyurethane thermoset resin. In a further embodiment, the precursor comprises an isocyanate, a polyol and a catalyst.

In some embodiments, the overmoulding resin or the precursor thereto is injected in combination with glass microspheres. The glass microspheres are any suitable glass microspheres. In an embodiment, the glass microspheres comprise, consist essentially of or consist of soda lime-borosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

The conditions to obtain the foamed overmoulded resin or foamed precursor thereto, are any suitable conditions, the selection of which can be readily made by the person skilled in the art. In some embodiments, the conditions to obtain a foam comprise introducing a blowing agent into the overmoulding resin or the precursor thereto which will produce a microcellular morphology in the hardened or cured overmoulded resin. The blowing agent is any suitable blowing agent. In some embodiments, the blowing agent is azodicarbonamide (ADCA) or sodium bicarbonate.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the method is for manufacturing an overmoulded printed electronic part for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the method is for manufacturing an overmoulded printed electronic part for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate comprises polycarbonate.

In some embodiments, the overmoulded printed electronic part is single-sided. In some embodiments, the overmoulded printed electronic part is double-sided. The person skilled in the art could readily adapt the methods for manufacturing an overmoulded printed electronic part having a single side or a double side with reference to the disclosure of the present application.

The present application also includes a method for manufacturing an overmoulded printed electronic part, the method comprising:
- depositing a conductive trace ink on a substrate to form a non-conductive trace of the ink on a first surface of the substrate;
- curing the non-conductive trace of the ink on the substrate to form a conductive trace on the first surface of the substrate;
- introducing a fibreglass reinforcing layer over the first surface of the substrate;
- injecting an overmoulding resin or a precursor thereto over the fibreglass reinforcing layer; and
- hardening the overmoulding resin or curing the precursor thereto to obtain the overmoulded printed electronic part.

The conductive trace ink is deposited on the substrate by any suitable method to form a non-conductive trace of the ink on the first surface of the substrate. In an embodiment, the conductive trace ink is printed on the substrate. In another embodiment, the printing comprises screen printing, inkjet printing, flexography printing, gravure printing, offset printing, airbrushing, aerosol printing, typesetting or stamping. In another embodiment of the present application, the conductive trace ink is deposited by screen printing.

The conductive trace ink is any suitable ink that upon curing forms a conductive trace on the first surface of the substrate. In an embodiment, the conductive trace ink is a molecular ink or a nanoparticle ink (e.g. a silver flake ink). In an embodiment, the conductive trace ink is a molecular ink. In an embodiment, the molecular ink is a low temperature molecular ink or a high temperature molecular ink. The conditions for curing the non-conductive trace of the ink on the substrate to form the conductive trace will depend on the selection of the conductive trace ink. In an embodiment, the conductive trace ink is a low temperature molecular ink and the curing comprises sintering. The conditions for sintering are any suitable conditions and are selected from any suitable embodiments for sintering a low temperature molecular ink described herein. In another embodiment, sintering of the low temperature molecular ink comprises photonic sintering. In an embodiment, the conductive trace ink is a high temperature molecular ink and the curing comprises sintering. The conditions for sintering are any suitable conditions and are selected, for example, from any suitable conditions for sintering a high temperature molecular ink described in PCT Application Publication No. WO 2015/192248. In another embodiment, sintering of the high temperature molecular ink comprises photonic sintering. In an embodiment, the conductive trace ink is a nanoparticle ink (e.g. a silver flake ink) and the curing comprises sintering. The conditions for sintering the nanoparticle ink (e.g. the silver flake ink) are any suitable conditions and can be readily selected by the person skilled in the art from known methods. In another embodiment, the nanoparticle ink (e.g. the silver flake ink) is sintered by a method comprising heating.

In some embodiments, subsequent to depositing a conductive trace ink and prior to curing the non-conductive trace, the method further comprises forming the substrate to obtain a shaped substrate. In some embodiments, prior to introducing the fibreglass reinforcing layer, the method further comprises forming the substrate to obtain the shaped substrate. Forming the substrate to obtain the shaped substrate can comprise any suitable means, the selection of which can be chosen by a person skilled in the art. In an embodiment, the substrate is formed into the shaped substrate by a method comprising thermoforming, cold forming, extrusion or blow moulding. In another embodiment, the substrate is formed into the shaped substrate by a method comprising thermoforming. Accordingly, in some embodiments, subsequent to depositing a conductive trace ink and prior to curing the non-conductive trace, the method further comprises thermoforming the substrate to obtain a shaped substrate. Accordingly, in some embodiments, subsequent to introducing the fibreglass reinforcing layer and prior to injecting the overmoulding resin or precursor thereto, the method further comprises thermoforming the substrate to obtain a shaped substrate.

In some embodiments, prior to forming (e.g. thermoforming) the substrate, the method further comprises coupling one or more electronic components to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In an embodiment, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

The fibreglass reinforcing layer is any suitable fibreglass reinforcing layer. For example, it would be appreciated by the person skilled in the art that the reinforcing layer advantageously has a reflective index about the same as the overmoulding resin. In an embodiment, the fibreglass reinforcing layer is introduced via a pre-impregnated tape or a co-mingled woven fabric. In embodiments wherein the overmoulding resin is a thermoset resin, the fibreglass reinforcing layer may additionally be introduced via a dry fabric, which is saturated during injecting. In an embodiment, the fibreglass reinforcing layer is introduced by a method comprising applying a splatter coat of an ultra-violet curable adhesive between the fibreglass reinforcing layer and the substrate, vacuum bag forming the fibreglass reinforcing layer on the substrate, and ultra-violet curing of the adhesive. It will be appreciated by the person skilled in the art that such a method can keep the fibreglass reinforcing layer in the correct position during injection of the overmoulding resin or the precursor thereto, minimizing movement inside the part. In an embodiment, the ultra-violet adhesive is cured through the fibreglass reinforcing layer and vacuum bag using a high energy ultra-violet system. Any suitable adhesive and system may be used. For example, Fusion UV V Bulbs may be used to achieve a suitable cure through the two materials.

In some embodiments, prior to depositing the conductive trace ink, the method further comprises depositing one or more decorative inks on the first surface of the substrate. The one or more decorative inks are any suitable decorative ink and are deposited on the substrate by any suitable means, the selection of which can be made by the person skilled in the art. For example, it would be appreciated by the skilled person that in embodiments of the methods of the present application which comprise thermoforming, the decorative ink is cured prior to thermoforming to drive off solvents.

In some embodiments, prior to depositing the conductive trace ink or subsequent to depositing the conductive trace ink and prior to curing the non-conductive trace or optionally forming (e.g. thermoforming) the substrate, the method further comprises depositing a dielectric ink on the first surface of the substrate. The dielectric ink is any suitable dielectric ink and is deposited on the substrate by any suitable means, the selection of which can be made by the person skilled in the art. For example, it would be appreciated by the skilled person that in embodiments of the methods of the present application which comprise thermoforming, the dielectric ink is cured prior to thermoforming.

In some embodiments of the present application, the method comprises repeating the deposition of the conductive trace ink on the substrate to obtain multiple layers of conductive traces.

In some embodiments, subsequent to forming (e.g. thermoforming) the substrate, the method further comprises applying an ultra-violet curable hard coat to a second surface of the substrate. The ultra-violet curable hard coat is any suitable ultra-violet curable hard coat and is applied using any suitable means, the selection of which can be made by the person skilled in the art.

In some embodiments, the overmoulding resin is a thermoplastic resin. It will be appreciated by a person skilled in the art that a thermoplastic resin softens when heated and hardens when cooled. Accordingly, in embodiments of the methods for manufacturing an overmoulded printed electronic part which comprise the use of thermoplastic resins, subsequent to injection the thermoplastic resin is cooled under conditions suitable to obtain the overmoulded printed electronic part. The thermoplastic resin is any suitable thermoplastic resin.

In some embodiments, the precursor to the overmoulding resin is a precursor to a thermoset resin. In embodiments of the methods for manufacturing an overmoulded printed electronic part which comprise the use of precursors to thermoset resins, subsequent to injection the thermoset resin precursors are cured under conditions suitable to obtain the overmoulded printed electronic part. The precursor to the thermoset resin is any suitable precursor to a thermoset resin. In an embodiment, the precursor to the thermoset resin is a precursor to any suitable polyurethane thermoset resin. In another embodiment, the polyurethane resin is a clear aliphatic polyurethane thermoset resin. In a further embodiment, the precursor comprises an isocyanate, a polyol and a catalyst.

In some embodiments, the overmoulding resin or the precursor thereto is injected in combination with glass microspheres. The glass microspheres are any suitable glass microspheres. In an embodiment, the glass microspheres comprise, consist essentially of or consist of soda limeborosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

In some embodiments, the precursor to the thermoset resin is injected under conditions to obtain a foam. The selection of suitable conditions to obtain a foam can be readily made by the person skilled in the art. In some embodiments, the conditions to obtain a foam comprise introducing a blowing agent into the overmoulding resin or the precursor thereto which will produce a microcellular morphology in the hardened or cured overmoulded resin. The blowing agent is any suitable blowing agent. In some embodiments, the blowing agent is azodicarbonamide (ADCA) or sodium bicarbonate.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the method is for manufacturing an overmoulded printed electronic part for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the method is for manufacturing an overmoulded printed electronic part for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate comprises polycarbonate.

In some embodiments, the overmoulded printed electronic part is single-sided. In some embodiments, the overmoulded printed electronic part is double-sided. The person skilled in the art could readily adapt the methods for manufacturing an overmoulded printed electronic part having a single side or a double side with reference to the disclosure of the present application.

In the methods for manufacturing an overmoulded printed electronic part of the present application, the injecting is carried out by any suitable means, the selection of which can be made by the person skilled in the art. It will be appreciated by the skilled person that objects to be overmoulded are placed into suitable moulds then the overmoulding resin or precursor thereto, as the case may be is injected over the surface of the object that is to be overmoulded. In some embodiments wherein the overmoulded resin is a thermoset resin, the precursors to the thermoset resin are injected by a method comprising reaction injection moulding (RIM). In an embodiment, the precursor to the thermoset resin is injected over the desired surface, then the mould gapped followed by flooding the surface or flooding the electronic part centrally located in the mould. In some embodiments of the present application, the injection comprises a two shot approach. In some embodiments, the injection comprises a one shot approach. The typical injection temperatures are significantly lower (e.g. about 60° C. compared to about 250° C. or greater) and injection pressures are significantly lower (e.g. about 150 psi compared to about 1500 psi or greater) for injection of thermoset resins such as polyurethanes resins in comparison to standard thermoplastic resins.

Conditions for cooling the overmoulded resins may depend, for example, on whether the resin is foamed or comprises glass microspheres embedded therein. In such embodiments, the reduction in thermal mass can reduce the cooling time for both thermoplastic and thermoset resins in comparison to a similar resin that is not foamed and does not comprise glass microspheres embedded therein. Cooling time may also depend on the type of resin. For example, parts made using thermoset resins such as aliphatic polyurethane resins will cool to room temperature faster than those made using thermoplastic resins, however the polymerization (curing) time may be slower.

In the methods for manufacturing an overmoulded printed electronic part which comprise the use of a molecular ink, the molecular ink is any suitable molecular ink.

In the methods for manufacturing an overmoulded printed electronic part which comprise the use of a low temperature molecular ink, the low temperature molecular ink is any suitable low temperature molecular ink.

In some embodiments of the present application, the low temperature molecular ink comprises copper cations. For example, copper-based low temperature molecular inks are described in PCT Application Nos. WO 2016/197234 and WO 2018/018136.

In some embodiments of the present application, the low temperature molecular ink comprises silver cations as disclosed in WO 2018/146616. For example, the low temperature molecular inks suitable for methods of the present application comprising sintering the non-conductive trace of the ink on the substrate to form a conductive silver trace on the first surface of the substrate comprise silver cations.

In some embodiments of the present application, the low temperature molecular ink comprises: a silver carboxylate; an organic amine compound; an organic polymer binder; a surface tension modifier; and a solvent The silver carboxylate is any suitable silver carboxylate. The term "silver carboxylate" as used herein refers to an organic silver salt comprising a silver ion and an organic group containing a carboxylate moiety. In an embodiment, the organic group containing the carboxylate comprises from 1 to 20 carbon atoms. In another embodiment, the carboxylate is a $C_1$-20 alkanoate; i.e. the silver carboxylate is a silver salt of a $C_1$-20 alkanoic acid. In an embodiment, the silver carboxylate is selected from silver formate, silver acetate, silver oxalate, silver propionate, silver butanoate, silver ethylhexanoate, silver neodecanoate, silver pentafluoropropionate, silver citrate, silver glycolate, silver lactate, silver benzoate or a derivative thereof, silver trifluoroacetate, silver phenylacetate or a derivative thereof, silver hexafluoroacetyl-acetonate, silver isobutyrylacetate, silver benzoylacetate, silver propionylacetate, silver acetoacetate, silver alpha-methylacetoacetate, silver alpha-ethylacetoacetate and mixtures thereof. In an embodiment, the silver carboxylate is silver oxalate. One or more than one silver carboxylate may be in the ink. The silver carboxylate is preferably dispersed in the ink. In an embodiment, the ink does not contain flakes of silver-containing material.

The silver carboxylate is present in the low temperature molecular ink in any suitable amount. In an embodiment, the silver carboxylate is present in a range of about 5 wt % to about 75 wt %, based on total weight of the low temperature molecular ink. In another embodiment, the amount is in a range of about 5 wt % to about 60 wt %, or about 5 wt % to about 50 wt %, or about 10 wt % to about 75 wt %, or about 10 wt % to about 60 wt %, or about 10 wt % to about 45 wt %, or about 25 wt % to about 40 wt %, based on total weight of the low temperature molecular ink. In another embodiment, the silver carboxylate is present in an amount of about 10 wt % to about 60 wt %, based on total weight of the low temperature molecular ink. In a further embodiment, the amount is in a range of about 30 wt % to about 35 wt %, based on total weight of the low temperature molecular ink. In terms of silver content, in an embodiment, silver itself is present in a range of about 3 wt % to about 30 wt %, based on total weight of the low temperature molecular ink. In another embodiment, the amount is in a range of about 6 wt % to about 30 wt %, or about 15 wt % to about 25 wt %, based on total weight of the low temperature molecular ink. In another embodiment of the present application, the amount is in a range of about 18 wt % to about 24 wt %, based on total weight of the low temperature molecular ink.

The organic amine compound is any suitable organic amine compound. Organic amine compounds may be aliphatic and/or aromatic amines, for example $C_{1-20}$ alkyl amines and/or $C_{6-20}$ aryl amines. In some embodiments, the organic amine compound is substituted with one or more other functional groups. In an embodiment, the other functional groups are polar functional groups. In another embodiment, the other functional groups are selected from —OH, —SH, =O, —CHO, —COOH and halogen (e.g. F, Cl, or Br). In an embodiment, the other functional group is —OH. In an embodiment, the organic amine compound is an amino alcohol. In another embodiment, the amino alcohol is a hydroxyalkylamine. In a further embodiment, the hydroxyalkylamine comprises from 2 to 8 carbon atoms. In an embodiment, the hydroxyalkylamine is selected from 1,2-ethanolamine, amino-2-propanol, 1,3-propanolamine, 1,4-butanolamine, 2-(butylamino)ethanol, 2-amino-1-butanol and mixtures thereof. In an embodiment, the organic amine is amino-2-propanol. One or more than one organic amine compound may be in the low temperature molecular ink. In another embodiment of the present application, the organic amine compound is a mixture of amino-2-propanol and 2-amino-1-butanol.

The organic amine is present in the low temperature molecular ink in any suitable amount. In an embodiment, the organic amine is present in the low temperature molecular ink in a range of about 10 wt % to about 75 wt %, based on total weight of the low temperature molecular ink. In another embodiment, the amount is in a range of about 20 wt % to about 60 wt %, or about 25 wt % to about 55 wt %, based on total weight of the low temperature molecular ink. In a further embodiment, the amount is in a range of about 40 wt % to about 50 wt %, based on total weight of the low temperature molecular ink.

The silver carboxylate and organic amine compound can form a complex in the low temperature molecular ink. In an embodiment, the complex comprises a molar ratio of silver carboxylate to organic amine compound of 1:1 to 1:4, for example 1:1 or 1:2 or 1:3 or 1:4. Complexes of and interactions between the silver carboxylate and organic amine can provide silver metal precursors that may be formulated with other components as a low temperature molecular ink.

The organic polymer binder is any suitable polymer. In an embodiment, the organic polymer binder is a thermoplastic or elastomeric polymer. The organic polymer binder is advantageously compatible with the organic amine compound, so that a mixture of the organic amine compound in the organic polymer binder does not lead to significant phase separation. In an embodiment, the organic polymer binder is selected from cellulosic polymers, polyacrylates, polystyrenes, polyolefins, polyvinyl acetals, polyesters, polyimides, polyols, polyurethanes, fluoropolymers, fluoroelastomers and mixtures thereof. In an embodiment, the organic polymer binder is a homopolymer, a copolymer or mixtures thereof. In another embodiment, the organic polymer binder is a cellulosic polymer. In a further embodiment, the cellulosic polymer is selected from methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose and a mixture thereof. In another embodiment, the organic polymer binder is hydroxyethyl cellulose.

The organic polymer binder is present in the low temperature molecular ink in any suitable amount. In an embodiment, the organic polymer binder is present in the low temperature molecular in a range of about 0.05 wt % to about 10 wt %, based on total weight of the low temperature molecular ink. In another embodiment, the amount is in a range of about 0.1 wt % to about 5 wt %, or about 0.2 wt % to about 2 wt %, or about 0.2 wt % to about 1 wt %, based on total weight of the low temperature molecular ink. In a further embodiment, the organic polymer binder is present in an amount of about 0.1 wt % to about 5 wt %, based on total weight of the low temperature molecular ink. In another embodiment of the present application, the amount is in a range of about 0.3 wt % to about 0.95 wt %, based on total weight of the low temperature molecular ink.

Without a surface tension modifier, shape retention of traces produced from the low temperature molecular ink may be poorer than those produced from a comparable ink with the surface tension modifier, particularly in humid environments, resulting in nonuniform features. The surface tension modifier is any suitable additive that improves flow and leveling properties of the ink. In an embodiment, the surface tension modifier is selected from surfactants (e.g. cationic, nonionic or anionic surfactants), alcohols (e.g. propanol), glycolic acid, lactic acid and mixtures thereof. In another embodiment, the surface tension modifier is glycolic acid or lactic acid. In a further embodiment, the surface tension modifier is lactic acid.

The surface tension modifier is present in the low temperature molecular ink in any suitable amount. In an embodiment, the surface tension modifier is present in the low temperature molecular ink in a range of about 0.1 wt % to about 5 wt %, based on total weight of the low temperature molecular ink. In another embodiment, the amount is in a range of about 0.5 wt % to about 4 wt %, or about 0.8 wt % to about 3 wt %, based on total weight of the low temperature molecular ink. In another embodiment, the surface tension modifier is present in an amount of about 0.5 wt % to about 4 wt %, based on total weight of the low temperature molecular ink. In a further embodiment of the present application, the amount is in a range of about 1 wt % to about 2.7 wt %, based on total weight of the low temperature molecular ink.

The solvent is any suitable aqueous or organic solvent. In an embodiment, the solvent is an organic solvent or a mixture of organic solvents. In some embodiments, the solvent is a mixture of one or more organic solvents with an aqueous solvent. The solvent is advantageously compatible with one or both of the organic amine compound or organic polymer binder. The solvent is advantageously compatible with both the organic amine compound and the organic polymer binder. In an embodiment, the organic amine compound and/or organic polymer binder are dispersible, for example soluble, in the solvent. In an embodiment, the organic solvent is an aromatic, non-aromatic or a mixture of aromatic and non-aromatic solvents. In another embodiment, the aromatic solvent is selected from benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene and mixtures thereof. In another embodiment, the non-aromatic solvent is selected from terpenes, glycol ethers (e.g. dipropylene glycol methyl ether, methylcarbitol, ethylcarbitol, butylcarbitol, triethyleneglycol and derivatives thereof), alcohols (e.g. methylcyclohexanols, octanols, heptanols, isopropanol) and mixtures thereof. In another embodiment of the present application, the solvent is propylene glycol methyl ether.

The solvent is present in the low temperature molecular ink in any suitable amount. In an embodiment, the solvent is present in the low temperature molecular ink, in a range of about 1 wt % to about 50 wt %, based on total weight of the low temperature molecular ink. In an embodiment, the solvent is present in an amount to provide weight balance of the low temperature molecular ink. In another embodiment, the amount is in a range of about 2 wt % to about 35 wt %, or about 5 wt % to about 25 wt %, based on the total weight of the low temperature molecular ink. In another embodiment, the amount is in a range of about 10 wt % to about 20 wt %, based on the total weight of the low temperature molecular ink.

In some embodiments, the low temperature molecular ink further comprises a defoaming agent. The defoaming agent is any suitable anti-foaming additive. In an embodiment, the defoaming agent is selected from fluorosilicones, mineral oils, vegetable oils, polysiloxanes, ester waxes, fatty alcohols, glycerol, stearates, silicones, polypropylene based polyethers and mixtures thereof. In another embodiment, the defoaming agent is selected from glycerol and polypropylene based polyethers. In a further embodiment, the defoaming agent is glycerol. In the absence of the defoaming agent, some printed traces may tend to retain air bubbles following printing, resulting in nonuniform traces.

The defoaming agent is present in the low temperature molecular ink in any suitable amount. In an embodiment, the defoaming agent is present in the low temperature molecular ink in a range of about 0.0001 wt % to about 1 wt %, based on total weight of the low temperature molecular ink. In another embodiment, the amount is in a range of about 0.001 wt % to about 0.1 wt %, or about 0.002 wt % to about 0.05 wt %, based on total weight of the low temperature molecular ink. In a further embodiment, the amount is in a range of about 0.005 wt % to about 0.01 wt %, based on total weight of the low temperature molecular ink. In an alternative embodiment, the defoaming agent is present in an amount of about 0.5 wt % to about 8 wt %, based on total weight of the low temperature molecular ink.

In some embodiments, the low temperature molecular ink further comprises a thixotropy modifying agent. The thixotropy modifying agent is any suitable thixotropy-modifying additive. In an embodiment, the thixotropy modifying agent is selected from polyhydroxycarboxylic acid amides, polyurethanes, acrylic polymers, latex, polyvinylalcohol, styrene/butadiene, clay, clay derivatives, sulfonates, guar, xanthan, cellulose, locust gum, acacia gum, saccharides, saccharide derivatives, cassein, collagen, modified castor oils, organosilicones and mixtures thereof. In another embodiment, the thixotropy modifying agent is a polyhydroxycarboxylic acid amide.

The thixotropy modifying agent is present in the low temperature molecular ink in any suitable amount. In another embodiment of the present application, the thixotropy modifying agent is present in the low temperature molecular ink in a range of about 0.05 wt % to about 1 wt %, based on total weight of the low temperature molecular ink. In another embodiment, the amount is in a range of about 0.1 wt % to about 0.8 wt %, based on total weight of the low temperature molecular ink. In a further embodiment, the amount is in a range of about 0.2 wt % to about 0.5 wt %, based on total weight of the low temperature molecular ink. In another embodiment of the present application, the thixotropy modifying agent is present in an amount of about 0.1 wt % to about 0.5 wt %, based on total weight of the low temperature molecular ink.

The relative amounts and/or specific compositions of the various components of the ink may have a useful role in optimizing performance of the ink. Varying the amounts and compositions of the components as described herein permit the person skilled in the art to tune the sintering temperature of the ink to accommodate substrates that are less robust to high temperatures, while maintaining high conductivity of conductive traces formed from the ink.

In the methods for manufacturing an overmoulded printed electronic part which comprise the use of a high temperature molecular ink, the high temperature molecular ink is any suitable high temperature molecular ink. In an embodiment, the high temperature molecular ink is any suitable high temperature molecular ink of PCT Application Publication No. WO 2015/192248.

In the methods for manufacturing an overmoulded printed electronic part which comprise the use of a nanoparticle ink (e.g. a silver flake ink), the nanoparticle ink (e.g. the silver flake ink) is any suitable nanoparticle ink (e.g. any suitable silver flake ink). Nanoparticle inks (e.g. silver flake inks) for printed electronic parts are commercially available and the selection of a suitable nanoparticle ink (e.g. a suitable silver flake ink) for the methods of the present application can be made by a person skilled in the art.

III. Overmoulded Printed Electronic Parts and Uses Thereof

The present application also includes an overmoulded printed electronic part comprising:
- a conductive silver trace coupled to a first surface of a substrate, the conductive silver trace manufactured from a low temperature molecular ink as defined in the embodiments of the present application; and
- a resin overmoulded over the conductive silver trace coupled to the first surface of the substrate.

In an embodiment, the substrate has been formed (e.g. thermoformed) into a three-dimensional shape.

In an embodiment, the overmoulded printed electronic part further comprises one or more electronic components coupled to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In another embodiment of the present application, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In an embodiment, the overmoulded printed electronic part further comprises a fibreglass reinforcing layer over the first surface of the substrate. The fibreglass reinforcing layer is any suitable fibreglass reinforcing layer. In an embodiment, the reinforcing layer has a reflective index about the same as the overmoulded resin. In another embodiment, the fibreglass reinforcing layer comprises a pre-impregnated tape or a co-mingled woven fabric. In embodiments wherein the overmoulded resin is a thermoset resin, the fibreglass reinforcing layer may additionally comprise a dry fabric, which is saturated during injecting.

In an embodiment, the overmoulded printed electronic part further comprises one or more decorative ink layers on the first surface of the substrate. The one or more decorative ink layers are manufactured from any suitable decorative ink, the selection of which can be made by a person skilled in the art.

In an embodiment, the overmoulded printed electronic part further comprises a dielectric ink layer on the first surface of the substrate. The dielectric ink layer is manufactured from any suitable dielectric ink, the selection of which can be made by a person skilled in the art.

In an embodiment, the overmoulded printed electronic part further comprises an ultra-violet curable hard coat on a second surface of the substrate. The ultra-violet curable hard coat is any suitable ultra-violet curable hard coat, the selection of which can be made by the person skilled in the art.

In an embodiment, the overmoulded resin is a thermoplastic resin. The thermoplastic resin is any suitable thermoplastic resin.

In an embodiment, the overmoulded resin is a thermoset resin. The thermoset resin is any suitable thermoset resin. In an embodiment, the thermoset resin is a polyurethane thermoset resin. In another embodiment, the polyurethane resin is a clear aliphatic polyurethane thermoset resin.

In an embodiment, the overmoulded printed electronic part further comprises a plurality of glass microspheres embedded in the overmoulded resin. The glass microspheres are any suitable glass microspheres. In an embodiment, the glass microspheres comprise, consist essentially of or consist of soda lime-borosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

In an embodiment, the overmoulded resin is in the form of a foam.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the overmoulded printed electronic part is for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the overmoulded printed electronic part is for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate is polycarbonate.

In an embodiment, the overmoulded printed electronic part is single-sided. In an alternative embodiment of the present application, the overmoulded printed electronic part is double-sided.

The present application also includes an overmoulded printed electronic part comprising:
 a conductive trace coupled to a first surface of a substrate; and
 a thermoset resin overmoulded over the conductive trace coupled to the first surface of the substrate.

The conductive trace is manufactured from any suitable ink that upon curing forms a conductive trace on the first surface of the substrate. In an embodiment, the conductive trace is manufactured from a molecular ink or a nanoparticle ink (e.g. a silver flake ink). In an embodiment, the conductive trace is manufactured from a molecular ink. In another embodiment, the molecular ink is a low temperature molecular ink or a high temperature molecular ink. In a further embodiment, the conductive trace is a conductive silver trace manufactured from a low temperature molecular ink as described in the embodiments herein in respect to the methods of the present application.

In an embodiment, the substrate has been formed (e.g. thermoformed) into a three-dimensional shape.

In an embodiment, the overmoulded printed electronic part further comprises one or more electronic components coupled to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In another embodiment of the present application, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In an embodiment, the overmoulded printed electronic part further comprises a fibreglass reinforcing layer over the first surface of the substrate. The fibreglass reinforcing layer is any suitable fibreglass reinforcing layer. In an embodiment, the reinforcing layer has a reflective index about the same as the thermoset resin. In another embodiment, the fibreglass reinforcing layer comprises a pre-impregnated tape, a co-mingled woven fabric or a dry fabric.

In an embodiment, the overmoulded printed electronic part further comprises one or more decorative ink layers on the first surface of the substrate. The one or more decorative ink layers are manufactured from any suitable decorative ink, the selection of which can be made by a person skilled in the art.

In an embodiment, the overmoulded printed electronic part further comprises a dielectric ink layer on the first surface of the substrate. The dielectric ink layer is manufactured from any suitable dielectric ink, the selection of which can be made by a person skilled in the art.

In an embodiment, the overmoulded printed electronic part further comprises an ultra-violet curable hard coat on a second surface of the substrate. The ultra-violet curable hard coat is any suitable ultra-violet curable hard coat, the selection of which can be made by the person skilled in the art.

The thermoset resin is any suitable thermoset resin. In an embodiment, the thermoset resin is a polyurethane resin. In another embodiment, the polyurethane resin is a clear aliphatic polyurethane thermoset resin.

In an embodiment, the overmoulded printed electronic part further comprises a plurality of glass microspheres embedded in the thermoset resin. The glass microspheres are any suitable glass microspheres. In an embodiment, the glass microspheres comprise, consist essentially of or consist of soda lime-borosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

In an embodiment, the thermoset resin is in the form of a foam.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the overmoulded printed electronic part is for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the overmoulded printed electronic part is for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate is polycarbonate.

In an embodiment, the overmoulded printed electronic part is single-sided. In an alternative embodiment of the present application, the overmoulded printed electronic part is double-sided.

The present application also includes an overmoulded printed electronic part comprising:
 a conductive trace coupled to a first surface of a substrate; and
 a resin comprising a plurality of glass microspheres embedded therein overmoulded over the conductive trace coupled to the first surface of the substrate.

The conductive trace is manufactured from any suitable ink that upon curing forms a conductive trace on the first surface of the substrate. In an embodiment, the conductive trace is manufactured from a molecular ink or a nanoparticle ink (e.g. a silver flake ink). In an embodiment, the conductive trace is manufactured from a molecular ink. In another embodiment, the molecular ink is a low temperature molecular ink or a high temperature molecular ink. In a further embodiment, the conductive trace is a conductive silver trace manufactured from a low temperature molecular ink as described in the embodiments herein in respect to the methods of the present application.

In an embodiment, the substrate has been formed (e.g. thermoformed) into a three-dimensional shape.

In an embodiment, the overmoulded printed electronic part further comprises one or more electronic components coupled to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In another embodiment of the present application, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In an embodiment, the overmoulded printed electronic part further comprises a fibreglass reinforcing layer over the first surface of the substrate. The fibreglass reinforcing layer is any suitable fibreglass reinforcing layer. In an embodiment, the reinforcing layer has a reflective index about the same as the resin. In another embodiment, the fibreglass reinforcing layer comprises a pre-impregnated tape or a co-mingled woven fabric. In embodiments wherein the resin is a thermoset resin, the fibreglass reinforcing layer may additionally comprise a dry fabric.

In an embodiment, the overmoulded printed electronic part further comprises one or more decorative ink layers on the first surface of the substrate. The one or more decorative ink layers are manufactured from any suitable decorative ink, the selection of which can be made by a person skilled in the art.

In an embodiment, the overmoulded printed electronic part further comprises a dielectric ink layer on the first surface of the substrate. The dielectric ink layer is manufactured from any suitable dielectric ink, the selection of which can be made by a person skilled in the art.

In an embodiment, the overmoulded printed electronic part further comprises an ultra-violet curable hard coat on a second surface of the substrate. The ultra-violet curable hard coat is any suitable ultra-violet curable hard coat, the selection of which can be made by the person skilled in the art.

In an embodiment, the overmoulded resin is a thermoplastic resin. The thermoplastic resin is any suitable thermoplastic resin.

In an embodiment, the overmoulded resin is a thermoset resin. The thermoset resin is any suitable thermoset resin. In an embodiment, the thermoset resin is a polyurethane thermoset resin. In another embodiment, the polyurethane resin is a clear aliphatic polyurethane thermoset resin.

The glass microspheres are any suitable glass microspheres. In an embodiment, the glass microspheres comprise, consist essentially of or consist of soda lime-borosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the overmoulded printed electronic part is for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the overmoulded printed electronic part is for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate is polycarbonate.

In an embodiment, the overmoulded printed electronic part is single-sided. In an alternative embodiment of the present application, the overmoulded printed electronic part is double-sided.

The present application also includes an overmoulded printed electronic part comprising:
  a conductive trace coupled to a first surface of a substrate; and
  a foamed resin overmoulded over the conductive trace coupled to the first surface of the substrate.

The conductive trace is manufactured from any suitable ink that upon curing forms a conductive trace on the first surface of the substrate. In an embodiment, the conductive trace is manufactured from a molecular ink or a nanoparticle ink (e.g. a silver flake ink). In an embodiment, the conductive trace is manufactured from a molecular ink. In another embodiment, the molecular ink is a low temperature molecular ink or a high temperature molecular ink. In a further embodiment, the conductive trace is a conductive silver trace manufactured from a low temperature molecular ink as described in the embodiments herein in respect to the methods of the present application.

In an embodiment, the substrate has been formed (e.g. thermoformed) into a three-dimensional shape.

In an embodiment, the overmoulded printed electronic part further comprises one or more electronic components coupled to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In another embodiment of the present application, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

In an embodiment, the overmoulded printed electronic part further comprises a fibreglass reinforcing layer over the first surface of the substrate. The fibreglass reinforcing layer is any suitable fibreglass reinforcing layer. In an embodiment, the reinforcing layer has a reflective index about the same as the resin. In another embodiment, the fibreglass reinforcing layer comprises a pre-impregnated tape or a co-mingled woven fabric. In embodiments wherein the resin is a thermoset resin, the fibreglass reinforcing layer may additionally comprise a dry fabric.

In an embodiment, the overmoulded printed electronic part further comprises one or more decorative ink layers on the first surface of the substrate. The one or more decorative ink layers are manufactured from any suitable decorative ink, the selection of which can be made by a person skilled in the art.

In an embodiment, the overmoulded printed electronic part further comprises a dielectric ink layer on the first surface of the substrate. The dielectric ink layer is manufactured from any suitable dielectric ink, the selection of which can be made by a person skilled in the art.

In an embodiment, the overmoulded printed electronic part further comprises an ultra-violet curable hard coat on a second surface of the substrate. The ultra-violet curable hard coat is any suitable ultra-violet curable hard coat, the selection of which can be made by the person skilled in the art.

In an embodiment, the foamed resin is a foamed thermoplastic resin. The foamed thermoplastic resin is any suitable foamed thermoplastic resin.

In an embodiment, the foamed resin is a foamed thermoset resin. In another embodiment, the foamed thermoset resin is a foamed polyurethane thermoset resin. In a further embodiment, the foamed polyurethane resin is a foamed clear aliphatic polyurethane thermoset resin.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the overmoulded printed electronic part is for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the overmoulded printed electronic part is for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate is polycarbonate.

In an embodiment, the overmoulded printed electronic part is single-sided. In an alternative embodiment of the present application, the overmoulded printed electronic part is double-sided.

The present application also includes an overmoulded printed electronic part comprising:
a conductive trace coupled to a first surface of a substrate;
a fibreglass reinforcing layer over the conductive trace coupled to the first surface of the substrate; and
a resin overmoulded over the fibreglass reinforcing layer.

The conductive trace is manufactured from any suitable ink that upon curing forms a conductive trace on the first surface of the substrate. In an embodiment, the conductive trace is manufactured from a molecular ink or a nanoparticle ink (e.g. a silver flake ink). In an embodiment, the conductive trace is manufactured from a molecular ink. In another embodiment, the molecular ink is a low temperature molecular ink or a high temperature molecular ink. In a further embodiment, the conductive trace is a conductive silver trace manufactured from a low temperature molecular ink as described in the embodiments herein in respect to the methods of the present application.

In an embodiment, the substrate has been formed (e.g. thermoformed) into a three-dimensional shape.

In an embodiment, the overmoulded printed electronic part further comprises one or more electronic components coupled to the first surface of the substrate. The one or more electronic components are coupled to the first surface of the substrate by any suitable means. In an embodiment, the one or more electronic components are coupled to the first surface of the substrate by a conductive adhesive. Any suitable conductive adhesive may be used, the selection of which can be made by a person skilled in the art. In another embodiment of the present application, the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

The fibreglass reinforcing layer is any suitable fibreglass reinforcing layer. In an embodiment, the reinforcing layer has a reflective index about the same as the overmoulded resin. In another embodiment, the fibreglass reinforcing layer comprises a pre-impregnated tape or a co-mingled woven fabric. In embodiments wherein the overmoulded resin is a thermoset resin, the fibreglass reinforcing layer may additionally comprise a dry fabric.

In an embodiment, the overmoulded printed electronic part further comprises one or more decorative ink layers on the first surface of the substrate. The one or more decorative ink layers are manufactured from any suitable decorative ink, the selection of which can be made by a person skilled in the art.

In an embodiment, the overmoulded printed electronic part further comprises a dielectric ink layer on the first surface of the substrate. The dielectric ink layer is manufactured from any suitable dielectric ink, the selection of which can be made by a person skilled in the art.

In an embodiment, the overmoulded printed electronic part further comprises an ultra-violet curable hard coat on a second surface of the substrate. The ultra-violet curable hard coat is any suitable ultra-violet curable hard coat, the selection of which can be made by the person skilled in the art.

In an embodiment, the overmoulded resin is a thermoplastic resin. The thermoplastic resin is any suitable thermoplastic resin.

In an embodiment, the overmoulded resin is a thermoset resin. The thermoset resin is any suitable thermoset resin. In an embodiment, the thermoset resin is a polyurethane thermoset resin. In another embodiment, the polyurethane resin is a clear aliphatic polyurethane thermoset resin.

In an embodiment, the overmoulded printed electronic part further comprises a plurality of glass microspheres embedded in the overmoulded resin. The glass microspheres are any suitable glass microspheres. In an embodiment, the glass microspheres comprise, consist essentially of or consist of soda lime-borosilicate glass. In another embodiment, the glass microspheres have an average diameter of 18 microns. In a further embodiment of the present application, the glass microspheres have a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

In an embodiment, the overmoulded resin is in the form of a foam.

The substrate is any suitable substrate with a printable surface. In an embodiment, the substrate comprises polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, or silicone membranes. In another embodiment, the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF). In an embodiment, the overmoulded printed electronic part is for low temperature applications and the substrate comprises polycarbonate, polycarbonate-acrylonitrile butadiene styrene (ABS) blends, acrylonitrile butadiene styrene (ABS) or thermoplastic olefins (TPO). In an embodiment, the overmoulded printed electronic part is for aerospace applications, and the substrate comprises polyphenylene sulfide (PPS), polybenzimidazole (PBI), polypropylene polybenzyl isocyanate (PPI), polyether ether ketone (PEEK) or polyvinylidene fluoride (PVDF). In a further embodiment, the substrate is polycarbonate.

In an embodiment, the overmoulded printed electronic part is single-sided. In an alternative embodiment of the present application, the overmoulded printed electronic part is double-sided.

In some embodiments, the overmoulded printed electronic parts of the present application are manufactured according to a method of manufacturing overmoulded printed electronic parts of the present application.

The overmoulded printed electronic parts of the present application may be used, for example in ground transportation applications and/or in the aerospace industry (for both interior and exterior components). Uses may also exist, for example, in the medical field as well as the consumer electronics area.

The following non-limiting examples are illustrative of the present application:

EXAMPLES

Example 1: Low Temperature Molecular Ink Formulation

Molecular inks that can be processed at low temperature were formulated in accordance with the compositions shown in Tables 1-6. A molecular ink that can be processed at low temperature with advantageous and more reliable printability (i.e. de-wetting and line uniformity improvements) was formulated in accordance with the composition shown in Table 7.

The ink is preferably used shortly after formulation, but may be stored for longer periods of time at a temperature in a range of about −4° C. to about 4° C. without significant decomposition. In addition, the ink can be recovered from the screen and reused for further printing provided it is stored in above mentioned temperature range.

Figure 2:
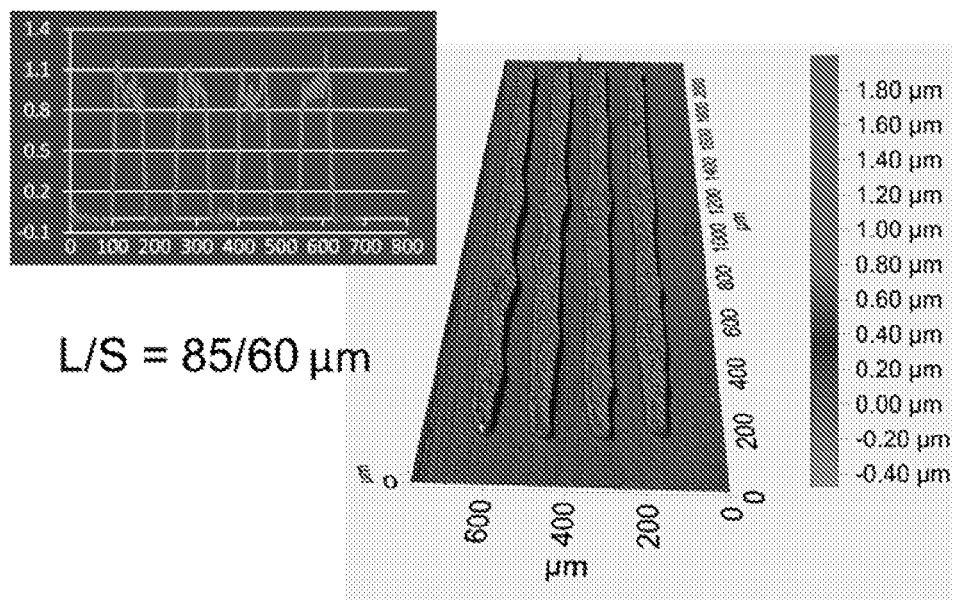
FIG. 2 depicts another three dimensional profilometer image of printed and sintered traces produced from the low temperature molecular ink (NRC-848A3a), and the resulting cross section that further highlights linewidth and line spacing (L/S) that can be achieved with the ink.

Example 2: Screen Printing the Low Temperature Inks to Produce Sub-100 μm Traces On a sheet of Melinex™ ST505, the ink NRC-848A3a was screen printed (stainless steel, mesh count/inch=400; emulsion thickness=22.5 μm) and thermally processed at 75° C. for 6 minutes and 120° C. for 20 minutes to produce several series of four parallel conductive silver traces having line widths of about 42 μm and line spacing of about 38 μm on the substrate, as shown in FIG. 1 and line widths of about 85 μm and line spacing of about 60 μm, as shown in FIG. 2. The pitch, defined as linewidth and line spacing (L/S), was measured to be 42/38, and 85/65 μm, respectively. 3-D profilometer images of the traces and the corresponding cross-sections measured by optical profilometry are provided in FIG. 1 and FIG. 2.

Figure 3:
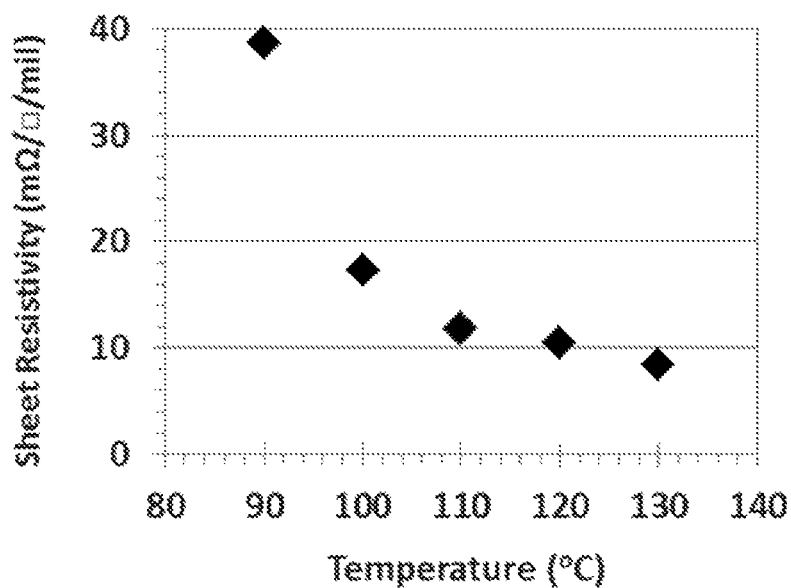
FIG. 3 depicts graphs of sheet resistivity (m$\Omega$/$\square$/mil) vs. temperature (° C.) for (1) conductive silver traces having linewidths of about 512 µm produced from another ink of the present application (NRC-849A1) processed at different temperatures (top); and (2) for conductive silver traces having linewidths of about 444 µm produced from another ink of the present application (NRC-850A) processed at different temperatures (bottom).
Figure 3:
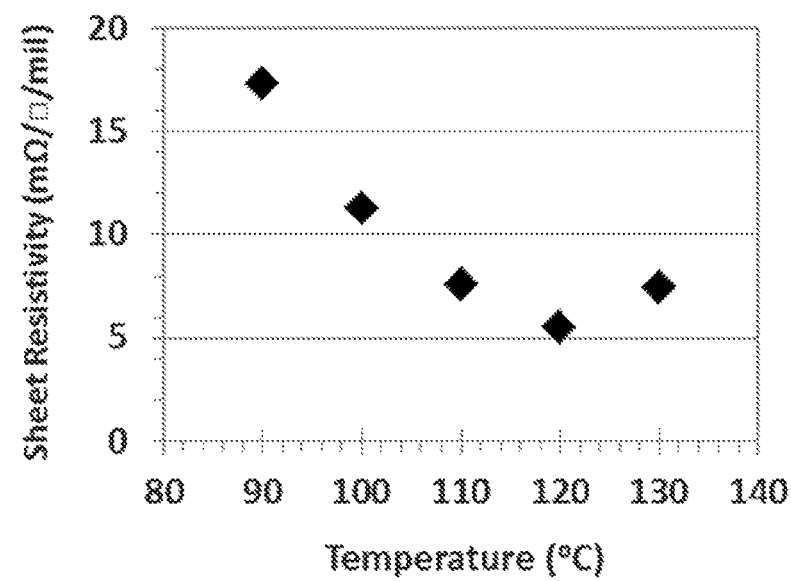

Example 3: Electrical Properties of the Low Temperature Ink Processed at Temperatures Compatible with Low Glass Transition Temperature Substrates Two inks (NRC-849A1 and NRC-850A) were screen printed on five separate samples of Melinex® ST505 substrate in a manner as described in Example 2. The traces on each substrate were thermally processed for 20 minutes at five different temperatures (91° C., 102° C., 111° C., 121° C. and 131° C.) to form conductive silver traces on each substrate. The sheet resistivity values for the conductive silver traces produced from NRC-849A1 and NRC-850A were calculated and the results are shown in the top and bottom graphs of FIG. 3, respectively. The results indicate that sheet resistivity values of less than about 40 mΩ/□/mil are obtainable at thermal processing temperatures as low as about 90° C. That the ink may be thermally processed at temperatures as low as about 90° C. while maintaining good to excellent electrical properties is conducive for using the ink to produce conductive silver traces on thermoformable substrates. Conductive traces can be produced at temperatures as low as 81° C. as well, though the sheet resistivity values are quite high (about 650 mΩ/□/mil).

As seen in Table 8, the ink (NRC-850A) may be screen printed and thermally processed at 120° C. to produce conductive silver traces having measured line widths as low as 2.8 mil (71 μm) and line thicknesses of about 0.9 μm or less, while maintaining sheet resistivity of less than about 20 mΩ/□/mil. Of particular note, the measured 5.5 mil (141 μm) to 18.9 mil (408 μm) traces have sheet resistivity values of about 10 mΩ/□/mil.

Example 4: Printability of Ink in High Humidity Environments

Figure 4:
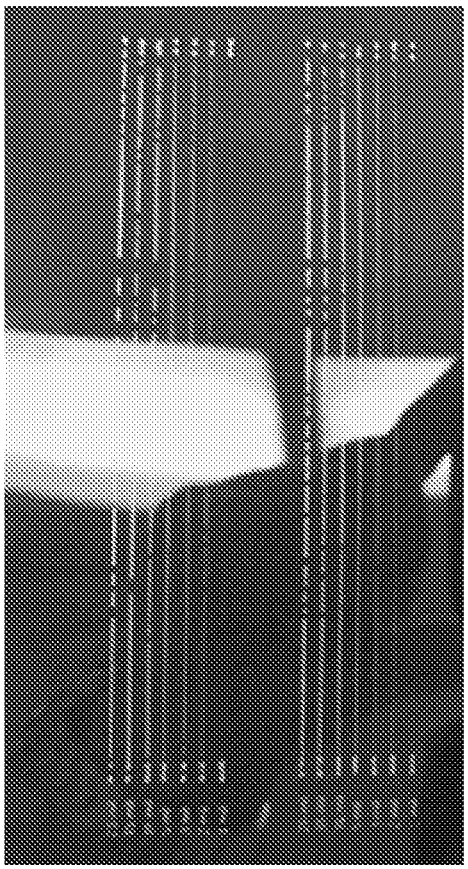
FIG. 4 depicts screen-printed traces produced from (1) ink NRC-849A1 that has been thermally sintered at 120° C. for 5 minutes, demonstrating the effect on trace shape when a thixotropic agent is not included in the ink and the ink is printed in high (>50%) humidity (left image); and (2) ink NRC-850A1 that has been thermally sintered at 120° C. for 5 minutes, demonstrating the effect on trace shape when a thixotropic agent is included in the ink and the ink is printed in high (>50%) humidity (right image).
Figure 4:
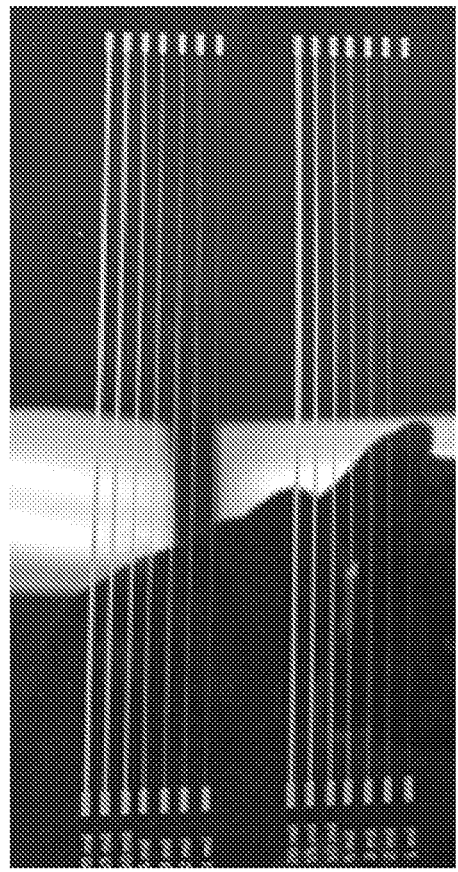

The inks NRC-849A1 and NRC-850A1 were screen printed on Melinex™ ST505 substrate in a manner as described in Example 2 in high humidity environments (humidity>50%). The traces on each substrate were thermally processed for 20 minutes at 121° C. to form conductive silver traces (FIG. 4 left and right images, respectively). In the absence of a thixotropic agent (NRC-849A1, FIG. 4 left image) the ink significantly de-wets from the surface, producing nonuniform and broken traces. In contrast, with the addition of the thixotropic agent (NRC-850A1, FIG. 4 right image) the traces do not de-wet from the substrate surface and remain uniform.

Example 5: Cold Storage without Ink Solidification

The formulation containing both amino-2-propanol and 2-amino-1-butanol (NRC-850A4) enables storage at −10° C. to −4° C. without ink solidification while maintaining electrical properties similar to that for NRC-850A2 and NRC-850A3, which contain only amino-2-propanol. Although NRC-850A2 and NRC-850A3 solidify during cold storage, warming to room temperature regenerates the liquid state of the ink over time.

Example 6: Thermoforming on PET-G Substrate—Forming then Sintering

Figure 5:
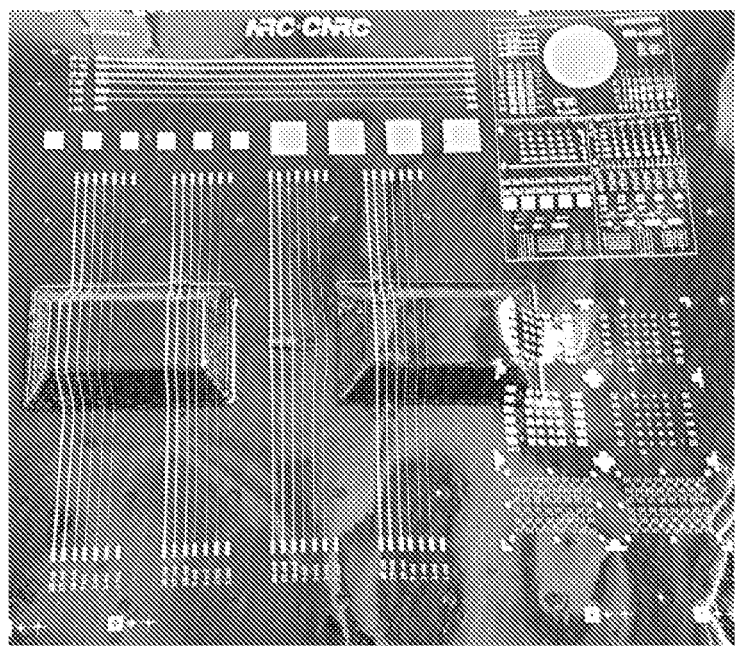
FIG. 5 depicts a top view of a trace of ink NRC-850A2, which has been printed on a glycol-modified polyethylene terephthalate (PET-G) substrate, dried at 75° C., thermoformed over trapezoidal shapes and photosintered with an energy of 15 J/cm$^2$ to convert the ink to a silver trace.

The ink NRC-850A2 was screen printed onto a sheet of polyethylene terephthalate glycol-modified (PET-G) (508 μm, 20 mil thick) via screen printing to produce a variety of 10 cm long traces with linewidths ranging from about 100 μm to about 590 μm. Following printing, the non-conductive traces were dried and thermoformed around a variety of shapes including trapezoid, half-cylinder and half-sphere features. The thermoformed traces can be subsequently photonically sintered (Xenon Sinteron 2000 system) to produce conductive traces. A representative photograph of thermoformed traces is provided in FIG. 5 and the corresponding resistance measured across the traces for the conductive features is provided in Table 9, demonstrating that continuous traces of silver metal are formed without cracking where the non-conductive ink underwent deformation during thermoforming, but prior to sintering. Table 9 highlights that the resistance measured across the control traces (i.e. those that were not thermoformed) are nearly identical to those that were thermoformed, suggesting, while not wishing to be limited by theory, that the electrical properties of the traces are unaffected by the thermoforming process. In some cases, the resistance measured across the thermoformed traces is actually lower than that of the control traces. While not wishing to be limited by theory, this may be due, for example, to portions of the thermoformed traces being higher than the control samples, which brings those portions closer to the lamp and exposes it to more intense pulsed light.

Example 7: Thermoforming on PET-G Substrate—Sintering then Forming

Figure 6:
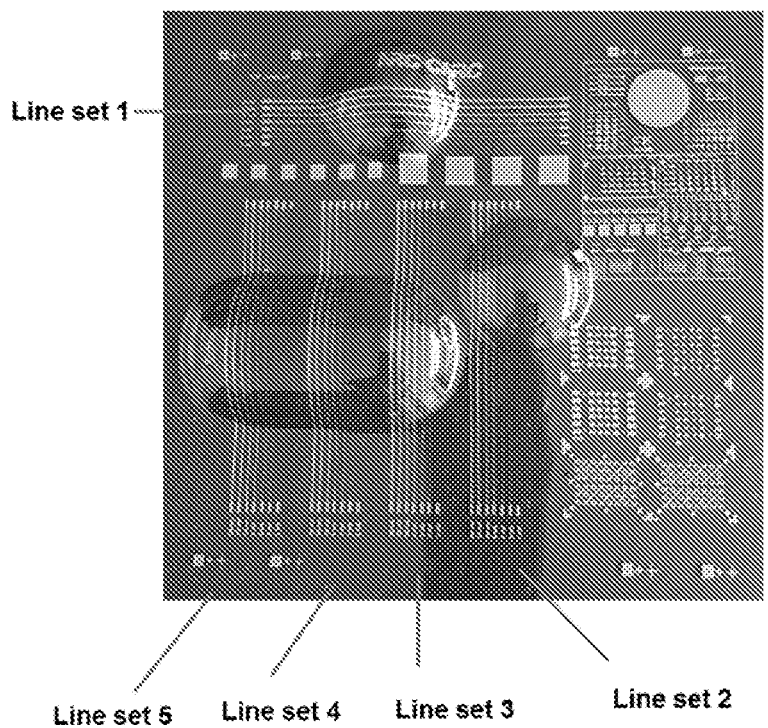
FIG. 6 depicts a top view of a trace of ink NRC-850A3, which has been printed on a glycol-modified polyethylene terephthalate (PET-G) substrate, dried at 75° C., sintered at 120° C. to convert the ink to a silver trace and subsequently thermoformed over dome and half cylinder shapes.

The ink NRC-850A3 was screen printed onto a sheet of PET-G to produce a variety of 10 cm long traces with measured linewidths ranging from about 100 μm to about 550 μm. Following printing, the traces were thermally sintered at 75° C. for 6 minutes and 125° C. for 15 minutes to produce a series of conductive traces. The traces were subsequently thermoformed around a variety of shapes including half-cylinders and domes. A representative thermoformed trace is provided in FIG. 6 and the corresponding resistance of the thermoformed traces in comparison to control traces are provided in Table 10. Though the resistance of the traces do increase (between 1.6 and 4.5 fold depending on the amount of elongation) following thermoforming, the thermoformed traces produced from the molecular ink remained conductive.

Figure 7:
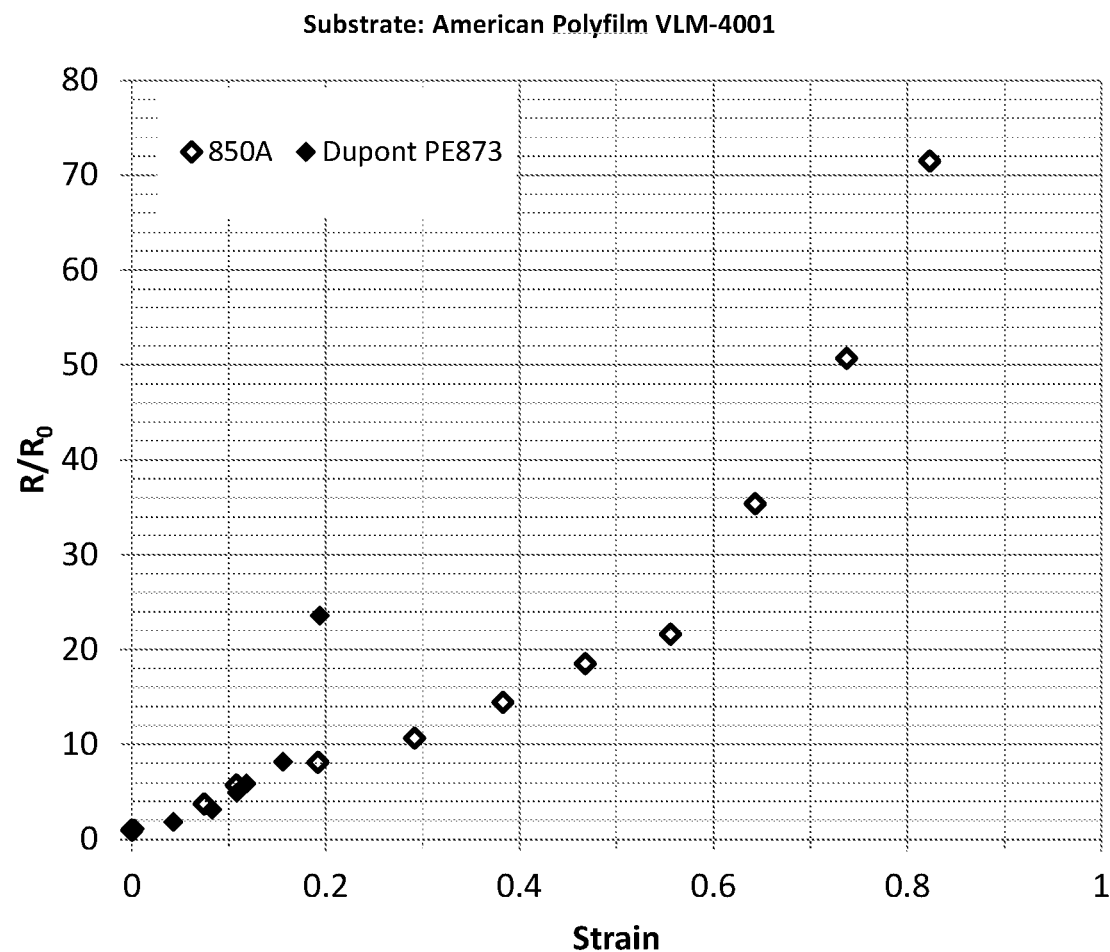
FIG. 7 depicts a normalized resistance of silver lines printed from ink NRC-850A and Dupont's PE873 ink as a function of applied strain, where the lines were printed on ozone treated polyester polyurethane (American Polyfilm VLM-4001).
Figure 8:
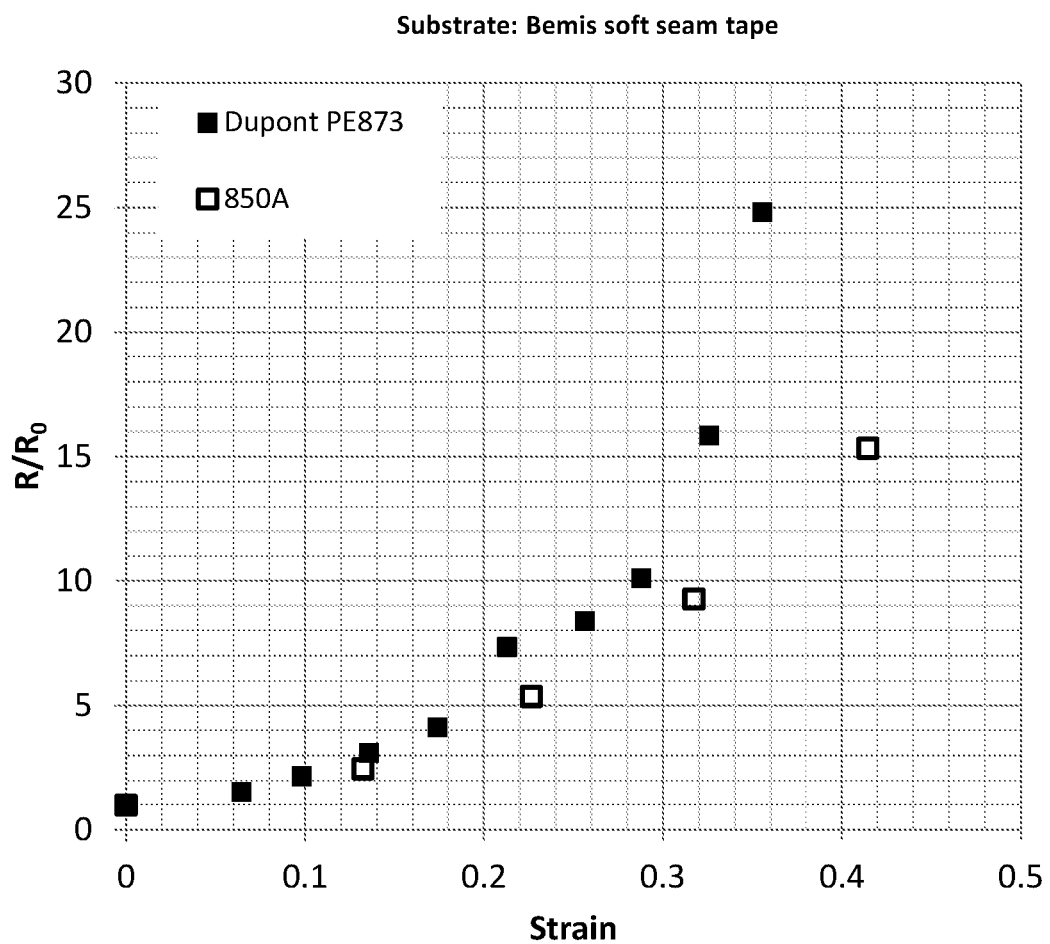
FIG. 8 depicts a normalized resistance of silver lines printed from ink NRC-850A and Dupont's PE873 ink as a function of applied strain, where the lines were printed on polyurethane soft seam tape (Bemis ST604).

Example 8: Stretching Linear Conductive Traces Derived from Low Temperature Molecular Inks The ink NRC-850A as well as commercially available ink Dupont PE873 (formulated for stretchable electronics) were screen printed onto two thermoplastic polyurethane substrates (Bemis soft seam tape ST604, and, American Polyfilm, Inc VLM-4001). The VLM-4001 polyurethane substrate was treated by reactive ozone prior to printing. The printed traces were linear, thermally sintered at 150° C. for 15 mins and were 20 mil wide and 4 cm long. A strain was applied to the samples and the changes in resistance were measured under strain. FIG. 7 shows the normalized resistance ($R/R_0$ where $R_0$ represents the resistance of the sample under zero strain) as a function of applied strain for the two inks on American Polyfilm VLM-4001. FIG. 8 shows the normalized resistance as a function of applied strain for the two inks on Bemis soft seam tape ST604. On both substrates, ink NRC-850A shows a lower normalized resistance as a function of applied strain than Dupont PE873. In addition, NRC-850A remains conductive under higher strain than the Dupont PE873 ink.

Figure 9:
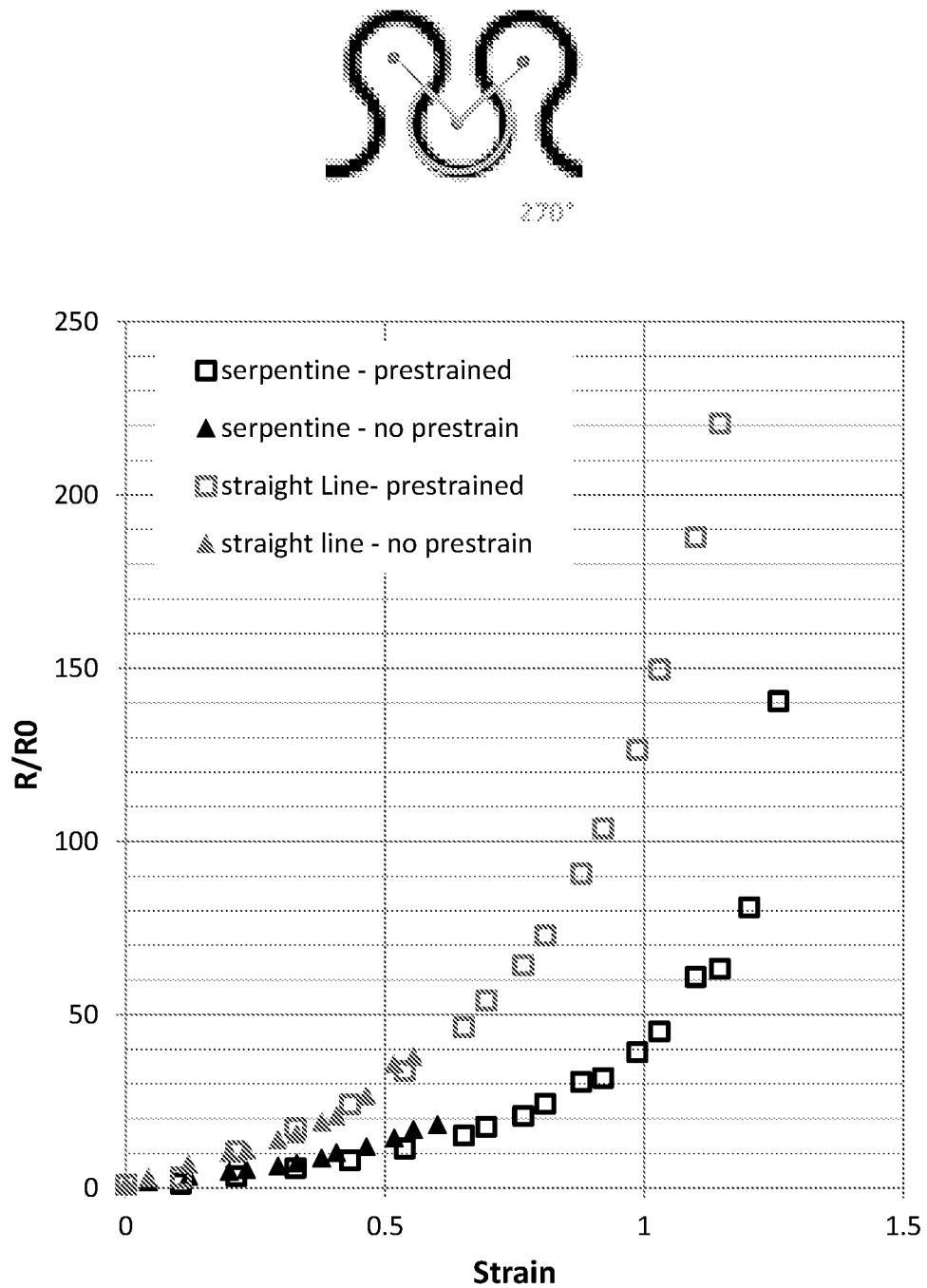
FIG. 9 depicts (1) a serpentine pattern that was used to print the ink NRC-850A onto polyurethane (top); and normalized resistance as a function of applied strain for silver lines printed using ink NRC-850A (bottom), where the lines were printed on ozone-treated polyester polyurethane (American Polyfilm VLM-4001). For the 'prestrained' sample, the polyurethane substrate was stretched by 10% in the direction of the line when the ink was deposited on the substrate.

Example 9: Stretching Meandering Conductive Traces Derived from Low Temperature Molecular Inks In another example, the polyurethane substrate American Polyfilm VLM-4001 was ozone treated. The ink NRC-850A was printed on the polyurethane substrate under two conditions. In one case, the substrate was under no strain. In a second case, the substrate was pre-strained by 10% in one direction (i.e. the substrate was stretch by 10% during the time of printing). The print pattern included linear and serpentine traces of 20 mils in width and 4 cm in length between the electrical contact pads. FIG. 9 (top) shows the serpentine lines made up of repeat units of a 270° of a circle. The normalized resistance of the linear and serpentine traces was measured as a function of applied strain, as shown in FIG. 9 (bottom). The silver serpentine traces printed on the pre-strained polyurethane remained conductive up to over 120% applied strain and the resistance at 120% strain was 150 times greater than the resistance under no strain. Table 11 compares the normalized resistance for all four conditions (serpentine traces, linear traces, pre-strained and no pre-strained) at 40% applied strain.

Tables with reference to Examples 1-9:

TABLE 1

The composition of screen printable molecular ink NRC-848A3a

| Component | Purpose of addition | % by weight |
|---|---|---|
| Silver oxalate | Silver precursor | 32.6 |
| Amino-2-propanol | Amine | 45.5 |
| Hydroxyethyl cellulose | Binder/rheology modifier | 0.6 |
| Glycolic acid | Surface tension modifier | 1.9 |
| Glycerol | Defoaming agent | 2.6 |
| Dipropylene glycol methyl ether | Solvent | 16.8 |

TABLE 2

The composition of screen printable molecular ink NRC-849A1

| Component | Purpose of addition | % by weight |
|---|---|---|
| Silver oxalate | Silver precursor | 33.1 |
| Amino-2-propanol | Amine | 46.5 |
| Hydroxyethyl cellulose | Binder/rheology modifier | 0.63 |
| Lactic acid | Surface tension modifier | 2.45 |
| Dipropylene glycol methyl ether | Solvent | 17.3 |

TABLE 3

The composition of screen printable molecular ink NRC-850A

| Component | Purpose of addition | % by weight |
|---|---|---|
| Silver oxalate | Silver precursor | 33.1 |
| Amino-2-propanol | Amine | 46.5 |
| Hydroxyethyl cellulose | Binder/rheology modifier | 0.63 |
| Lactic acid | Surface tension modifier | 2.47 |
| Antifoam 204 | Defoaming agent | 0.00073 |
| Dipropylene glycol methyl ether | Solvent | 17.4 |

TABLE 4

The composition of screen printable molecular ink NRC-850A1

| Component | Purpose of addition | % by weight |
|---|---|---|
| Silver oxalate | Silver precursor | 33.1 |
| Amino-2-propanol | Amine | 46.5 |
| Hydroxyethyl cellulose | Binder/rheology modifier | 0.63 |
| Lactic acid | Surface tension modifier | 2.48 |
| Antifoam 204 | Defoaming agent | 0.00073 |
| Dipropylene glycol methyl ether | Solvent | 16.9 |
| Polyhydroxycarboxylic acid amide (BYK ™-R 605) | Thixotropy modifying agent | 0.29 |

TABLE 5

The composition of screen printable molecular ink NRC-850A2

| Component | Purpose of addition | % by weight |
|---|---|---|
| Silver oxalate | Silver precursor | 33.0 |
| Amino-2-propanol | Amine | 46.4 |
| Hydroxyethyl cellulose | Binder/rheology modifier | 0.92 |
| Lactic acid | Surface tension modifier | 2.47 |
| Antifoam 204 | Defoaming agent | 0.00073 |
| Dipropylene glycol methyl ether | Solvent | 16.9 |
| Polyhydroxycarboxylic acid amide (BYK ™-R 605) | Thixotropy modifying agent | 0.38 |

TABLE 6

The composition of screen printable molecular ink NRC-850A3

| Component | Purpose of addition | % by weight |
|---|---|---|
| Silver oxalate | Silver precursor | 32.6 |
| Amino-2-propanol | Amine | 46.0 |
| Hydroxyethyl cellulose | Binder/rheology modifier | 0.92 |
| Rokrapol 7075 | Binder | 0.35 |
| Lactic acid | Surface tension modifier | 2.57 |
| Antifoam 204 | Defoaming agent | 0.00073 |
| Dipropylene glycol methyl ether | Solvent | 17.1 |
| Polyhydroxycarboxylic acid amide (BYK ™-R 605) | Thixotropy modifying agent | 0.46 |

TABLE 7

The composition of screen printable molecular ink NRC-850A4

| Component | Purpose of addition | % by weight |
|---|---|---|
| Silver oxalate | Silver precursor | 34.3 |
| Amino-2-propanol | Amine | 38.5 |
| 2-amino-1-butanol | Amine | 14.4 |
| Hydroxyethyl cellulose | Binder/rheology modifier | 0.7 |
| Lactic acid | Surface tension modifier | 0.9 |
| Antifoam 204 | Defoaming agent | 0.0076 |
| Dipropylene glycol methyl ether | Solvent | 6.9 |
| isopropanol | Solvent | 4 |
| Polyhydroxycarboxylic acid amide (BYK ™-R 605) | Thixotropy modifying agent | 0.3 |

TABLE 8

The measured linewidths, trace thickness and resulting sheet resistivities measured for 10 cm long lines printed from NRC-850A on Melinex ® ST505 and sintered at 75° C. for 5 minutes followed by 120° C. for 20 minutes.

| | nominal line width | | | | | |
|---|---|---|---|---|---|---|
| | 2 mil | 3 mil | 5 mil | 10 mil | 15 mil | 20 mil |
| measured linewidth (μm) | 71 ± 3 | 99 ± 4 | 141 ± 3 | 250 ± 6 | 364 ± 3 | 480 ± 3 |
| thickness (μm) | 0.75 ± 0.05 | 0.57 ± 0.01 | 0.58 ± 0.01 | 0.84 ± 0.08 | 0.86 ± 0.08 | 0.79 ± 0.10 |
| sheet resistivity (mΩ/□/mil) | 30.0 ± 0.2 | 13.1 ± 1.0 | 8.5 ± 0.2 | 10.2 ± 0.2 | 10.1 ± 0.3 | 9.2 ± 1.3 |

TABLE 9

The change in resistance that accompanies the thermoforming of 20 mil traces produced from NRC-850A2 that are printed, dried, thermoformed and subsequently converted to conductive traces using pulsed light with energies of 15 and 20 J/cm². In each case, the control line was exposed to the same process without being thermoformed.

| Energy (J/cm²) | Linewidth (mil) | Shape of object thermoformed into trace | Resistance across trace (Ω) |
|---|---|---|---|
| 20 | 23 | Control (no shape) | 70 |
|    | 23 | 35° trapezoid | 69 |
|    | 23 | 35° trapezoid | 60 |
|    | 23 | 35° trapezoid | 56 |
| 15 | 23 | Control (no shape) | 69 |
|    | 23 | 35° trapezoid | 60 |
|    | 23 | 35° trapezoid | 59 |
|    | 23 | 35° trapezoid | 68 |

TABLE 10

The change in resistance that accompanies the thermoforming of half-cylinder and dome shapes into molecular ink traces printed from NRC-850A3 on PET-G and thermally sintered at 125° C. for 15 minutes. In each case, the average stretch the trace is subjected to is also included.

|  |  | nominal linewidth (mil) | 20 | 15 | 10 |
|---|---|---|---|---|---|
| Line set 5 | resistance before thermoforming (Ω) | | 158 | 183 | 225 |
|  | resistance after thermoforming (Ω) | | 561 | 660 | 758 |
|  | average % stretch | | 14 | 14 | 14 |
| Line set 4 | resistance before thermoforming (Ω) | | 170 | 194 | 233 |
|  | resistance after thermoforming (Ω) | | 751 | 763 | 831 |
|  | average % stretch | | 13 | 13 | 13 |
| Line set 3 | resistance before thermoforming (Ω) | | 180 | 200 | 237 |
|  | resistance after thermoforming (Ω) | | 699 | 665 | 676 |
|  | average % stretch | | 10 | 10 | 10 |
| Line set 2 | resistance before thermoforming (Ω) | | 197 | 208 | 237 |
|  | resistance after thermoforming (Ω) | | 369 | 355 | 405 |
|  | average % stretch | | 8 | 8 | 8 |
| Line set 1 | resistance before thermoforming (Ω) | | 155 | 182 | 249 |
|  | resistance after thermoforming (Ω) | | 346 | 345 | 390 |
|  | average % stretch | | 11 | 11 | 11 |

TABLE 11

The normalized resistance of the serpentine lines and straight line that were prepared under no pre-strain and 10% strain when printed. The normalized resistance is measured at 40% applied strain.

|  |  | $R/R_0$ at 40% strain |
|---|---|---|
| serpentine traces | no pre-strain | 20 |
|  | pre-strained | 8 |
| linear traces | no pre-strain | 24 |
|  | pre-strained | 21 |

Example 10: Overmoulding of Part Printed with Molecular and Silver Flake Inks Overmoulding tests were carried out using a 4"×4"×0.1" square part. In this test, three inks were used 1) a low temperature molecular ink (NRC-850A2), 2) a high temperature molecular ink (NRC-16) and 3) DuPont™ ME601; a best in class thermoformable silver flake ink. NRC-16 is a high temperature molecular ink described in PCT Application Publication No. WO 2015/192248 and comprises a silver salt (50%), ethyl cellulose (4%), diethyl-benzene (34.5%) and 1-octanol (11.5%). The same pattern was printed on a 0.020" thick polyethylene terephthalate glycol (PETG) film, then the printed films were thermoformed and cured. For overmoulding, the formed films were placed in an Engel™ 43T injection press tool and sufficient PETG resin to fill the parts was injected. The mould temperature was around 100 F (about 38° C.) and the PETG resin was injected at 245° C., at a pressure of up to 40 bars. Approximately 22 parts were moulded. Resistance values were measured before and after overmoulding.

Visually the low temperature molecular ink appeared to perform the best. This test was done with a worst case injection strategy with a central injection sprue. With all three inks, there was visible damage to the traces in close proximity to the sprue. The DuPont ink showed signs of trace deformation and smearing. The high temperature molecular ink seemed to be dissolved in close proximity to the sprue, while not wishing to be limited by theory, due to the low $T_g$ (between 70° C. to 80° C.) of the PETG film and exposure to the high temperature and high pressure resin used in the test. When the resin was injected, there was a secondary hot forming of the traces at the sharp part edge which damaged the traces, cutting off the continuity, on all of the samples. While not wishing to be limited by theory, this was due to a slightly under-formed thermoformed part compared to a sharp radius in the injection tool. The final stretching of the trace during injection was believed to sever the connection locally at the edge of the part.

While not wishing to be limited by theory, the damage to the traces and the smearing was related to the PETG substrate that was used. Accordingly, using a higher $T_g$ thermoplastic film such as polycarbonate addresses this issue. Additionally, the use of a thermoset resin to overmould rather than a thermoplastic resin is a significantly less stressful overmoulding process, at significantly lower pressures and temperatures and addresses this issue. This may significantly open the door for the use of a wider range of thermoplastic substrates as the surface skin material compared to an injection moulding approach which exerts, for example, ten or greater times the pressure on the film substrate, at a significantly elevated temperature. Overmoulding with thermoset resins may be carried out using a tapered cover tool.

Example 11: Aliphatic Polyurethane Resin and Glass Microsphere Tests

Tests were conducted using a clear aliphatic polyurethane (Sherwin Williams™ Diamond-Clad™ Clear Coat Urethane) and 3M™ iM30K Glass Bubbles microspheres. iM30K are hollow spheres with thin walls made up of soda-lime-borosilicate glass. They have an average diameter of 18 microns, a typical density of 0.60 g/cc (minimum density 0.57 g/cc; maximum density 0.63 g/cc) and a particle size and distribution as follows: 10th percentile, 9 microns; 25th percentile, 12 microns; 50th percentile, 16 microns; 75th percentile, 21 microns; 90th percentile, 28 microns; and 95th percentile, 33 microns.

Stoichiometric quantities of Part A (Clear—Gloss B65T105; 8 parts/weight), Part B (aliphatic isocyanate Hardener B65V105; 4 parts/weight) and Part C (Catalyst B65C105; 2 parts/weight) were mixed with the glass microspheres and cured at ambient temperature. Experiments were conducted with 5% by weight and 10% by weight of glass spheres added to the resin system. A control experiment was conducted using the same polyurethane without the presence of glass microspheres.

The experiment examined the impact on the translucent behaviour of the polyurethane resin with the addition of the glass microspheres. This is useful, for example, to investigate if light from LEDs would be impacted if a lower density resin comprising glass microspheres was used inside an overmoulded part.

The resin with 5% glass microspheres yielded some reduction in the reflective index of the part. However, light passed through the substrate. The resin with 10% glass microspheres was significantly impacted. However, these experiments were carried out using hand mixing which introduced additional air bubbles and there was also flotation of the bubbles during curing. Use of mixing conditions which reduce bubbles and injection of the resin instead of casting is expected to address this issue and result in less reduction in reflective index.

Using another glass microsphere such as 3M iM16 may offer additional weight reductions at a lower average density, but is more susceptible to breaking when compounded, for example, in a single or double screw thermoplastic compounder. iM16 are also hollow spheres with thin walls made up of soda-lime-borosilicate glass. They have a typical density of 0.46 g/cc (minimum density 0.43 g/cc; maximum density 0.49 g/cc) and a particle size and distribution as follows: 10th percentile, 12 microns; 50th percentile, 20 microns; 90th percentile, 30 microns. While not wishing to be limited by theory, addition of glass microspheres to thermoset resins is less severe and may better preserve the spheres.

Similar tests have been performed and results obtained using an alternative aliphatic urethane: BJB Enterprises Aliphatic urethanes WC-783 A/B using 100 parts polyol to 90 parts aliphatic isocyanate. This resin is clear (therefore suitable where optical components are presented), UV stable, and has a high hardness 80 Shore D. The BJB resin produced a harder part that was easier to demould, that was also clear but stiffer and bonded better with the PC substrate than the clear aliphatic polyurethane of Example 11 described above.

Example 12: Single and Double-Sided Overmoulded Printed Electronic Parts

Figure 10:
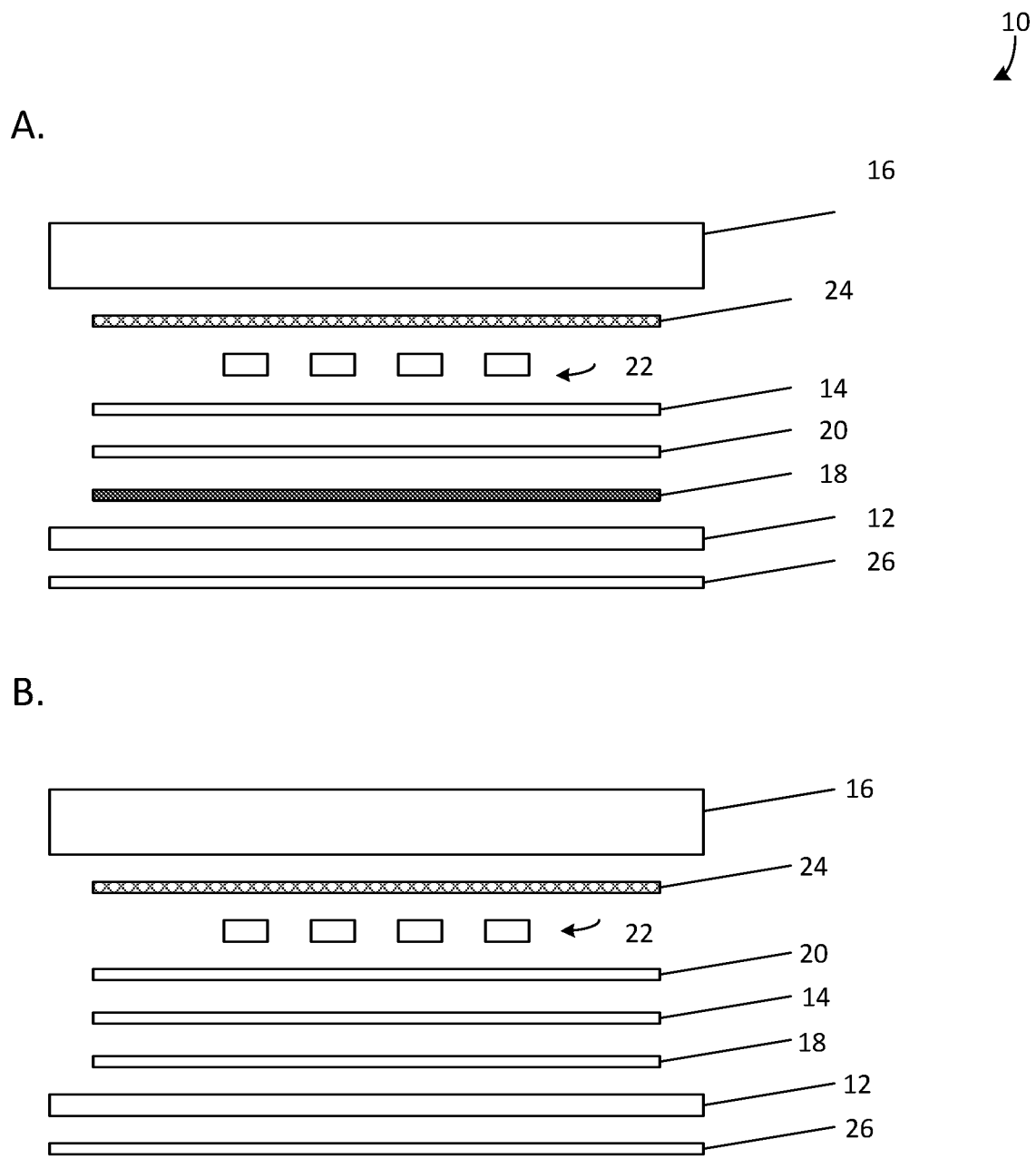
FIG. 10 is a schematic for two single-sided overmoulded printed electronic part according to embodiment of the present application.

An exemplary schematic for a single-sided overmoulded printed electronic part 10 of the present application is shown in FIG. 10. Referring to FIG. 10, the overmoulded printed electronic part 10 exemplified therein comprises a substrate 12, a conductive trace 14 that is coupled to a first surface of the substrate 12 and a resin 16 overmoulded over the conductive trace 14 that is coupled to the substrate 12. The overmoulded electronic part 10 optionally further comprises a decorative ink layer 18 (for example, 1-3 different decorative inks may be used in an overmoulded printed electronic part 10), and a dielectric ink layer 20, which may act as a barrier layer so as to protect a decorative ink layer 18 from the molecular ink used to prepare the conductive trace 14. For example, one of the roles of a second material over the decorative ink layer 18 may be to create a barrier layer and improve adhesion of the molecular ink to the part; a dielectric ink layer 20 over the decorative ink layer 18 may also act as a protective layer to prevent cosmetic printing issues through the surface layer due to injection and bonding of hardware. In other embodiments, a dielectric layer could be added between the conductive trace 14 and electronic parts 22 to provide further protection except for those regions where the electronic parts 22 need to connect with the conductive trace 14. In still other embodiments, if a white decorative ink is used instead of a black (carbon) ink, no dielectric layer is needed between the decorative ink 18 and conductive trace 14.

In the overmoulded printed electronic part 10, optionally multiple layers of inks such as low temperature molecular inks used to prepare the conductive trace 14 can be applied over dielectric inks used to prepare the dielectric ink layer 20. Alternatively, one layer of ink such as low temperature molecular ink can be used. In the single-sided overmoulded printed electronic part 10, the ink layers are typically overlapping; e.g. the decorative ink layer 18 covers most of the surface of the substrate 12, except for windows for the lighting; and the dielectric ink layer 20 partially covers the surface of the substrate 12. Referring to FIG. 10, electrical components 22 such as but not limited to light emitting diodes (LEDs), organic light emitting diodes (OLEDs) and ultrasonic sensors are optionally coupled to the substrate 12 using conductive adhesives prior to thermoforming in the methods of the present application. A fibreglass reinforcing layer 24 is also optional and may be used, for example, to reduce the weight while increasing the rigidity of the overmoulded printed electronic part 10. FIG. 10 also depicts an optional ultra-violet (UV) hard coat layer (26) coupled to a second side of the substrate 12 that may be applied, for example to increase the scratch resistance of the final overmoulded printed electronic part 10. In the methods of the present application, the UV curing is completed after thermoforming the substrate 12. In some embodiments of the present application the overmoulding resin 16 can be either a thermoplastic resin or a thermoset resin. In other embodiments of the present application, the overmoulding resin 16 is a thermoset resin. The overmoulding resin 16 is optionally foamed or comprises glass microspheres. Alternatively, the overmoulding resin 16 is neat resin. In some cases a coloured overmoulding resin 16 is desirable. For example, when lighting features are bonded directly to the substrate 12. Alternatively, if two skins are used, a clear or opaque resin will allow light transmission through the overmoulded printed electronic part 10.

Figure 11:
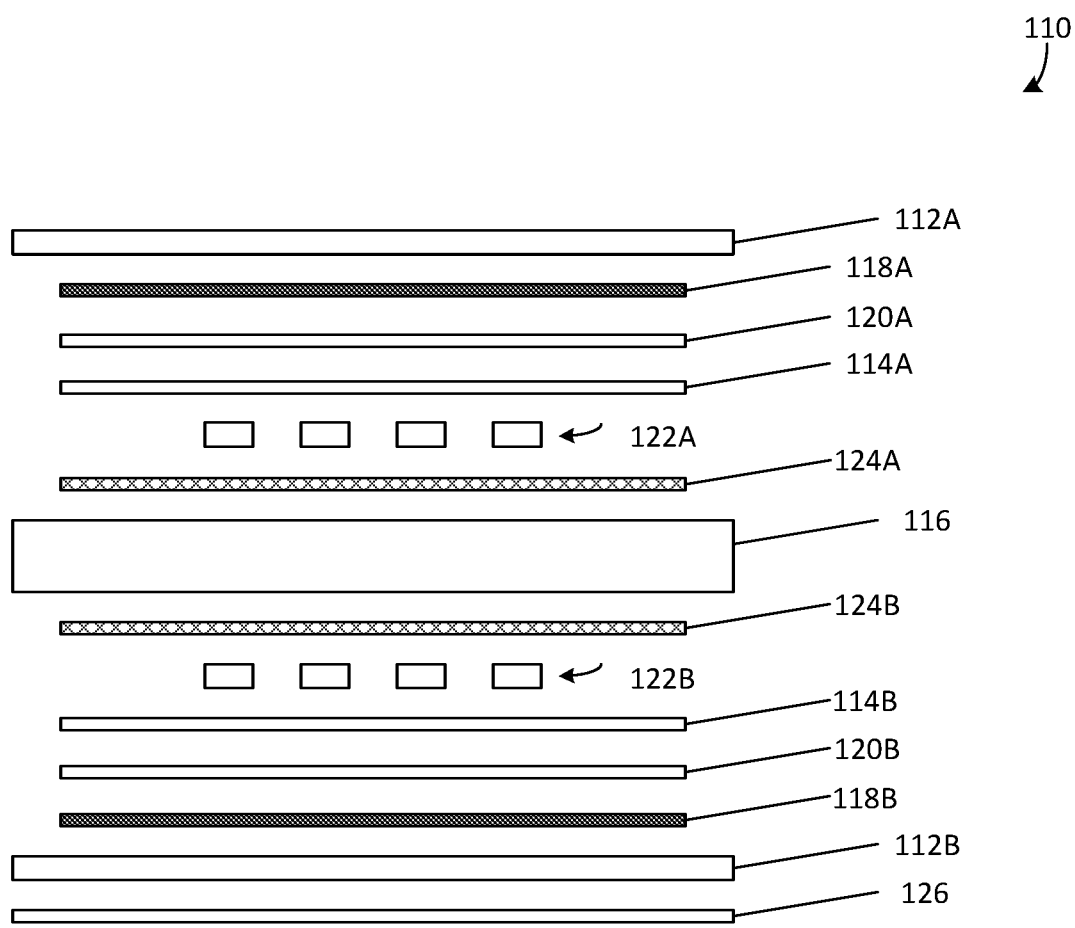
FIG. 11 is a schematic for a double-sided overmoulded printed electronic part according to an embodiment of the present application.

An exemplary schematic for a double-sided overmoulded printed electronic part 110 of the present application is shown in FIG. 11. The double-sided overmoulded printed electronic part 110 may be used, for example when advanced lighting effects are desired in a part and/or if there isn't significant space on one surface for the printed electronic circuit. Referring to FIG. 11, the double-sided overmoulded printed electronic part 110 exemplified therein comprises two substrates (112A, 112B), two conductive traces (114A, 114B) that are coupled to a first surface of each of the substrates (112A, 112B), respectively and a resin 116 overmoulded over the conductive traces (114A, 114B) that are respectively coupled to the substrates (112A, 112B). The substrate 112A on the back surface of the overmoulded printed electronic part 110 can optionally be a different lower cost material than the substrate 112B on the show surface of the overmoulded printed electronic part 110, for example, not requiring scratch resistance and/or UV weatherability. The overmoulded electronic part 110 optionally further comprises decorative ink layers (118A, 118B). For example, 1-3 different decorative inks may be used in an overmoulded printed electronic part 110, and dielectric ink layers (120A, 120B) intervening between the conductive traces (114A, 114B) and decorative ink layers (118A, 118B). In the overmoulded printed electronic part 110, optionally multiple layers of inks such as low temperature molecular inks used to prepare the conductive traces (114A, 114B) can be applied over dielectric inks used to prepare the dielectric ink layers (120A, 120B). Alternatively, one layer of ink such as low temperature molecular ink can be used. In the double-sided overmoulded printed electronic part 110 of FIG. 11, a similar layering approach may be followed to the single-sided overmoulded printed electronic part 10 of FIG. 10, however it will be appreciated by the skilled person that this surface will not be visible and can serve a different purpose, for example, real-estate for a printed electronic circuit, or additional lights. Referring to FIG. 11, electrical components (122A, 122B) such as but not limited to light emitting diodes (LEDs), organic light emitting diodes (OLEDs) and ultrasonic sensors are optionally coupled to the substrates (112A, 112B) using conductive adhesives prior to thermoforming in the methods of the present application. Fibreglass reinforcing layers (124A, 124B) are also optional and may be used, for example, to reduce the weight while increasing the rigidity of the overmoulded printed electronic part 110. FIG. 11 also depicts an optional ultraviolet (UV) hard coat layer (126) coupled to a second side of the substrate 112B that may be applied, for example to increase the scratch resistance of the show surface of the final overmoulded printed electronic part 110.

Figure 18:
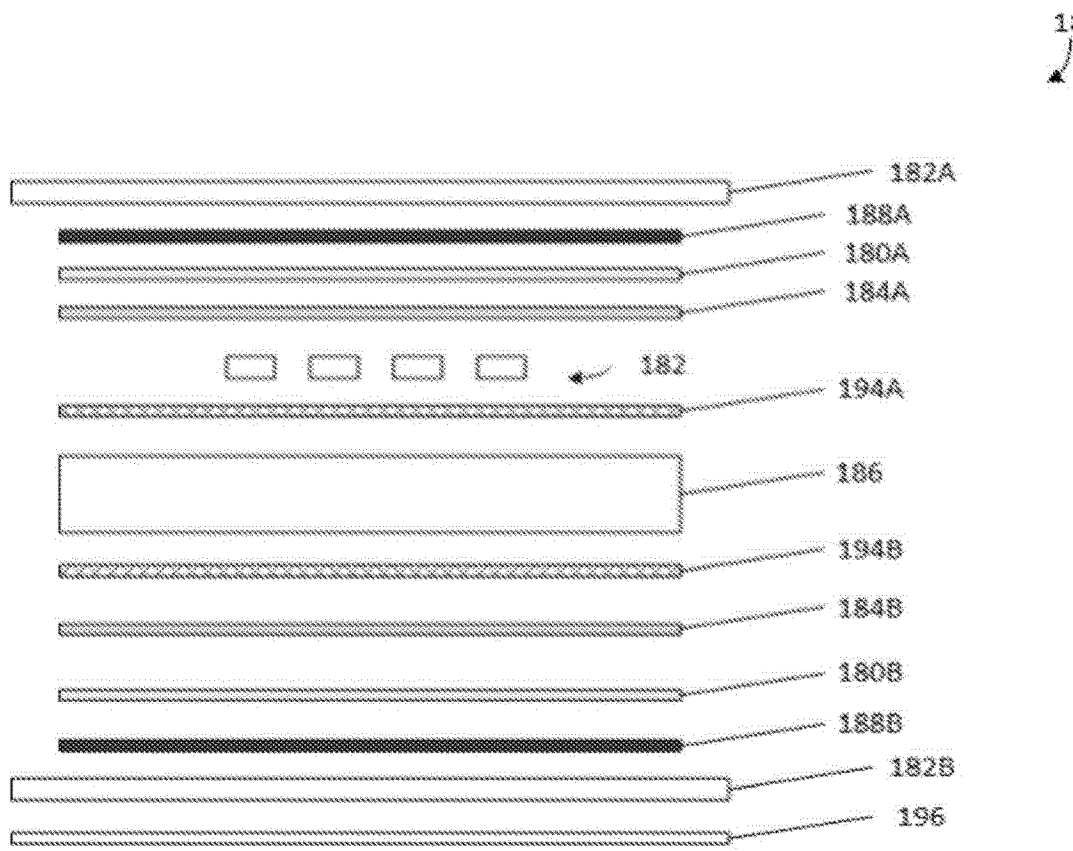
FIG. 18 is a schematic for a double-sided overmoulded printed electronic part according to an embodiment of the present application.

In yet another embodiment as shown in FIG. 18, only one set of submerged electronics is shown coupled to the back skin (substrate, 182A). The two substrates (182A, 182B) have conductive traces (184A, 184B) coupled to them and include decorative ink layers (188A, 188B) and protective intervening dielectric layers (180A, 180B). Fibreglass layers (194A, 194B) are also shown on either side of the resin layer (186). Finally, a UV hard coat (196) is provided on the opposite, second surface of the substrate (182B), i.e. the cosmetic surface of the overmoulded part.

Figure 12:
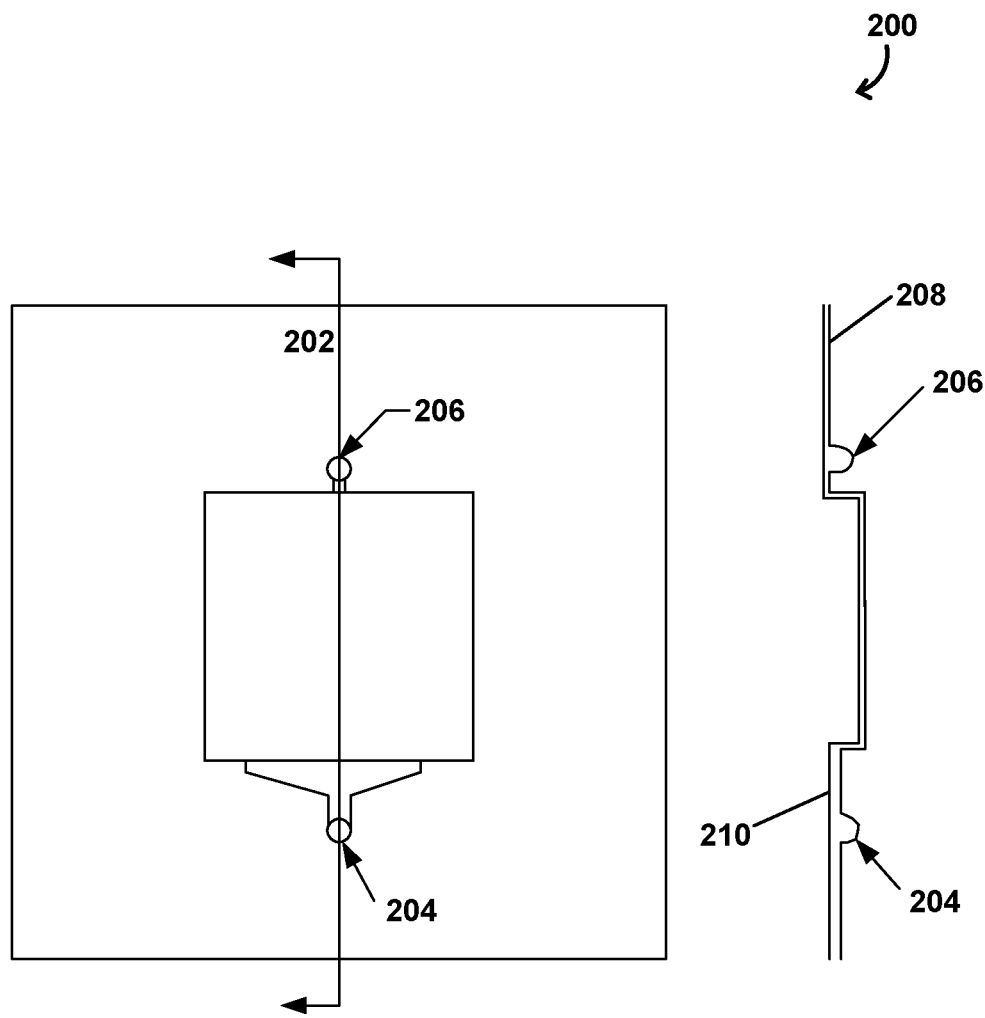
FIG. 12 is a schematic (top view: left; cross-section: right) for a double-sided overmoulded printed electronic part according to an embodiment of the present application showing integration of venting and gating features.

Another advantage of using the two skin approach (i.e. a double-sided rather than a single-sided overmoulded printed electronic part) with a thermoset resin system may be in simplifying the moulding process and integrating the venting and gating features in the thermoformed parts. This may, for example, reduce the time spent cleaning injection tools and/or may facilitate automated manufacturing of an overmoulded part. An exemplary schematic showing venting and gating features in a double-sided overmoulded printed electronic part 200 is shown in FIG. 12. Referring to FIG. 12, the schematic at the left is a top view of the double-sided overmoulded printed electronic part 200 and the schematic at the right is a cross section of the double-sided overmoulded printed electronic part 200 taken at line 202 of the schematic shown at the left. Referring to FIG. 12, an injection gate 204 and a vent 206 are formed into the substrate films. In the schematic at the right, the lower substrate 208 and upper substrate 210 are depicted.

A further additional advantage of using a (double) two-sided skin approach is it can improve the surface cosmetics by (moving the LEDs and traces to the back skin so they are submerged and not visible from the cosmetic surface/side of the front skin) and make more surface area available for electronic components. Metal ink traces being less visible on the (cosmetic) surface offer a further advantage, for example in two-sided parts as illustrated in FIG. 11 and FIG. 18.

Example 13: Cu Traces Produced from Molecular Inks

Low price, high conductivity and oxidation resistance are important targets for inks in printed electronics. Gold and silver are expensive but stable, i.e. resistant to oxidation. Compared to gold and silver, copper is cheaper and has a similar conductivity; however, the similar conductivity is often not achieved via printing and the copper is prone to oxidation, which reduces conductivity over time. The main types of copper inks used are metal nanoparticle-based inks, metal-organic decomposition (MOD) inks, copper flake inks and silver-coated copper flake inks. The majority of these Cu conductive inks requires nitrogen or reducing atmosphere during thermal sintering as well as required longer time for sintering.

Advantageously, printable inks are provided herein that can be sintered using broad spectrum UV light to produce oxidation resistant electrically conductive Cu traces on a low temperature substrate while reducing or eliminating damage to the substrate. Low cost copper inks that are screen-printable on low cost plastic i.e. PET and can be UV sintered would have immediate advantages for industrial or commercial application. Exemplary copper molecular inks and methods of making such inks suitable for UV processing (treatment and sintering) are disclosed in WO2018018136 and in Table 12 below.

The Cu molecular ink comprises an admixture of a copper nanoparticle, a copper precursor molecule, and a polymeric binder comprising a polyester, polyimide, polyether imide or any mixture thereof having surface functional groups that render the polymeric binder compatible with and/or soluble in a diol.

Copper nanoparticles (CuNP) are copper particles having an average size along a longest dimension in a range of about 1-1000 nm, preferably about 1-500 nm, more preferably about 1-100 nm. The copper nanoparticles, may be flakes, nanowires, needles, substantially spherical or any other shape. Copper nanoparticles can be formed by natural processes or through chemical synthesis, and are generally commercially available. The copper nanoparticles are preferably present in the ink in an amount of about 0.04-7 wt %, based on total weight of the ink. More preferably, the amount of copper nanoparticles is in a range of about 0.1-6 wt %, or about 0.25-5 wt %, or about 0.4-4 wt %. In one especially preferred embodiment, the amount is in a range of about 0.4 wt % to about 1 wt %.

The copper precursor molecule is a copper-containing compound that decomposes under sintering conditions to produce further copper nanoparticles in the conductive copper trace. The copper precursor molecule may be an inorganic compound (e.g. CuSO4, CuCl2, Cu(NO3), Cu(OH)2), a copper metallo-organic compound (copper-MOD) or a mixture thereof. Copper-MODs include, for example, copper carboxylates (e.g. copper salts of a $C_1$-$C_{12}$ alkanoic acid, such as copper formate, copper acetate, copper propanoate, copper butanoate, copper decanoate, copper neodecanoate and the like), copper amines (e.g. bis(2-ethyl-1-hexylamine) copper (II) formate, bis(octylamine) copper (II) formate, tris(octylamine) copper (II) formate and the like), copper ketone complexes (e.g. copper (acetylacetone), copper (trifluoroacetylacetone), copper (hexafluoroacetylacetone), copper (dipivaloylmethane) and the like), copper hydroxide-alkanol amine complexes copper (II) formate-alkanol amine complexes and copper:aminediol complexes. The amino diol examples are 3-diethylamino-1,2-propanediol (DEAPD), 3-(dimethylamino)-1,2 propanediol (DMAPD), 3-methylamino-1-2-propanediol (MPD), 3-Amino-1,2-propanediol (APD) and 3-morpholino-1,2-propanediol.

The organic amine may be present in the ink in any suitable amount, preferably in 15 a range of about 10 wt % to about 75 wt %, based on total weight of the ink. More preferably, the amount is in a range of about 20 wt % to about 60 wt %, or about 25 wt % to about 55 wt %. In one especially preferred embodiment, the amount is in a range of about 40 wt % to about 45 wt %.

Copper:aminediol complexes are particularly preferred copper precursor molecules. Many copper:aminediol complexes are liquid at ambient temperature and are capable of acting as both copper precursor molecules and solvents. Further, copper:aminediol complexes interact favorably with the polymeric binder leading to superior conductive copper traces with respect to conductivity, mechanical strength and solderability. Particularly preferred copper: aminediol complexes are copper formate:aminediol complexes. In one embodiment, the copper:aminediol complex comprises a compound of Formula (I):

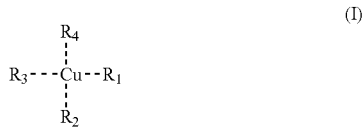

where R1, R2, R3 and R4 are the same or different and are NR5R6(R'(OH)2) or —O—(CO)—R", and at least one of R1, R2, R3 or R4 is NR5R6(R'(OH)2), wherein: R5 and R6 are independently H, C1-8 straight chain, branched chain or cyclic alkyl, C2-8 straight chain, branched chain or cyclic alkenyl, or C2-8 straight chain, branched chain or cyclic alkynyl; R' is C2-8 straight chain, branched chain or cyclic alkyl; and, R" is H or C1-8 straight chain, branched chain or cyclic alkyl.

In the compound of Formula (I), NR5R6(R'(OH)2) is coordinated to the copper atom through the nitrogen atom of the NR5R6(R'(OH)2). On the other hand, —O—(CO)—R" is covalently bonded to the copper atom through the oxygen atom. Preferably, one or two of R1, R2, R3 or R4 are NR5R6(R'(OH)2), more preferably two of R1, R2, R3 or R4 are NR5R6(R'(OH)2).

Preferably, R5 and R6 are independently H or C1-8 straight chain branched chain or cyclic alkyl, more preferably H or C1-8 straight chain or branched chain alkyl, yet more preferably H or C1-4 straight chain or branched chain alkyl. Examples of C1-4 straight chain or branched chain alkyl are methyl, ethyl, n-propyl, i-propyl, n-butyl, s-butyl and t-butyl. In a particularly preferred embodiment, R5 and R6 are H, methyl or ethyl.

Preferably R' is C2-8 straight chain or branched chain alkyl, more preferably C2-5 straight or branched chain alkyl. R' is preferably a straight chain alkyl. In a particularly preferred embodiment, R' is propyl. On a given R' substituent, the OH groups are preferably not bonded to the same carbon atom.

Preferably R" is H or C1-4 straight chain alkyl, more preferably H.

The copper precursor compound provides the balance of the weight of the ink after accounting for the copper nanoparticles, polymeric binder and any other inclusions in the ink. The copper precursor compound is preferably present in the ink in an amount of about 35 wt % or more, based on total weight of the ink. The amount of copper precursor compound may be about 45 wt % or more, or about 50 wt %.

The polymeric binder comprises a polyester, polyimide, polyether imide or any mixture thereof having surface functional groups that render the polymeric binder compatible with and/or soluble in a diol. Preferably, the surface functional groups comprise polar groups capable of participating in hydrogen bonding. The surface functional groups preferably comprise one or more of hydroxyl, carboxyl, amino and sulfonyl groups. The polymeric binder may be present in the ink in any suitable amount. Preferably, the polymeric binder is present in the ink in an amount of about 0.04-0.8 wt %, based on total weight of the ink. More preferably, the amount of polymeric binder is in a range of about 0.08-0.6 wt %, even more preferably about 0.25-1 wt %, yet even more preferably about 0.25-0.4 wt %, for example about 0.3 wt %.

The polymeric binder preferably comprises a polyester. Suitable polyesters are commercially available or may be manufactured by the condensation of poly alcohols with poly carboxylic acid and respectively their anhydrides. Preferred polyesters are hydroxyl and/or carboxyl functionalized. The polyester may be linear or branched. Solid or liquid polyesters as well as diverse solution forms may be utilized. In a particularly preferred embodiment, the polymeric binder comprises a hydroxyl- and/or carboxyl-terminated polyester, for example Rokrapol™ 7075.

The ink may be formulated by mixing the copper nanoparticles, copper precursor molecule and polymeric binder together. Mixing may be performed with or without an additional solvent. Preferably, the copper precursor molecule is a liquid and can act as a solvent in addition to being a precursor to copper metal formation. However, in some embodiments an additional solvent may be desired. The additional solvent may comprise at least one aqueous solvent, at least one aromatic organic solvent, at least one non-aromatic organic solvent or any mixture thereof, for example water, toluene, xylene, anisole, diethylbenzene, alcohols (e.g. methanol, ethanol), diols (e.g. ethylene glycol), triols (e.g. glycerol) or any mixture thereof. Additional solvent may comprise about 0.5-50 wt % of the ink, based on total weight of the ink, more preferably about 1-20 wt %.

While the ink may be formulated for any kind of depositing, the ink is particularly suited for screen printing. In this regard, the ink preferably has a viscosity of about 1,500 cP or greater, more preferably about 1,500-10,000 cP or 4,000-8,000 cP, for example about 6,000 cP.

With reference to Table 12 an exemplary Cu ink comprises a Cu formate; an organic amine compound; fractional amount of CuNP as a filler (2.4% to the total amount of Cu in the ink) and a binder. Advantageously, the ink of the can be printed on a low temperature substrate and UV sintered to produce electrically conductive traces on the low temperature substrate while reducing or eliminating damage to the substrate. Sintering time is preferably 20 minutes or less, more preferably about 15 minutes or less. In one embodiment the traces are sintered for about 1-15 minutes to obtain conductive copper traces. In another embodiment the traces are sintered for about 3-10 minutes to obtain conductive copper traces. In still another embodiment the traces are sintered for about 8-10 minutes. The conductive traces produced by sintering the ink with broad spectrum UV light have trace morphologies similar to those of thermally processed samples and have comparable electrical properties.

In this case, the reagent that can assist in the photoreduction of the copper formate on PET and on Kapton is amino diol i.e. (3-(Diethylamino)-1,2-propanediol). UV sintering of Cu inks formulated with an alkylamine (octylamine or ethyl-hexyl amine) does not initiate photoreduction and traces go black with longer exposures (~30 min) suggesting oxidation of Cu traces. These results suggest that the amino diol is particularly suited for UV sintering (and without the need for including a thermal protecting agent). The first advantage of the amino diol is the lowering of the decomposition temperature of the Cu formate/amino diol complex. Second, the hydroxyl groups from amino diol prevent penetration of oxygen during sintering and prevent oxidation.

The amino diol have the greater tolerance towards the presence of trace amounts of oxygen during sintering compared to other amine ligands.

TABLE 12

Cu molecular ink

| Component | Purpose of addition | Mass (g) | % by weight |
|---|---|---|---|
| Cu Formate anhydrous | Cu precursor | 5.0 | 42.63 |
| 3-(Diethylamino)-1,2-propanediol | Amine | 1.46 | 12.45 |
| H$_2$O | Solvent | 5.18 | 44.17 |
| Cu Nanoparticles | Filler | 0.05 | 0.43 |
| Rokrapol 7075 | Binder | 0.0375 | 0.32 |

Example 14: UV Treated Aq Traces Produced from Molecular Inks

Thermoformed electronics use traditional and improved printing processes to print functional inks on flat (2D) substrates which can be thermoformed into 3D shapes and subsequently injection moulded to produce the final functional, lightweight and lower cost "part". The success of this process hinges on conductive inks that survive thermoforming, where conductors must withstand elongations >25% and draw-depths (changes in the "z-direction") up to 1 cm without a significant loss or change in measured resistance of the traces. In this example, a screen printable ink that comprises silver oxalate, 1-amino-2-propanol or a mixture of 1-amino-2-propanol/2-amino butanol (to solubilize the silver oxalate salt and reduce its decomposition temperature), a cellulose polymer (to act as a rheology modifier and binder) and dipropylene glycol monomethyl ether (to act as a solvent carrier) is tested for the advantages of drying or curing using broad band UV light.

Following the screen printing of the ink onto industrially-relevant polycarbonate substrates, the resulting traces can be treated using UV light and subsequently sintered in-situ (e.g. thermally) as they are thermoformed to yield conductive traces that have local elongations as high as 25% with a resistance increases as small as 11% and resistivity values as low as 14 µΩ·cm (5.4 mΩ/□/mil). The ability to produce functional traces following thermoforming enabled the development of a proof-of-concept 3D capacitive touch HMI interface driven by an external processor that can illuminate 3 individually addressable LEDs (see FIG. 16).

The ink in Table 13 was prepared according to methods disclosed in WO 2018/146616, which is herein incorporated by reference in its entirety. First a cellulose polymer binder was dissolved in a dipropylene glycol monomethyl ether to produce the ink carrier. Following dissolution of the cellulose polymer, a surface tension modifier, a defoaming agent and 1-amino-2-propanol (or a mixture of 1-amino-2-propanol/2-aminobutanol) were added to the carrier and mixed in a centrifugal mixer for 2 minutes. Finally, silver oxalate is added to the carrier and again mixed in the centrifugal mixer to produce the ink. Thermogravimetric analysis (TGA) analysis of the ink indicates that the silver metal content of the ink is ~23%. The viscosity of the inks was measured with a Brookfield DV3T rheometer fitted with an SC4-14 small sample adapter and found to shear thin under stress and had a viscosity of 6000 cP.

TABLE 13

A low temperature silver ink

| Component | Purpose of addition | Mass (g) | % by weight |
|---|---|---|---|
| Silver oxalate | Silver precursor | 7.935 | 35.00 |
| 1-Amino-2-isopropanol/2-Amino-1-butanol (2.67/1) | Amine | 12.2455 | 54.01 |
| Lactic acid | Surface tension modifier | 0.2046 | 0.90 |
| Hydroxyethyl cellulose (HOEC) | Binder | 0.1647 | 0.73 |
| Dipropylene glycol monomethyl ether (DPGME) | Solvent | 2.0521 | 9.05 |
| Antifoam 204 | Defoaming agent | 0.0017 | 0.00749 |
| BYK R605 (a polyhydroxycarboxylic acid amide) | Thixotropy agent | 0.0688 | 0.30 |

The molecular ink was screen printed onto 8.5×11" sheets of Lexan 8010 (referred to as PC-8010) using an S-912M small format screen printer through patterns photo-imaged onto MIM emulsion (22-24 µm) supported on a SS400 stainless steel mesh (MeshTec, Illinois). For the samples processed via the DYMAX 5000-EC Series UV Curing Flood Lamp system, the printed traces were placed on top of a platform placed 20 cm from the lamp and exposed to the UV light immediately when the lamp was powered on. The light energy measured from the lamp with an AccuXX light meter indicates the energy is 3.232 J/cm$^2$ per minute. For the samples processed with the UV conveyer system, a 6 foot dual lamp conveyer system from American UV was utilized (C12/300/2 12"). The conveyer was fitted with gallium- and iron-doped halogen bulbs and the intensity for a single pass under the lamps at 35 feet/minute produce the light doses presented in Table 14.

TABLE 14

The UV doses for UVA, UVB, UVC and UVV light from the UV conveyer system, a 6 foot dual lamp conveyer system from American UV was utilized (C12/300/2 12") fitted with both gallium- and iron-doped halogen bulbs following a single pass under the lamps at 35 feet/minute.

| Light | wavelength | dose |
|---|---|---|
| UVA | 320-395 | 867 ± 9 |
| UVB | 280-320 | 554 ± 3 |
| UVC | 250-280 | 130 ± 1 |
| UVV | 395-455 | 1788 ± 5 |

Following formulation and screen printing of the silver oxalate-based molecular ink onto Lexan 8010, the substrate was fitted into a Formech thermoforming machine (https://formechinc.com/product/300xg/) and heated to temperatures of 180-190° C. for 60-70 seconds in order to soften the substrate. It should be noted that exposure of the silver oxalate-based traces to these temperatures, even for this short duration of time, produces conductive traces in situ. Following softening, the PC substrate is thermoformed by pulling it over a template object (in this case a domed oval) supported on a vacuum table and as the substrate cools, the 3D shape is frozen into the substrate resulting in the production of 3D conductive silver traces.

When the silver oxalate-based ink is printed and immediately thermoformed conductive traces cannot be produced.

In contrast, when the printed traces are treated with UV light from a flood lamp based system (DYMAX 5000-EC Series UV Curing Flood Lamp system) or a dual lamp UV conveyer system (American UV C12/300/2 12" conveyer, fitted with gallium-doped and iron-doped metal halide lamps), conductive thermoformed traces are produced.

Figure 13:
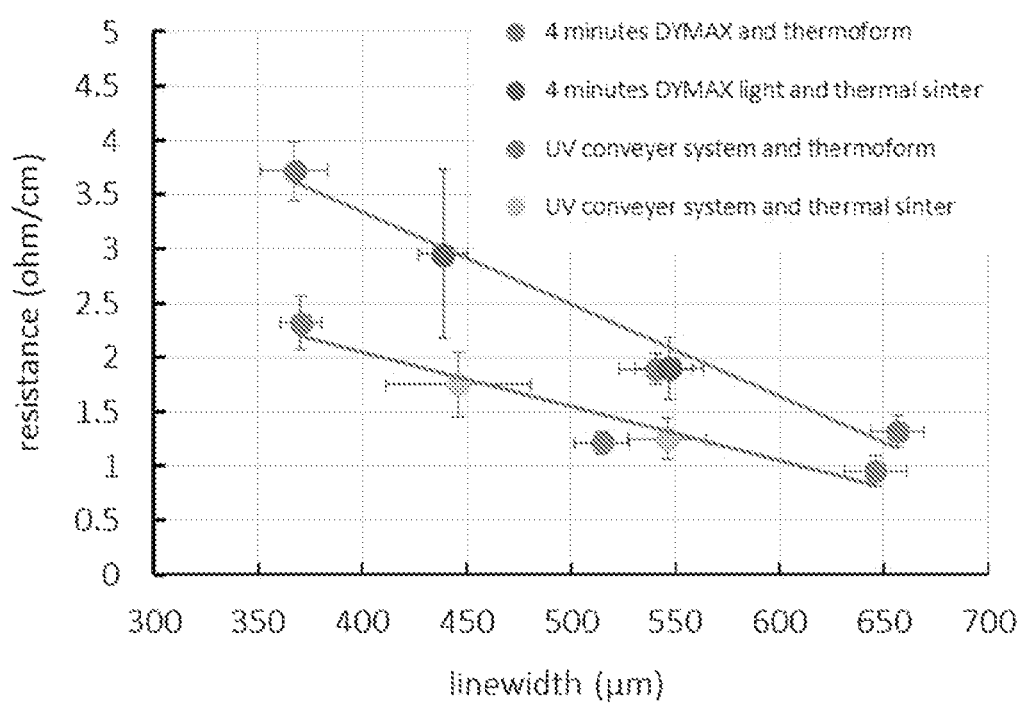
FIG. 13 Plots of the resistance vs. line width for 3D linear traces thermoformed following UV treatment with the DYMAX flood lamp system (blue circles and blue trend line; see upper trend line) and the UV conveyer system (green circles and green trend line; see lower trend line) in comparison to traces that are subjected to the same treatment in the absence of thermoforming, where the DYMAX flood lamp system treated samples are presented as red circles and those for the UV conveyer system are presented as yellow circles.

Comparison of the relative resistance of the thermoformed traces in comparison traces exposed to the same conditions without the thermoforming step was carried out by thermoforming part of a test trace and exposing a control portion of the test trace to the same UV treatment and thermal conditions, but the traces were not thermoformed. As highlighted in FIG. 13, a trend line fit to the resistance vs. line width of the thermoformed traces (blue/darker and green/lighter circles) overlays above and quite well with the resistance vs line width for control traces that are not thermoformed (red/darker and yellow/lighter circles respectively). The estimated change in resistance following thermoforming is ~5% for the UV treated traces (see FIG. 13).

Figure 14:
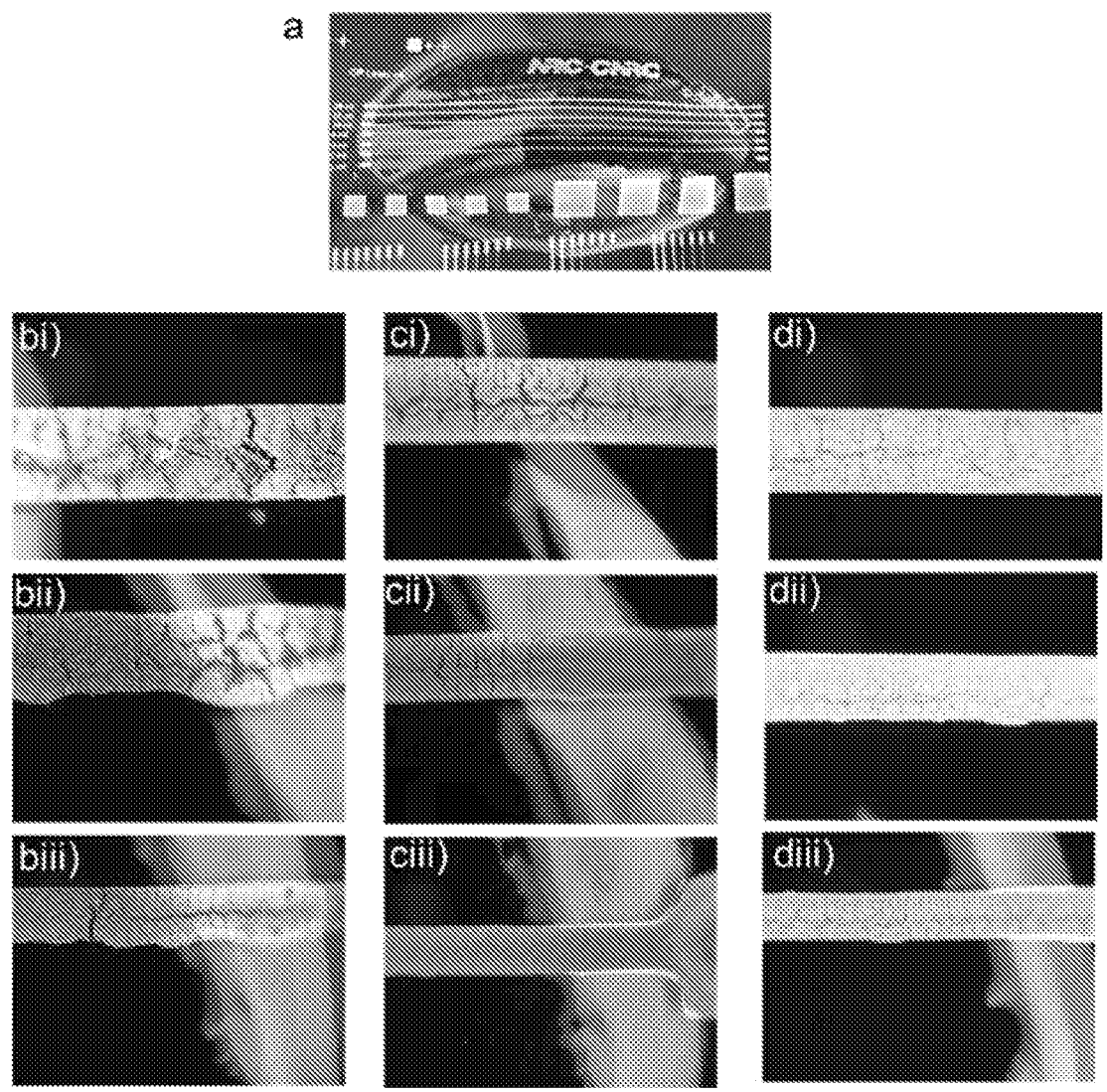
FIG. 14 A photograph of the linear traces thermoformed over the 1 cm high domed shape (a) and a zoom in of the three widest traces highlighted in the yellow rectangle to the upper right corner of the 'a' panel. Note that the traces produced by thermoforming only are cracked (bi-iii), whereas those treated with UV light from the DYMAX flood lamp system (ci-iii) and the UV conveyer system (di-iii) are much less susceptible to cracking.

Microscopic analysis of the traces stretched during the thermoforming process indicated that there was significant cracking throughout the traces in the absence of UV treatment (FIG. 14*bi, bii, biii*), resulting in largely nonconductive thermoformed traces. Treatment of the silver oxalate ink with UV light from a flood lamp based system (FIG. 14*ci, cii* and *ciii*) or a dual lamp UV conveyer system (FIG. 14*di, dii* and *diii*) minimizes cracking of the traces, resulting in the production of conductive 3D silver traces.

Figure 15:
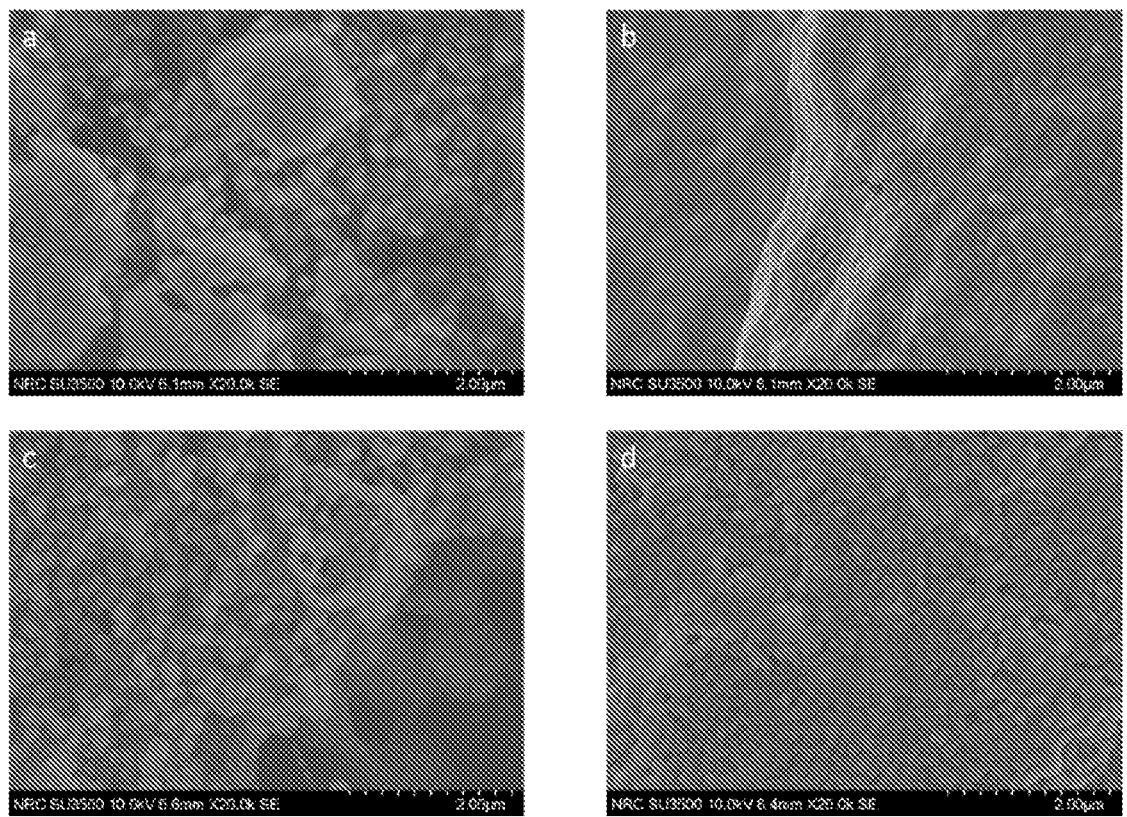
FIG. 15 SEM images of the silver oxalate-based molecular ink where the screen printed ink has been UV light treated with the DYMAX flood light system (a) or the UV conveyer system (b) to initiate the formation of silver nanoparticles. Following UV treatment, the traces are thermoformed to produce conductive silver films that comprise interconnected silver nanoparticles. The traces produced following treatment with the DYMAX flood light system have slightly larger particles and are less coalesced (c) than those produced in the traces treated with the UV conveyer system (d).
Figure 17:
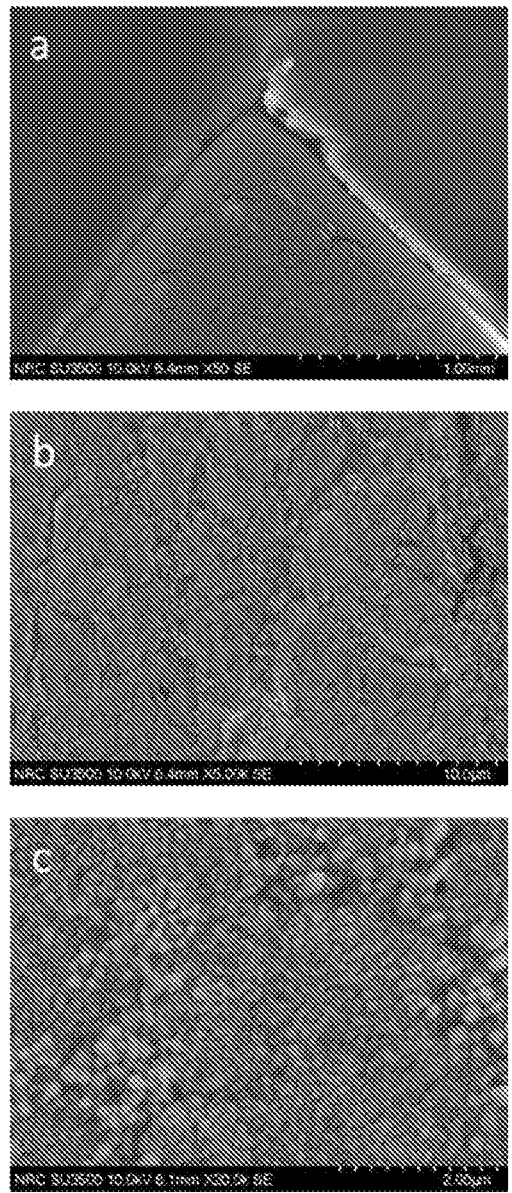
FIG. 17 An SEM image of the thermoformed traces produced from the direct thermal sinter without UV treatment. Note that voids and cracks are present where larger silver nanoparticles are present and that the areas where the nanoparticles are smaller are uniform.

To elucidate what effect the UV treatment has on the ability to thermoform the silver oxalate ink the UV treated traces were analyzed by XRD. This analysis indicates that treatment of the silver oxalate ink with UV light from both the flood lamp and UV conveyer systems initiate the conversion of the silver salts to metallic silver. Further analysis of the UV treated traces with scanning electron microscopy (SEM) indicates UV treatment transforms the molecular ink to silver nanoparticles (FIG. 15). The nanoparticles appear to be of smaller diameter when produced through the use of the UV curing machine rather than the DYMAX 5000-EC Series UV Curing Flood Lamp system. This is likely due to the fact that the UV conveyer system exposes the traces to a much higher dose of energy over a shorter time (UVV: 1.8 $J/cm^2$ per second, UVA: 0.9 $J/cm^2$ per second) in comparison to the flood lamp system (3.2 $J/cm^2$ per minute, 0.053 $J/cm^2$ per second). This intense exposure to the UV light then can produce a large number of silver (0) atoms that presumably nucleate a large number of small silver nanoparticle. SEM analysis of the thermoformed traces also suggests that the smaller silver nanoparticles produced from treatment of the traces by the intense light produced from the UV conveyer coalesce into a more interconnected network than the larger nanoparticles produced following UV treatment by the DYMAX flood lamp system. SEM analysis of the traces that are directly thermoformed without any UV treatment are comprised of a non-uniform distribution of silver nanoparticles, where the silver traces are mainly composed of small silver nanoparticles that are well interconnected, but there are many larger diameter particles that do not coalesce. The larger particles act as defects in the trace and are likely the sites where the traces crack as they are thermoformed (see FIG. 17). It is likely that the rapid heating of the ink to 180-190° C. leads to concurrent silver nanoparticle formation and solvent/amine evaporation. As the silver oxalate salt is less soluble in the carrier solvent and has a higher decomposition temperature, the silver traces contain nanoparticles that grow unevenly, become cracked and nonconductive.

This data suggests that initiating the formation of these small nanoparticles via UV treatment is a factor in the formation of a uniform, crack-free and conductive thermoformed traces. Both the DYMAX flood lamp system and the UV conveyer system expose the traces to UVA light (320-395 nm), which can cure deep areas of traces to improve adhesion. In addition, the gallium-doped bulb UV conveyer system exposes the traces to UVV light, which should penetrate to the deepest areas of the traces near the ink/substrate interface.

Figure 16A:
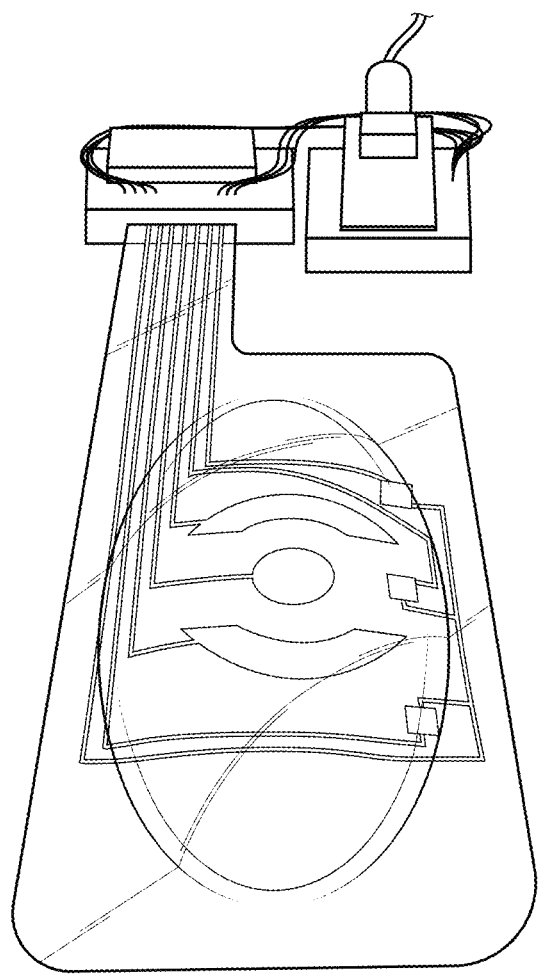
FIG. 16 A photograph of the linear traces of a thermoformed capacitive touch HMI circuit that has been thermoformed and attached to an Arduino Micro with an MPR121 Capacitive Touch Sensor Breakout (a) and an example of the illumination of 3 LEDs that have been attached to the surface of the circuit using conductive silver epoxy (b).
Figure 16B:
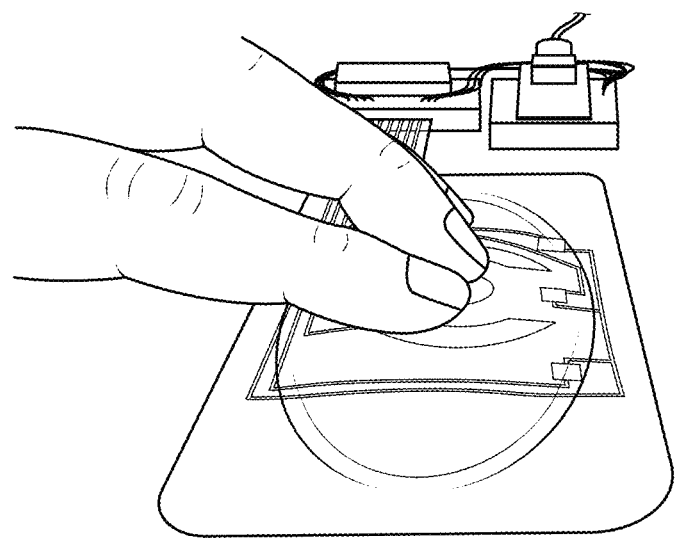

The ability to use UV treatment to produce uniform, crack-free conductive silver circuits was demonstrated by making a 3 button capacitive touch-based Human-Machine Interface (HMI) switch driven by an Arduino Micro with an MPR121 Capacitive Touch Sensor Breakout board. The board was designed to be printed in 2D and subsequently thermoformed into the 1 cm high 3D structure (FIG. 16). In contrast to the linear traces studies above, the capacitive touch circuit is more complex with traces printed in both vertical and horizontal orientations. Again UV treatment of the as-printed molecular ink enables the production of a functional circuit, whereas untreated traces tend to crack and become non-conductive. A summary of the results are presented in Table 15, where treatment with the UV curing machine and DYMAX systems are shown to produce traces with lower measured resistances in comparison to the samples treated with the flood lamp system (2.0 and 2.6 $\Omega$/cm). The relative resistance increase for the thermoformed traces in comparison to control traces that are subjected to the same processing conditions but not thermoformed is 10% and 20% for the UV conveyer and DYMAX systems, respectively. With conductive thermoformed traces produced from the silver-oxalate-based ink, LEDs were fixed to the traces using conductive silver epoxy and allowed to dry for several hours (FIG. 16*a*). The result is a capacitive touch circuit with three individually addressable touch circuits that illuminate as they are touched and that demonstrates how a 3D circuit can be produced from this combination of the molecular ink, LEDs and an Arduino Micro/capacitive touch breakout board. It is thus demonstrated that HMI switches (touch circuits) can be produced through the industry-relevant additive manufacturing processes (screen printing, thermoforming and pick and place technologies) and improved through the use of an industry relevant UV treatment process.

We also compared the performance of the molecular inks to a commercially available silver flake ink modified with elastomeric polymers designed for thermoforming applications. As highlighted in the Table 15, both the measured resistance and resistivity of the UV treated and thermoformed traces produced from the molecular ink is better than that of the non-thermoformed commercially available ink exposed to the same processing conditions. It is also noteworthy that we achieve this performance with the molecular inks despite the fact that they are ~3 times thinner than the traces produced from the commercially available flake ink. This is likely due to the fact that in order to be thermoformable, the commercially available inks have large proportions of elastomeric polymers added to the formulation to facilitate elongation. The presence of this polymer improves the stretchability of the traces, but simultaneously decreases the resistivity of the resulting traces. In the case of the molecular inks presented here, we can take advantage of the UV treatment to impart stretchability and the addition of extra polymers is not required, so the resistivity of the thermoformed traces remains low.

TABLE 15

A tabulated comparison of the measures resistance, trace height and calculated sheet and volume resistivities for the silver oxalate-based molecular ink in comparison to a commercially available thermoformable ink. Note that the commercial thermoformable ink has not been thermoformed, it has only been thermally cured as a 2D trace.

| Ink | Resistance (Ω/cm) | treatment | Height (μm) | Sheet resistivity (mΩ/□/mil) | Volume resistivity (μΩ · cm) |
|---|---|---|---|---|---|
| Silver oxalate-based molecular ink | 2.1 ± 0.4 | UV conveyer | 1.1 ± 0.2 | 5.4 ± 0.6 | 13.8 ± 1.6 |
| Silver oxalate-based molecular ink | 2.6 ± 0.4 | DYMAX UV Flood lamp | 1.1 ± 0.3 | 6.1 ± 1.1 | 15.5 ± 2.8 |
| Commercially available ink | 2.6 ± 0.7 | none | 5.2 ± 0.5 | 26.7 ± 2.6 | 66.7 ± 6.6 |

In summary, use of a (polycarbonate) PC-compatible screen-printable silver oxalate molecular ink can be incorporated into the development of thermoformed electronics, where a simple UV treatment process enables traces to remain conductive following elongations up to 1.3×, enabling the development 3D circuits from 2D printed sheets through industry relevant manufacturing processes. The application of UV treatment may also be applied in injection moulding processes to further enable the incorporation of the molecular inks into injection moulded structures to make thermoformed circuits and other thermoformed electronics, specifically due to the fact that the ink can be sintered during the thermoforming process, in particular when PC and like substrates used in thermoforming are heated to higher temperatures to facilitate the shaping of parts. These methods of processing will enable the development of more structurally complex devices and provide more design freedom in the production of human-machine interfaces in the automobile, aerospace and appliances industries.

By way of additional summary, Table 16 provides a comparative analysis of the performance of ink containing the mixture of the silver based molecular ink comprising the mixture of amino alcohols following UV treatment on polycarbonate substrate prior to thermoforming, highlighting that without UV treatment the traces crack during the thermoforming process. UV sintering was performed using a DYMAX 5000-EC Series UV Curing Flood Lamp system and curing was done using an American UV C12/300/2 12" conveyer, with gallium-doped and iron-doped halogen lamps.

TABLE 16

A comparative analysis of the performance of ink C1 following UV treatment with the DYMAX system and UV conveyer systems in comparison to thermal treatment only.

| UV light exposure tool | Dose (mJ/cm²) | Time (s) | Cracks during thermoforming? | Relative resistance increase compared to non-thermoformed traces |
|---|---|---|---|---|
| None | — | — | Yes | Not conductive, cracked |
| DYMAX | UVA: 12.8 | 240 | Very little | ~5% |
| UV curing machine | UVV: 5.4 VA: 2.7 | 3 | None | ~5% |

While the present application has been described with reference to what are presently considered to be the preferred examples, it is to be understood that the application is not limited to the disclosed examples. To the contrary, the present application is intended to cover various modifications and equivalent arrangements included within the spirit and scope of the appended claims. All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

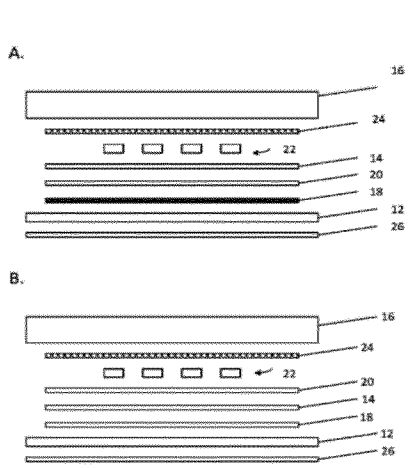

The invention claimed is:

1. A method for manufacturing an overmoulded printed electronic part, the method comprising:
   depositing a low temperature molecular ink on a substrate to form a non-conductive trace of the ink on a first surface of the substrate;
   sintering the non-conductive trace of the ink on the substrate to form a conductive trace on the first surface of the substrate;
   injecting an overmoulding resin or a precursor thereto over the conductive trace on the first surface of the substrate; and
   hardening the overmoulding resin or curing the precursor thereto to obtain the overmoulded printed electronic part.

2. The method of claim 1, wherein subsequent to sintering the non-conductive trace and prior to injecting the overmoulding resin or precursor thereto, the method further comprises thermoforming the substrate to obtain a shaped substrate.

3. The method of claim 2, wherein prior to thermoforming the substrate, the method further comprises coupling one or more electronic components to the first surface of the substrate.

4. The method of claim 3, wherein the one or more electronic components are selected from diodes, light emitting diodes (LEDs), organic light emitting diodes (OLEDs), integrated wiring connectors, basic electrical hardware, integrated chips, resistors, capacitors, transistors and ultrasonic sensors.

5. The method of claim 2, wherein subsequent to thermoforming the substrate and prior to injecting the overmoulding resin or the precursor thereto, the method further comprises introducing a fibreglass reinforcing layer over the first surface of the substrate.

6. The method of claim 1, wherein prior to depositing the low temperature molecular ink or subsequent to depositing the low temperature molecular ink and prior to sintering the non-conductive trace or optionally thermoforming the substrate, the method further comprises depositing a dielectric ink on the first surface of the substrate.

7. The method of claim 1, wherein the overmoulding resin or the precursor thereto is injected in combination with glass microspheres.

8. The method of claim 1, wherein the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF).

9. The method of claim 1, wherein the sintering comprises photonic sintering, thermal sintering or UV sintering.

10. A method for manufacturing an overmoulded printed electronic part, the method comprising:
injecting a precursor to a thermoset overmoulding resin over a conductive trace on a first surface of a substrate; and
curing the precursor to the thermoset overmoulding resin to obtain the overmoulded printed electronic part,
wherein the conductive trace on the first surface of the substrate is obtained by a method comprising:
depositing a low temperature molecular ink on the substrate to form a non-conductive trace of the ink on the first surface of the substrate; and
curing the non-conductive trace of the ink on the substrate to form the conductive trace on the first surface of the substrate.

11. The method of claim 10, wherein subsequent to curing the non-conductive trace and prior to injecting the precursor to the thermoset overmoulding resin, the method further comprises thermoforming the substrate to obtain a shaped substrate.

12. The method of claim 11, wherein prior to thermoforming the substrate, the method further comprises coupling one or more electronic components to the first surface of the substrate.

13. The method of claim 10, wherein prior to depositing the low temperature molecular ink or subsequent to depositing the low temperature molecular ink and prior to curing the non-conductive trace or optionally thermoforming the substrate, the method further comprises depositing a dielectric ink on the first surface of the substrate.

14. The method of claim 11, wherein subsequent to thermoforming the substrate, the method further comprises applying an ultra-violet curable hard coat to a second surface of the substrate.

15. The method of claim 10, wherein the substrate comprises polyethylene terephthalate (PET), amorphous polyethylene terephthalate (APET), glycol modified polyethylene terephthalate (PET-G), polyolefin, polydimethylsiloxane (PDMS), polystyrene, polycarbonate, polyimide, thermoplastic polyurethane (TPU), a silicone membrane, polycarbonate-acrylonitrile butadiene styrene (ABS) blends, acrylonitrile butadiene styrene (ABS), thermoplastic olefins (TPO), polyphenylene sulfide (PPS), polybenzimidazole (PBI), polypropylene polybenzyl isocyanate (PPI), polyether ether ketone (PEEK) or polyvinylidene fluoride (PVDF).

16. The method of claim 1, wherein the low temperature molecular ink or conductive trace ink comprises: a silver carboxylate; an organic amine compound; an organic polymer binder; a surface tension modifier; and a solvent.

17. The method of claim 16, wherein the silver carboxylate is silver oxalate; the organic amine compound is amino-2-propanol; the organic amine compound is a mixture of amino-2-propanol and 2-amino-1-butanol; the organic polymer binder is hydroxyethyl cellulose; the surface tension modifier is glycolic acid or lactic acid; and/or the solvent is dipropylene glycol methyl ether.

18. The method according to claim 1, wherein the low temperature molecular ink or conductive trace ink comprises: silver carboxylate or copper carboxylate and an organic amine compound.

19. The method according to claim 18, wherein the silver carboxylate is a $C_{1-10}$ alkanoate, or wherein the copper carboxylate is a $C_{1-12}$ alkanoate.

20. An overmoulded printed electronic part comprising:
a conductive trace coupled to a first surface of a substrate; and
a thermoset resin overmoulded over the conductive trace coupled to the first surface of the substrate,
wherein the conductive trace is a conductive silver trace manufactured from a low temperature molecular ink wherein the molecular ink comprises: a silver carboxylate; an organic amine compound; an organic polymer binder; a surface tension modifier; and a solvent.

21. The overmoulded printed electronic part of claim 20, wherein the substrate has been thermoformed into a three-dimensional shape.

22. The method according to claim 10, wherein the low temperature molecular ink or conductive trace ink comprises: silver carboxylate or copper carboxylate and an organic amine compound.

23. The method according to claim 22, wherein the silver carboxylate is a $C_{1-10}$ alkanoate, or wherein the copper carboxylate is a $C_{1-12}$ alkanoate.

* * * * *

UNITED STATES PATENT AND TRADEMARK OFFICE
CERTIFICATE OF CORRECTION

PATENT NO. : 12,017,392 B2
APPLICATION NO. : 17/265347
DATED : June 25, 2024
INVENTOR(S) : Paul Arthur Trudeau et al.

Page 1 of 3

It is certified that error appears in the above-identified patent and that said Letters Patent is hereby corrected as shown below:

On the Title Page

Item (73) Amend the city of Assignee E2IP Technologies Inc. from "Ottawa" to "St-Laurent".

Delete the title page and insert therefor with the attached title page showing the corrected number of drawing sheets.

In the Drawings

Insert FIG. 18, drawing sheet 18 as shown on the attached page.

Signed and Sealed this
Eleventh Day of February, 2025

Coke Morgan Stewart
*Acting Director of the United States Patent and Trademark Office*

(12) United States Patent
Trudeau et al.

(10) Patent No.: US 12,017,392 B2
(45) Date of Patent: Jun. 25, 2024

(54) OVERMOULDED PRINTED ELECTRONIC PARTS AND METHODS FOR THE MANUFACTURE THEREOF

(71) Applicant: National Research Council of Canada, Ottawa (CA)

(72) Inventors: Paul Arthur Trudeau, Gatineau (CA); Arnold Jason Kell, Orleans (CA); Xiangyang Liu, Nepean (CA); Olga Mozenson, Nepean (CA)

(73) Assignees: NATIONAL RESEARCH COUNCIL OF CANADA, Ottawa (CA); E2IP TECHNOLOGIES INC., Ottawa (CA)

( * ) Notice: Subject to any disclaimer, the term of this patent is extended or adjusted under 35 U.S.C. 154(b) by 428 days.

(21) Appl. No.: 17/265,347

(22) PCT Filed: Aug. 7, 2019

(86) PCT No.: PCT/IB2019/056731
§ 371 (c)(1),
(2) Date: Feb. 2, 2021

(87) PCT Pub. No.: WO2020/031114
PCT Pub. Date: Feb. 13, 2020

(65) Prior Publication Data
US 2021/0316485 A1    Oct. 14, 2021

Related U.S. Application Data

(60) Provisional application No. 62/715,609, filed on Aug. 7, 2018.

(51) Int. Cl.
*B32B 3/00*    (2006.01)
*B29B 11/06*    (2006.01)
(Continued)

(52) U.S. Cl.
CPC ............. *B29C 45/14* (2013.01); *B29B 11/06* (2013.01); *B29C 44/12* (2013.01); *B29C 44/42* (2013.01);
(Continued)

(58) Field of Classification Search
CPC ......... B28C 45/14; B28C 44/12; B28C 44/42; H05K 1/0313; H05K 3/0014; H05K 3/105; H05K 3/287
See application file for complete search history.

(56) References Cited

U.S. PATENT DOCUMENTS 8,735,220 B2    5/2014    Val
9,528,667 B1    12/2016    Pereyra
(Continued)

FOREIGN PATENT DOCUMENTS

CA    2931244    6/2015
CN    102300415 A    12/2011
(Continued)

OTHER PUBLICATIONS

Examination Search Reported dated Apr. 4, 2022.
(Continued)

*Primary Examiner* — Elizabeth E Mulvaney
(74) *Attorney, Agent, or Firm* — BERESKIN & PARR LLP/S.E.N.C.R.L., s.r.l.; Michael Fenwick

(57) ABSTRACT

The present application relates to overmoulded printed electronic parts as well as to methods for preparing overmoulded printed electronic parts using conductive trace inks such as molecular inks, thermoset resins, and reinforcing materials such as glass microspheres and glass fabric.

23 Claims, 18 Drawing Sheets